United States Patent
Furuya et al.

(10) Patent No.: US 6,800,883 B2
(45) Date of Patent: Oct. 5, 2004

(54) CMOS BASIC CELL AND METHOD FOR FABRICATING SEMICONDUCTOR INTEGRATED CIRCUIT USING THE SAME

(75) Inventors: Shigeki Furuya, Osaka (JP); Hisaki Watanabe, Osaka (JP); Atsushi Mototani, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/922,671

(22) Filed: Aug. 7, 2001

(65) Prior Publication Data

US 2002/0034110 A1 Mar. 21, 2002

(30) Foreign Application Priority Data

Sep. 21, 2000 (JP) ........................................ 2000-286668
Feb. 13, 2001 (JP) ........................................ 2001-035267

(51) Int. Cl.[7] .......................... H01L 27/10; H01L 23/48
(52) U.S. Cl. .................... 257/206; 257/207; 257/208; 257/211; 257/365; 257/366; 257/773; 257/774
(58) Field of Search ................................. 257/206, 207, 257/208, 211, 365, 366, 773, 774

(56) References Cited

U.S. PATENT DOCUMENTS

| | | | |
|---|---|---|---|
| 5,814,844 A | | 9/1998 | Nagata et al. |
| 5,874,754 A | * | 2/1999 | Lee et al. ..................... 257/202 |
| 6,091,088 A | * | 7/2000 | Arima et al. ................. 257/202 |
| 6,114,767 A | * | 9/2000 | Nagai et al. ................. 257/758 |
| 6,133,079 A | * | 10/2000 | Zhu et al. .................... 438/210 |
| 6,177,709 B1 | * | 1/2001 | Iranmanesh .................. 257/206 |
| 6,288,447 B1 | * | 9/2001 | Amishiro et al. ........... 257/758 |
| 6,320,234 B1 | * | 11/2001 | Karasawa et al. .......... 257/369 |
| 6,326,651 B1 | * | 12/2001 | Manabe ....................... 257/209 |

FOREIGN PATENT DOCUMENTS

| | | |
|---|---|---|
| JP | 61-202425 | 9/1986 |
| JP | 03-141670 | 6/1991 |
| JP | 06-013589 | 1/1994 |
| JP | 06-252367 | 9/1994 |
| JP | 09097885 | 4/1997 |
| JP | 09-181284 | 7/1997 |
| JP | 01-270-329 | 10/1999 |

* cited by examiner

Primary Examiner—Tom Thomas
Assistant Examiner—Matthew E. Warren
(74) Attorney, Agent, or Firm—McDermott Will & Emery LLP

(57) ABSTRACT

In a CMOS basic cell used in fabrication of a gate array semiconductor integrated circuit, each of the gate and the diffusion region of a P-channel transistor is in a hooked shape having bent parts respectively bending to the left and right at the upper and lower portions thereof. Similarly, each of the gate and the diffusion region of an N-channel transistor is in a hooked shape having bent parts respectively bending to the left and right at the upper and lower portions thereof. In the case where a semiconductor integrated circuit is fabricated by arranging basic cells having the same structure on the right and left hand sides of this basic cell, the basic cells adjacent to each other are overlapped by portions thereof corresponding to one grid, so that the portions in the hooked shapes can be alternately inlaid with each other. Accordingly, the semiconductor integrated circuit attains a smaller layout area.

34 Claims, 54 Drawing Sheets

FIG. 1A
FIG. 1B
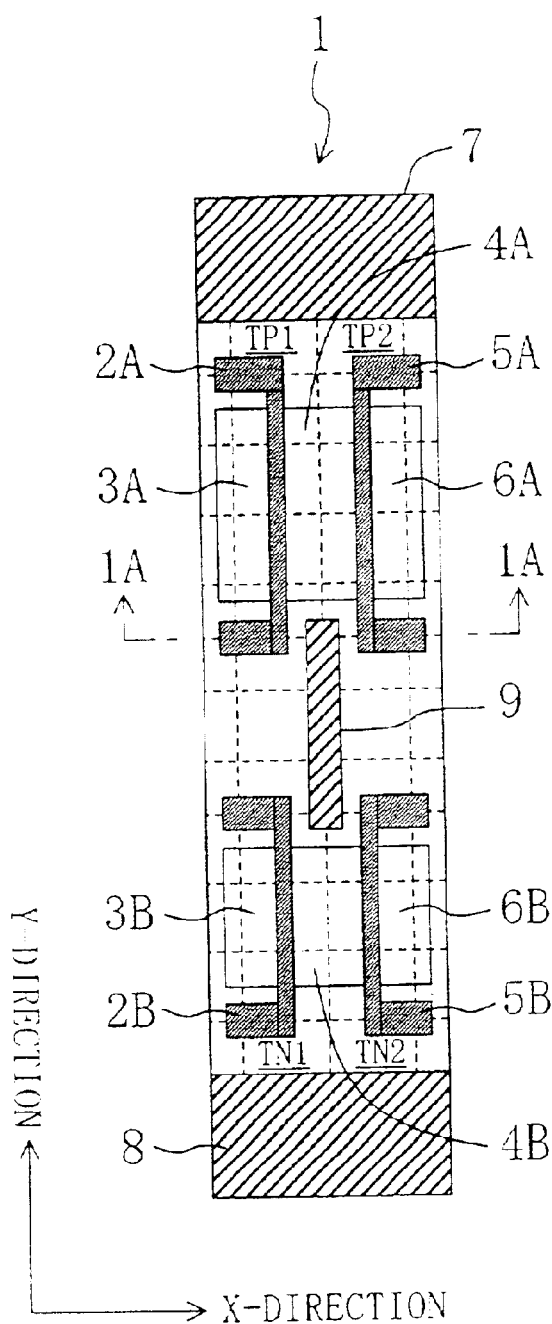
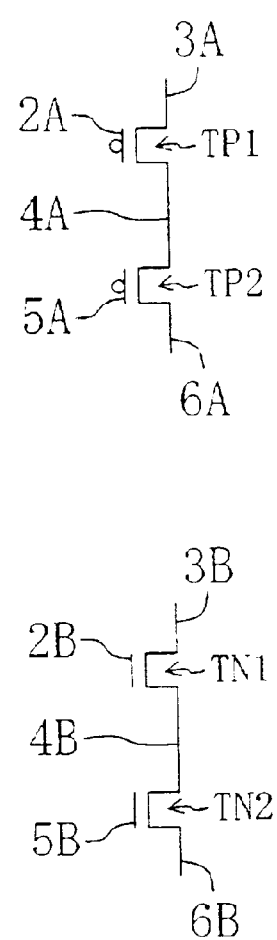

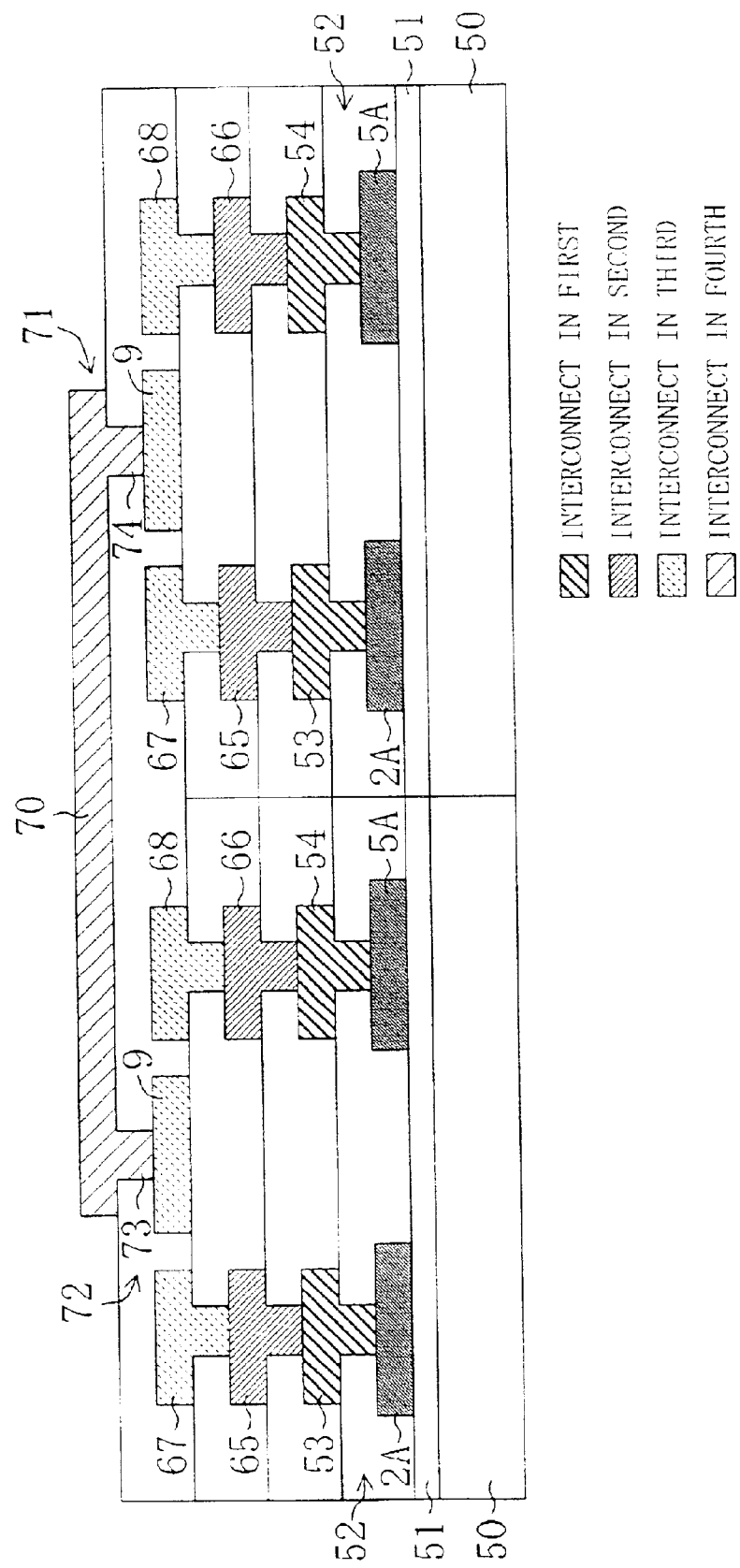

WHEN CONTROL SIGNAL IS "H", DATA OUTPUT = DATA INPUT B

WHEN CONTROL SIGNAL IS "L", DATA OUTPUT = DATA INPUT A

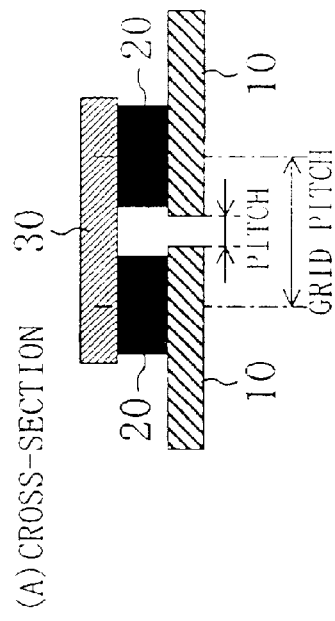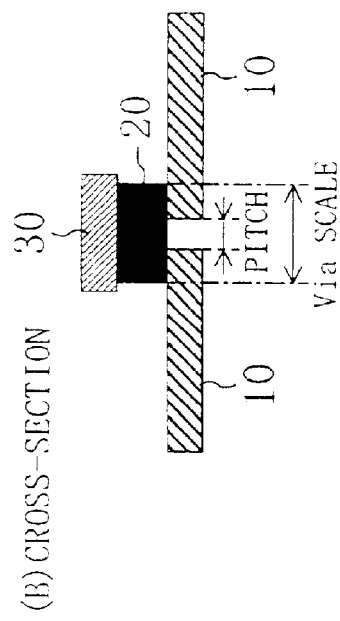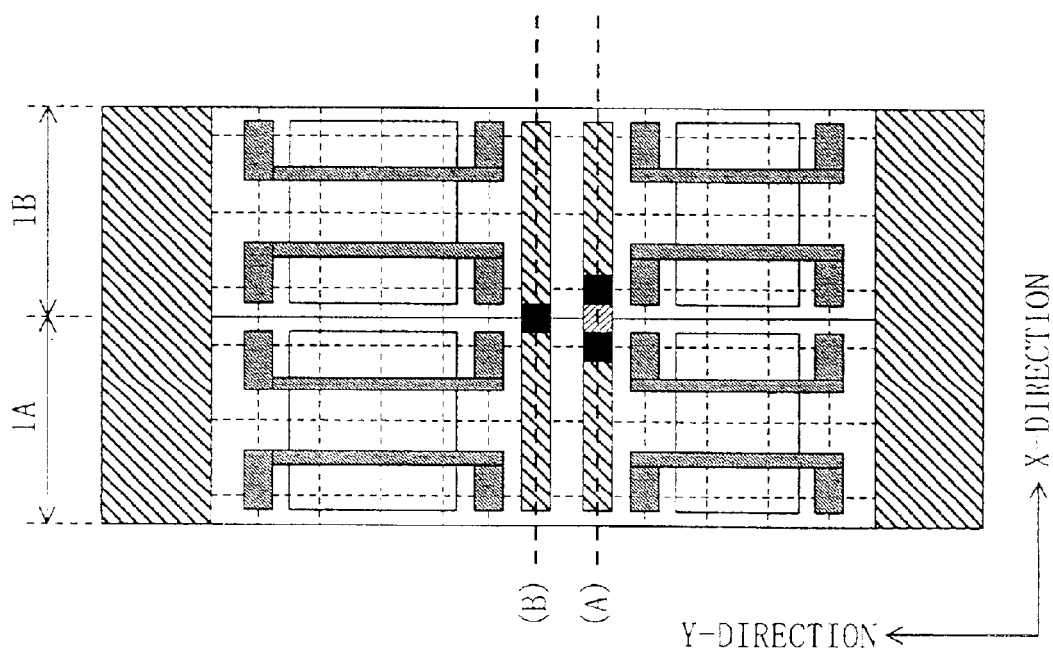

FIG. 27A
FIG. 27B
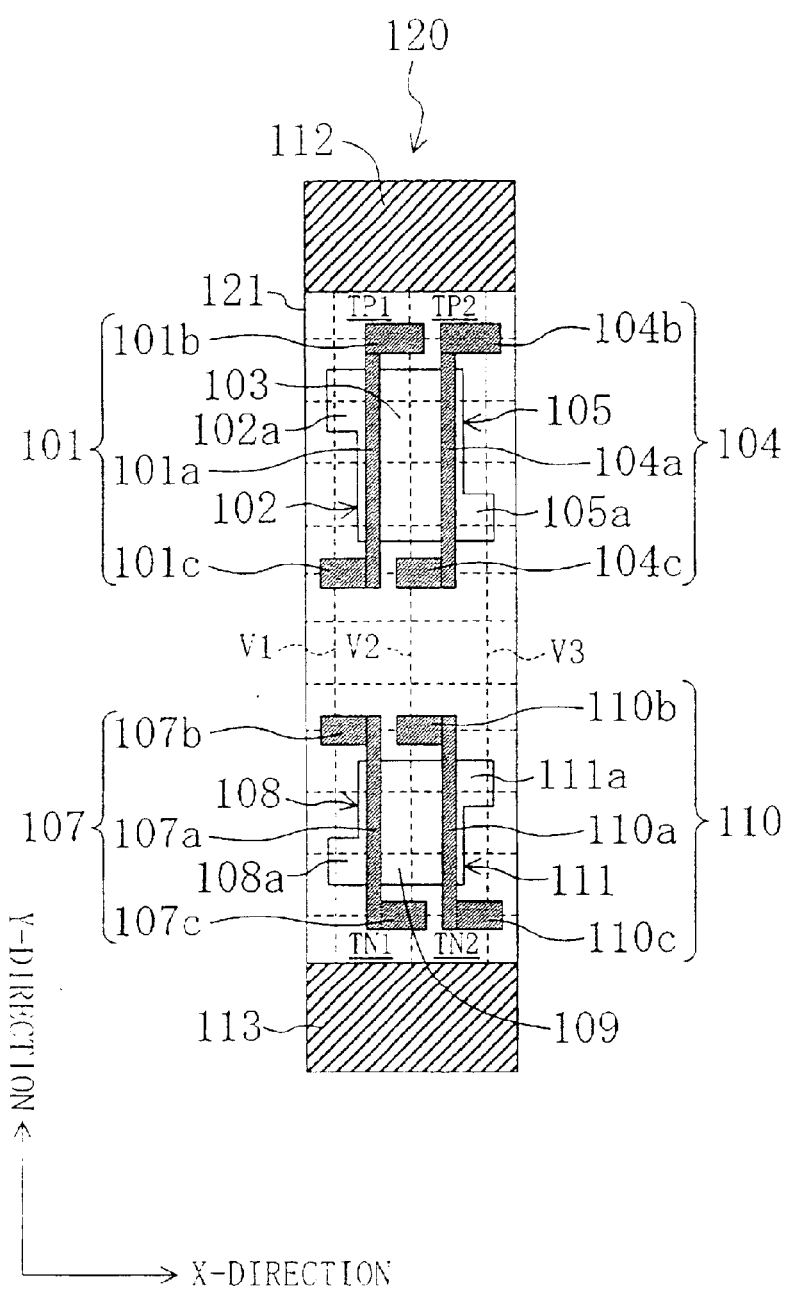
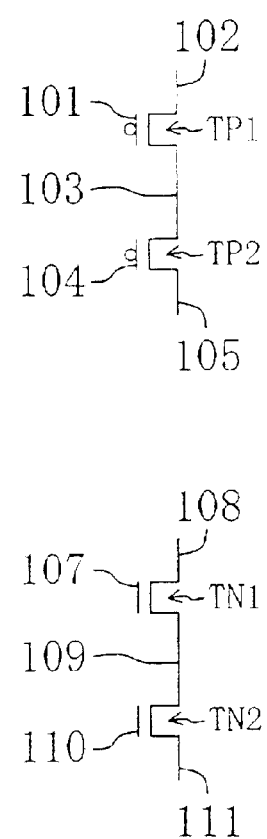

INTERCONNECT IN FIRST
INTERCONNECT IN SECOND
□ VIA CONTACT BETWEEN FIRST AND SECOND LAYERS

CMOS BASIC CELL AND METHOD FOR FABRICATING SEMICONDUCTOR INTEGRATED CIRCUIT USING THE SAME

BACKGROUND OF THE INVENTION

The present invention relates to a CMOS basic cell and a method for fabricating a gate array semiconductor integrated circuit using the basic cell.

Recently, semiconductor integrated circuits are more and more highly developed in their integration and performance in accordance with refinement of processes, and the cost and period required for the development are steadily increasing accordingly. Under such circumstances, gate arrays, which can be designed by merely modifying interconnect patterns with CAD (computer-aided design) or the like, are widely used as a method for fabricating semiconductor integrated circuits suitable for reducing the cost and period required for the development or for few-of-a-kind production.

In general, a gate array is fabricated as follows: A basic cell having a previously determined layout pattern and an interconnect pattern of a logic cell using one or more basic cells are prepared, the basic cells are automatically placed and automatically connected to each other with interconnects by using the CAD or the like.

FIG. 30 shows the structure of a conventional CMOS basic cell composed of four transistors. In FIG. 30, a reference numeral 1 denotes a CMOS basic cell. In the basic cell 1, a first P-channel transistor TP1 includes a gate electrode 2A placed in a U shape in a plane view and dopant diffusion layers 3A and 4A provided on both sides of the gate electrode 2A. The dopant diffusion layers 3A and 4A work as the source and the drain. A second P-channel transistor TP2 includes a gate electrode 5A placed in a U shape facing a reverse direction to the gate electrode 2A of the transistor TP1, a dopant diffusion layer 6A provided on one side of the gate electrode 5A, and the dopant diffusion layer 4A shared with the transistor TP1. A first N-channel transistor TN1 includes a gate electrode 2B placed in a U shape in a plane view and dopant diffusion layers 3B and 4B provided on the both sides of the gate electrode 2B. The dopant diffusion layers 3B and 4B work as the source and the drain. A second N-channel transistor TN2 includes a gate electrode 5B placed in a U shape facing a reverse direction to the gate electrode 2B of the transistor TN1, a dopant diffusion layer 6B provided on one side of the gate electrode 5B and the dopant diffusion layer 4B shared with the transistor TN1. Furthermore, reference numerals 7 and 8 denote global power supply pattern and GND (ground) pattern provided in upper and lower portions in the drawing by using a first interconnect layer.

In FIG. 30, broken lines drawn in the basic cell 1 denote wiring grids. A wiring grid herein means a place where an interconnect pattern of a logic cell is disposed as a wiring track. The wiring grids are disposed so as to cross the gate electrodes 2A, 2B, 5A and 5B and the dopant diffusion layers 3A, 3B, 4A, 4B, 6A and 6B, the power supply pattern 7 and the GND pattern 8 of the basic cell 1, and the interval thereof is determined in accordance with a placement pitch of the transistors or an interconnect pitch determined based on the semiconductor process rule.

At a stage of design of a logic cell, wiring is optionally determined to place on the wiring grids, and at a stage of design of a semiconductor integrated circuit using a plurality of logic cells, the interconnects are placed on the wiring grids by using a CAD system or the like. At these design stages, in the case where, for example, a second interconnect layer is used for wiring, the interconnect pitch of the second layer is generally set to the same pitch as that of a first layer for easing connection to interconnects of the first layer. The interconnect pitch is similarly determined also in the case where a third or upper interconnect layer is used for wiring. In FIG. 30, the number of wiring tracks of the basic cell 1 extending in the X-direction is 11 and the number of wiring tracks extending in the Y-direction is 3.

The conventional basic cell, however, has the following problem: For example, when a circuit example of a DFF (D flip-flop) shown in FIG. 2A is constructed by using the basic cell of FIG. 30, if interconnects of the first and second layers are used for the interconnects of the logic cell, a layout structure of FIG. 31A or FIG. 31B is obtained. The number of interconnect layers used in this case are three in total, that is, the first and second interconnect layers and a layer of vias for connecting the first interconnect layer to the second interconnect layer.

Alternatively, when the interconnects of the second layer alone are used for the interconnects of the logic cell with the interconnects of the first layer used as fixed interconnects as disclosed in, for example, Japanese Laid-open Patent Publication No. 1-270329, a layout structure of FIG. 32 is obtained. The number of interconnect layers used in this case is also three in total, that is, the interconnects of the second layer and the interconnects of the upper third layer, which are necessary because the interconnects are crowded, and a layer of vias for connecting the second interconnect layer to the third interconnect layer.

Vias for connecting a gate electrode and a dopant diffusion region to the interconnects of the first layer are naturally necessary not only in the basic cell of FIG. 30 and the exemplified circuit configurations shown in FIGS. 31A and 31B but also every example described below. However, the vias are not directly concerned with the essence of the invention and hence are herein neither described nor shown in drawings. FIG. 2B is a symbol diagram of the DFF of FIG. 2A, and FIG. 2C is an operation timing chart. In FIG. 2B, a reference numeral 100 denotes a DATA input terminal, a reference numeral 110 denotes a CLK input terminal, a reference numeral 120 denotes an inverted CLK input terminal, a reference numeral 200 denotes a DATA output terminal, and a reference numeral 210 denotes an inverted DATA output terminal.

Layout structures of other logic cells obtained by using the conventional basic cell are as follows: FIG. 33 shows a layout structure of a buffer circuit example of FIG. 4A constructed by using the basic cell of FIG. 30 with interconnects of the first and second layers used as the interconnects for the logic cell. Alternatively, a layout structure of FIG. 34 is obtained when the interconnects of the second layer alone are used as the interconnects for the logic cell with the interconnects of the first layer used as fixed interconnects.

FIG. 35 shows a layout structure of an ORNAND circuit of FIG. 6A constructed by using the basic cell of FIG. 30 with the interconnects of the first and second layers used as the interconnects for the logic cell. Alternatively, a layout structure of FIG. 36 is obtained when the interconnects of the second layer alone are used as the interconnects for the logic cell with the interconnects of the first layer used as fixed interconnects.

FIG. 37 shows a layout structure of a selector circuit of FIG. 8A constructed by using the basic cell of FIG. 30 with the interconnects of the first and second layers used as the interconnects for the logic cell. Alternatively, a layout structure of FIG. 38 is obtained when the interconnects of the second layer alone are used as the interconnects for the logic cell with the interconnects of the first layer used as fixed interconnects.

FIG. 39 shows a layout structure of an SRAM circuit of FIG. 25A constructed by using the basic cell of FIG. 30 with the interconnects of the first and second layers used as the interconnects for the logic cell. Alternatively, a layout structure of FIG. 40 is obtained when the interconnects of the second layer alone are used as the interconnects for the logic cell with the interconnects of the first layer used as fixed interconnects.

As described above, two interconnect layers are necessary for interconnects for a logic circuit in forming, by using the conventional basic cell of FIG. 30, any of a logic circuit having a clock signal line like a DFF, a logic circuit including transistors connected in parallel like a buffer circuit, a composite logic circuit such as an ORNAND circuit, a logic circuit having a control signal line like a selector circuit and a logic circuit for a memory like an SRAM. As a result, the wiring tracks for upper interconnects are consumed, which increases the line crowdedness in the design of a semiconductor integrated circuit. Accordingly, the ratio of used gates to all the gates in the gate array is lowered, so as to cause a problem that the degree of integration of the semiconductor integrated circuit is lowered. Furthermore, in the case where it is necessary to modify logic or wiring, three layers in total, that is, two layers for interconnects and one for vias, are necessary for the modification. This can be an obstacle to reduction of the cost and period required for development, which is originally the largest advantage of a gate array.

In the case where a D flip-flop circuit having a scanning function as shown in FIG. 20A is constructed by using the basic cell of FIG. 30, a layout structure of FIG. 41 is obtained when the interconnects of the first and second layers are used as the interconnects for the logic cell. When a semiconductor integrated circuit is constructed by using three D flip-flop circuits DFF1 through DFF3 having a scanning function and a combinational logic circuit LC as shown in FIG. 20C, a scan chain method is generally employed in which the output terminal Q of the D flip-flop circuit at the front stage (for example, DFF1) is connected to the scan data input terminal DT of the D flip-flop circuit at the back stage (for example, DFF2) through an interconnect L. FIG. 20D is a timing chart of a general operation employed in this case, and FIG. 20E is a timing chart of a scan operation. In the general operation, a data output from the output terminal Q of the D flip-flop circuit at the front stage is transferred through the combinational logic circuit LC to the data input terminal D of the D flip-flop circuit at the back stage. Therefore, the D flip-flop circuit at the back stage has sufficient hold time for the data. In contrast, in the scan operation, an output data from the output terminal Q of the D flip-flop circuit at the front stage is transferred through the interconnect L alone to the scan data input terminal DT of the D flip-flop circuit at the back stage. Therefore, transfer delay time of the scan data is too short to attain sufficient hold time, which can easily cause a hold error of the scan data. Accordingly, the length of the interconnect L is increased to elongate the line delay time.

However, in the case where the D flip-flop circuit having a scanning function is formed by using the conventional basic cell of FIG. 30, two interconnect layers in total, that is, the first interconnect layer and the second interconnect layer, are necessary for adjusting the delay. Furthermore, there is a difference in the delay per unit length of the interconnect between the first interconnect layer and the second interconnect layer, and hence, it takes time to design for the adjustment of the line delay. These disadvantages can be an obstacle to the reduction of the cost and development period, which is the largest advantage of a gate array.

U.S. Pat. No. 5,814,844 discloses the following structure of a CMOS basic cell: Auxiliary interconnects used in connecting gate electrodes to each other or a gate electrode to a diffusion region within the basic cell are previously disposed in a polysilicon layer where the gate electrodes are formed (hereinafter referred to as the gate layer). When, for example, a gate electrode and a diffusion region included in the basic cell are necessary to connect to each other, an interconnect connected to the gate electrode and an interconnect connected to the diffusion region are disposed in an interconnect layer above the gate electrode, and these interconnects are connected to the auxiliary interconnect through two via contacts. However, the auxiliary interconnects are disposed in the gate layer and used for connecting the gate electrodes to each other or a gate electrode to a diffusion region within the basic cell, and are not used as part of global interconnects for connecting, for example, gate electrodes of two basic cells to each other.

The speed and consumption power of the DFF are restricted by the line length or the parasitic capacitance determined in accordance with the size and the structure of the basic cell. For increasing the speed and reducing the consumption power without changing the size of the basic cell itself, for example, Japanese Laid-Open Patent Publication No. 07-240501 discloses a technique of lowering diffusion capacitance by reducing the area of a diffusion region to be smaller than a contact region in portions other than the contact region. This technique, however, has a problem that the number of wiring tracks is reduced, and for overcoming this problem, it is necessary to modify the process for securing the wiring tracks.

Furthermore, for example, Japanese Laid-Open Patent Publication No. 09-181284 discloses a technique of reducing signal transfer delay time for increasing the speed by overlapping contact regions of adjacent basic cells. This technique also has the problem that the number of wiring tracks is reduced.

SUMMARY OF THE INVENTION

An object of the invention is providing a CMOS basic cell capable of realizing a desired logic circuit by using merely one interconnect layer or preventing a hold error of a flip-flop circuit having a scan test function without increasing the area of the basic cell, and a method for fabricating a semiconductor integrated circuit using the CMOS basic cell.

Another object of the invention is providing a CMOS basic cell capable of increasing operation speed and reducing consumption power by reducing the layout area of the basic cell with securing sufficient wiring tracks, and a method for fabricating a semiconductor integrated circuit by using the CMOS basic cell.

Specifically, in the case where a semiconductor integrated circuit is constructed by arranging a plurality of CMOS basic cells in parallel, an interconnect layer is provided for global routing above these basic cells. Therefore, in order to achieve the object, according to the invention, an interconnect pattern is previously formed in an interconnect layer directly below this interconnect layer for global routing (namely, in an uppermost interconnect layer of each CMOS basic cell), so that the previously formed interconnect pattern can be also used for connecting the basic cells to one another through the global routing.

Also, in order to achieve the other object, the gate and the diffusion region of an N-channel transistor or a P-channel transistor are formed in specific shapes in the present invention, so as to reduce the layout area of a semiconductor integrated circuit constructed by arranging a plurality of basic cells.

Specifically, the first CMOS basic cell of this invention comprises an N-channel transistor region and a P-channel transistor region isolated from each other by an insulating film on a semiconductor substrate; and an interconnect pattern extending along a direction perpendicular to a boundary between the N-channel transistor region and the P-channel transistor region and provided independently of the N-channel transistor region and the P-channel transistor region, and the interconnect pattern is formed in an uppermost interconnect layer among one, two or more interconnect layers of the CMOS basic cell.

The second CMOS basic cell of this invention comprises an N-channel transistor region and a P-channel transistor region isolated from each other by an insulating film on a semiconductor substrate; and an interconnect pattern extending along a direction parallel to a boundary between the N-channel transistor region and the P-channel transistor region and provided independently of the N-channel transistor region and the P-channel transistor region, and the interconnect pattern is formed in an uppermost interconnect layer among one, two or more interconnect layers of the CMOS basic cell.

The third CMOS basic cell of this invention comprises an N-channel transistor region and a P-channel transistor region isolated from each other by an insulating film on a semiconductor substrate; and an interconnect pattern extending along a direction parallel to a boundary between the N-channel transistor region and the P-channel transistor region and provided independently of the N-channel transistor region and the P-channel transistor region to be used for connection to an interconnect pattern of another adjacent basic cell, and the interconnect pattern is formed in an uppermost interconnect layer among one, two or more interconnect layers of the CMOS basic cell.

The fourth CMOS basic cell of this invention comprises an N-channel transistor region and a P-channel transistor region isolated from each other by an insulating film on a semiconductor substrate; an interconnect pattern extending along a direction perpendicular to a boundary between the N-channel transistor region and the P-channel transistor region and provided independently of the N-channel transistor region and the P-channel transistor region; and another interconnect pattern extending along a direction parallel to the boundary between the N-channel transistor region and the P-channel transistor region and provided independently of the N-channel transistor region and the P-channel transistor region, and the interconnect patterns are formed in an uppermost interconnect layer among one, two or more interconnect layers of the CMOS basic cell.

The fifth CMOS basic cell of this invention comprises an N-channel transistor region and a P-channel transistor region isolated from each other by an insulating film on a semiconductor substrate; an interconnect pattern extending along a direction parallel to a boundary between the N-channel transistor region and the P-channel transistor region and provided independently of the N-channel transistor region and the P-channel transistor region; and another interconnect pattern extending along the direction parallel to the boundary between the N-channel transistor region and the P-channel transistor region and provided independently of the N-channel transistor region and the P-channel transistor region to be used for connection to an interconnect pattern of another adjacent basic cell, and the interconnect patterns are formed in an uppermost interconnect layer among one, two or more interconnect layers of the CMOS basic cell.

The sixth CMOS basic cell of this invention comprises an N-channel transistor region and a P-channel transistor region isolated from each other by an insulating film on a semiconductor substrate; an interconnect pattern extending along a direction perpendicular to a boundary between the N-channel transistor region and the P-channel transistor region and provided independently of the N-channel transistor region and the P-channel transistor region; and another interconnect pattern extending along a direction parallel to the boundary between the N-channel transistor region and the P-channel transistor region and provided independently of the N-channel transistor region and the P-channel transistor region to be used for connection to an interconnect pattern of another adjacent basic cell, and the interconnect patterns are formed in an uppermost interconnect layer among one, two or more interconnect layers of the CMOS basic cell.

Any of the first through sixth CMOS basic cells of this invention can further comprise a fixed interconnect region where a power supply interconnect and a ground interconnect are provided, and the interconnect pattern is provided in the fixed interconnect region.

The method of this invention for fabricating a gate array semiconductor integrated circuit including a plurality of basic cells and additional interconnect layers respectively provided above the basic cells, comprises the steps of arranging a plurality of any of the first through sixth CMOS basic cells on a semiconductor substrate; and realizing a logic circuit including a clock signal line by using the interconnect patterns formed in the uppermost interconnect layers of the CMOS basic cells and the additional interconnect layers.

Alternatively, the method of this invention for fabricating a gate array semiconductor integrated circuit including a plurality of basic cells and additional interconnect layers respectively provided above the basic cells, comprises the steps of arranging a plurality of any of the first through sixth CMOS basic cells on a semiconductor substrate; and realizing a logic circuit including transistors connected to each other in parallel by using the interconnect patterns formed in the uppermost interconnect layers of the CMOS basic cells and the additional interconnect layers.

Alternatively, the method of this invention for fabricating a gate array semiconductor integrated circuit including a plurality of basic cells and additional interconnect layers respectively provided above the basic cells, comprises the steps of arranging a plurality of any of the first through sixth CMOS basic cells on a semiconductor substrate; and realizing a compound logic circuit by using the interconnect patterns formed in the uppermost interconnect layers of the CMOS basic cells and the additional interconnect layers.

Alternatively, the method of this invention for fabricating a gate array semiconductor integrated circuit including a plurality of basic cells and additional interconnect layers respectively provided above the basic cells, comprises the steps of arranging a plurality of any of the first through sixth CMOS basic cells on a semiconductor substrate; and realizing a logic circuit including a control signal line by using the interconnect patterns formed in the uppermost interconnect layers of the CMOS basic cells and the additional interconnect layers.

Alternatively, the method of this invention for fabricating a gate array semiconductor integrated circuit including a plurality of basic cells and additional interconnect layers respectively provided above the basic cells, comprises the steps of arranging a plurality of the first through sixth CMOS basic cells on a semiconductor substrate; and realizing a logic circuit for a memory by using the interconnect patterns formed in the uppermost interconnect layers of the CMOS basic cells and the additional interconnect layers.

Alternatively, the method of this invention for fabricating a gate array semiconductor integrated circuit including a plurality of basic cells and additional interconnect layers respectively provided above the basic cells, comprises the steps of arranging a plurality of the first through sixth CMOS basic cells on a semiconductor substrate; and realizing a flip-flop circuit having a scan test function by using the interconnect patterns formed in the uppermost interconnect layers of the CMOS basic cells and the additional interconnect layers.

The seventh CMOS basic cell of this invention to be used with other basic cells having the same structure disposed on right and left hand sides thereof, comprises an N-channel transistor and a P-channel transistor formed on a semiconductor substrate, and a gate of at least one of the N-channel transistor and the P-channel transistor is in a hooked shape having a first bent part bending in one sideward direction at an upper portion thereof and a second bent part bending in the other sideward direction at a lower portion thereof.

The eighth CMOS basic cell of this invention to be used with other basic cells having the same structure disposed on right and left hand sides thereof, comprises an N-channel transistor and a P-channel transistor formed on a semiconductor substrate, and a diffusion region of at least one of the N-channel transistor and the P-channel transistor is in a hooked shape having a first bent part bending in one sideward direction at an upper portion thereof and a second bent part bending in the other sideward direction at a lower portion thereof.

The ninth CMOS basic cell of this invention to be used with other basic cells having the same structure disposed on right and left hand sides thereof, comprises an N-channel transistor and a P-channel transistor formed on a semiconductor substrate, and a gate of at least one of the N-channel transistor and the P-channel transistor is in a hooked shape including a first bent part bending in one sideward direction at an upper portion thereof and a second bent part bending in the other sideward direction at a lower portion thereof, and a diffusion region of at least one of the N-channel transistor and the P-channel transistor is in a hooked shape having a first bent part bending in one sideward direction at an upper portion thereof and a second bent part bending in the other sideward direction at a lower portion thereof.

In the ninth CMOS basic cell, a first N-channel transistor and a first P-channel transistor are formed to extend along a vertical direction, a second N-channel transistor is disposed on a side of the first N-channel transistor and a second P-channel transistor is disposed on a side of the first P-channel transistor, and a gate of each of the first and second N-channel transistors and the first and second P-channel transistors is formed in the hooked shape.

In the ninth CMOS basic cell, the gates of the first and second N-channel transistors are disposed in a manner that the first bent part of one gate overlaps the second bent part of the other gate when seen along the vertical direction from one position in a horizontal direction, and the gates of the first and second P-channel transistors are disposed in a manner that the first bent part of one gate overlaps the second bent part of the other gate when seen along the vertical direction from one position in the horizontal direction.

In the ninth CMOS basic cell, the first and second N-channel transistors share one diffusion region and the first and second P-channel transistors share one diffusion region, each of the diffusion regions is divided into a shared diffusion region shared by the first and second N-channel or P-channel transistors and positioned between the gates of the first and second N-channel or P-channel transistors; a first dedicated diffusion region positioned on a side of the gate of the first N-channel or P-channel transistor opposite to the shared diffusion region; and a second dedicated diffusion region positioned on a side of the gate of the second N-channel or P-channel transistor opposite to the shared diffusion region, the first bent part is formed in the first dedicated diffusion region, and the second bent part is formed in the second dedicated diffusion region.

Any of the seventh through ninth CMOS basic cells, can comprise, outside of a transistor region where the N-channel transistor and the P-channel transistor are disposed, a fixed interconnect region where a power supply interconnect and a ground interconnect are disposed.

Alternatively, the method of this invention for fabricating a gate array semiconductor integrated circuit including a plurality of basic cells arranged in a horizontal direction, comprises a step of arranging a plurality of any of the seventh through ninth CMOS basic cells in the horizontal direction in a manner that the first bent part of one CMOS basic cell overlaps the second bent part of another adjacent CMOS basic cell when seen along a vertical direction from one position in a horizontal direction.

Accordingly, in the present invention, in fabricating a gate array semiconductor integrated circuit by using a plurality of CMOS basic cells, the interconnect pattern previously formed in the uppermost interconnect layer of each CMOS basic cell is used as a part of the interconnects for connecting the basic cells to one another. Therefore, even a logic circuit with a complicated structure can be fabricated and realized by using merely one interconnect layer for wiring. Accordingly, the line crowdedness in the interconnect layer used in wiring during the design of the semiconductor integrated circuit can be reduced, so as to improve the ratio of used gates to all the gates in the gate array, resulting in improving the degree of integration of the semiconductor integrated circuit.

Furthermore, in the present CMOS basic cell and the fabrication of a semiconductor integrated circuit by arranging a plurality of CMOS basic cells, the gate of the N-channel or P-channel transistor of each basic cell is formed in the hooked shape. In the case where the semiconductor integrated circuit is constructed by arranging the plural basic cells in the horizontal direction, the basic cells are disposed so as to partly overlap in a manner that the portion in the hooked shape is inlaid with the portion in the hooked shape of the adjacent basic cell. Accordingly, the layout area of the semiconductor integrated circuit can be effectively reduced. In addition, owing to this overlap arrangement, in the case where the gate of the transistor of one basic cell is connected to the diffusion region of the transistor of another adjacent basic cell, the interconnect therebetween can be disposed to extend in the vertical direction in the same position along the horizontal direction, and there is no need to extend the interconnect in the horizontal direction. Accordingly, the line length can be reduced. As a result, the layout area can be reduced with sufficiently securing the wiring tracks, and in addition, the operation speed can be increased and power consumption can be reduced due to the reduced line length and reduced diffusion capacitance.

BRIEF DESCRIPTION OF THE DRAWINGS

FIG. 1A is a layout diagram of a CMOS basic cell according to Embodiment 1 of the invention, FIG. 1B is an equivalent circuit diagram thereof, FIG. 1G is a diagram for illustrating placement of a global interconnect employed when two basic cells of FIG. 1E are arranged in parallel.

FIG. 11A is a layout wiring diagram using the basic cell of FIG. 10 and another adjacent basic cell, FIG. 11B is a diagram for showing connection between interconnect patterns of two basic cells through two vias and FIG. 11C is a diagram for showing connection between the interconnect patterns through one via.

FIG. 27A is a layout diagram of a CMOS basic cell according to Embodiment 6 of the invention and FIG. 27B is an equivalent circuit diagram of the basic cell.

DETAILED DESCRIPTION OF THE INVENTION

CMOS basic cells and methods for fabricating a semiconductor integrated circuit according to preferred embodiments of the invention will now be described with reference to FIGS. 1 through 29.

Embodiment 1

Figure 30:
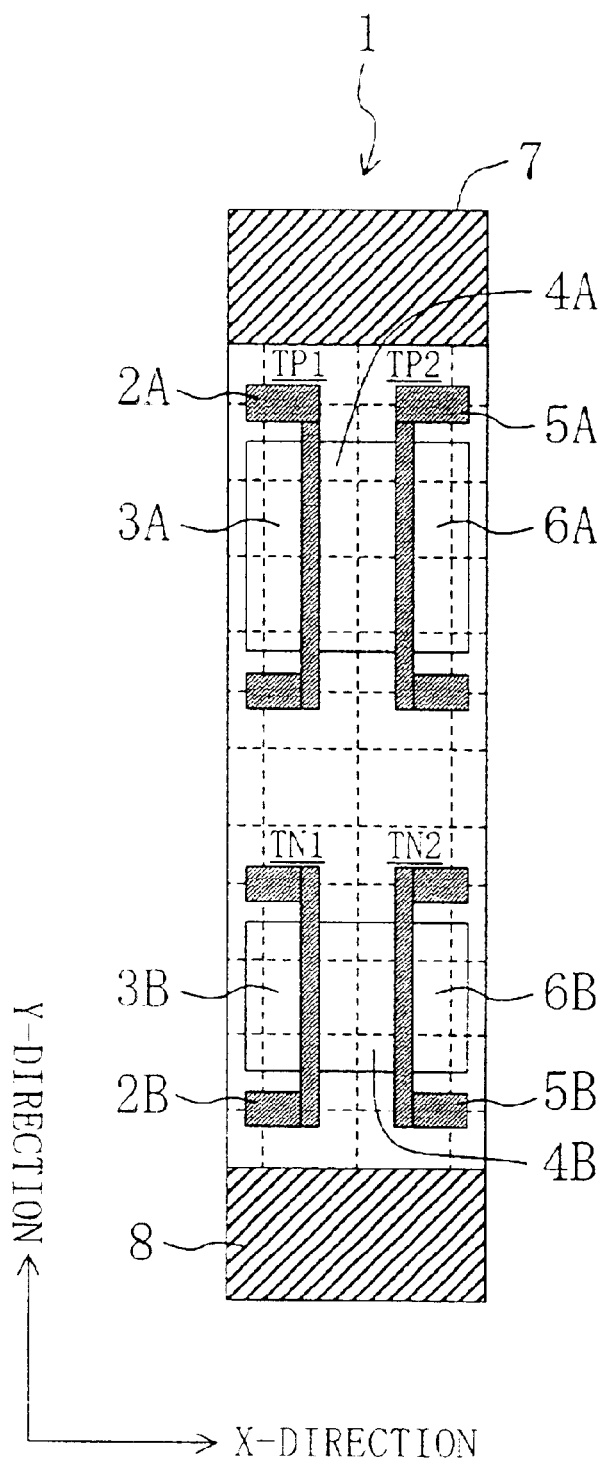
FIG. 30 is a layout diagram of a conventional basic cell.

FIG. 1A is a diagram of a CMOS basic cell according to Embodiment 1 of the invention, and FIG. 1B is an equivalent circuit diagram of the basic cell of FIG. 1A. In FIGS. 1A and 1B, like reference numerals TP1, TP2, TN1, TN2, 1, 7, 8, 2A through 6A and 2B through 6B are used to refer to like elements used in the conventional basic cell shown in FIG. 30, so that the detailed description can be omitted.

Figure 1C:
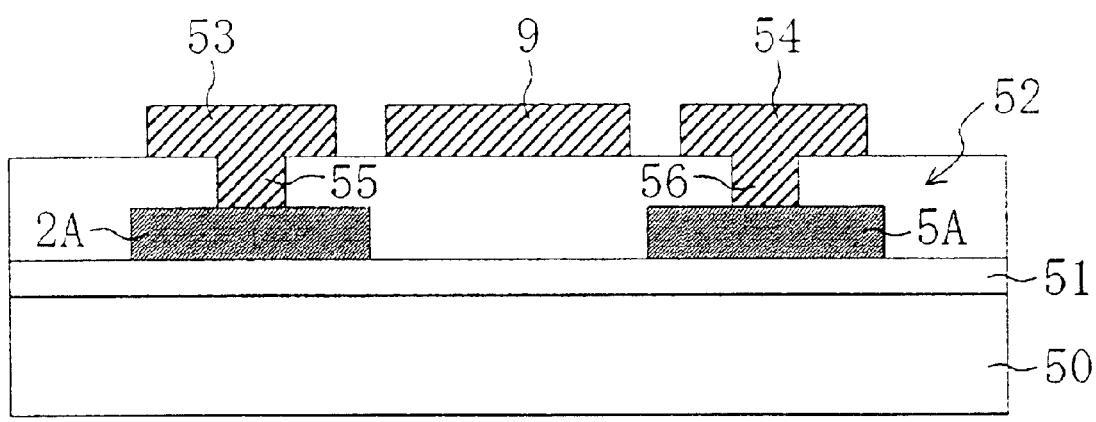
FIG. 1C is a cross-sectional view thereof taken on line 1A—1A of FIG. 1A.

In this embodiment, the basic cell 1 of FIG. 1A has an interconnect pattern 9 extending along a perpendicular direction to a boundary between the N-channel transistor region and the P-channel transistor region. The interconnect pattern 9 is independent of the N-channel and P-channel transistor regions. Although merely one interconnect pattern 9 is shown in FIG. 1A, the interconnect pattern may be plural in number. FIG. 1C is a cross-sectional view of the basic cell 1 taken on line 1A—1A of FIG. 1A. In FIG. 1C, a reference numeral 50 denotes a semiconductor substrate and a reference numeral 51 denotes a gate oxide film formed on the substrate 50, and the two gate electrodes 2A and 5A are formed in the gate oxide film 51. The interconnect pattern 9 is disposed on an interlayer insulating film 52 covering the gate electrodes 2A and 5A, and two interconnects 53 and 54 are disposed on the right and left hand sides, in the drawing, of the interconnect pattern 9. The two interconnects 53 and 54 are respectively connected to the gate electrodes 2A and 5A through contact holes 55 and 56 formed in the interlayer insulating film 52. Although not shown in the drawing, the power supply pattern 7 and the GND pattern 8 are formed on the interlayer insulating film 52.

Figure 1D:
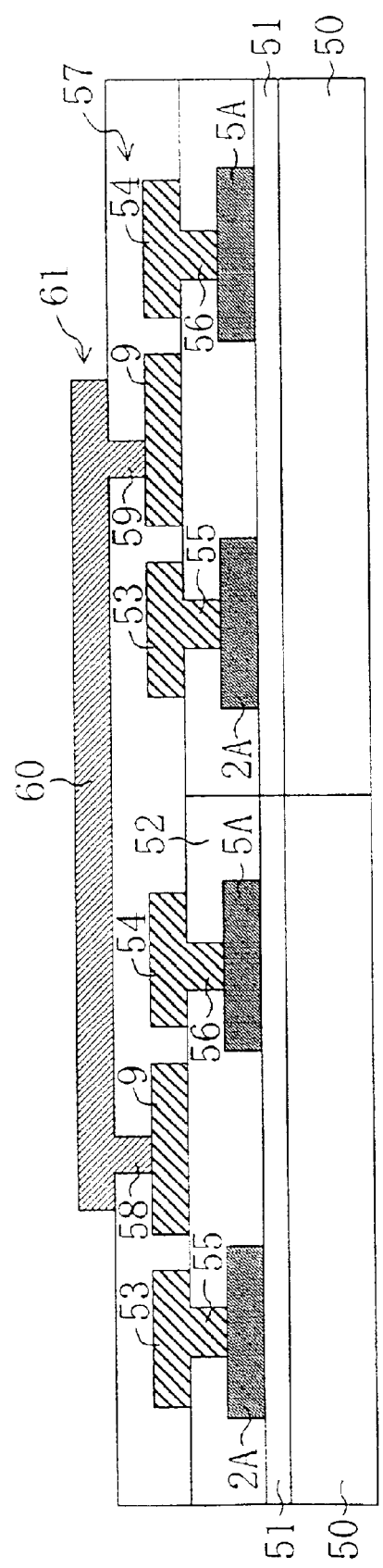
FIG. 1D is a diagram for illustrating placement of a global interconnect employed when two basic cells of FIG. 1A are arranged in parallel.

In the case where a semiconductor integrated circuit is formed by arranging a plurality of basic cells 1 in parallel, a global interconnect 60 is disposed as shown in FIG. 1D. In FIG. 1D, two basic cells are used for simplification, the global interconnect 60 is disposed on an interlayer insulating film 57 covering the interconnect patterns 9, and the global interconnect 60 is connected to the interconnect patterns 9 through contact holes 58 and 59 formed in the interlayer insulating film 57. In the case of FIG. 1D, an interconnect layer where the interconnect patterns 9 are disposed corresponds to a first interconnect layer (the uppermost interconnect layer), and an interconnect layer 61 where the global interconnect 60 is disposed corresponds to a second interconnect layer (additional interconnect layer).

Figure 1E:
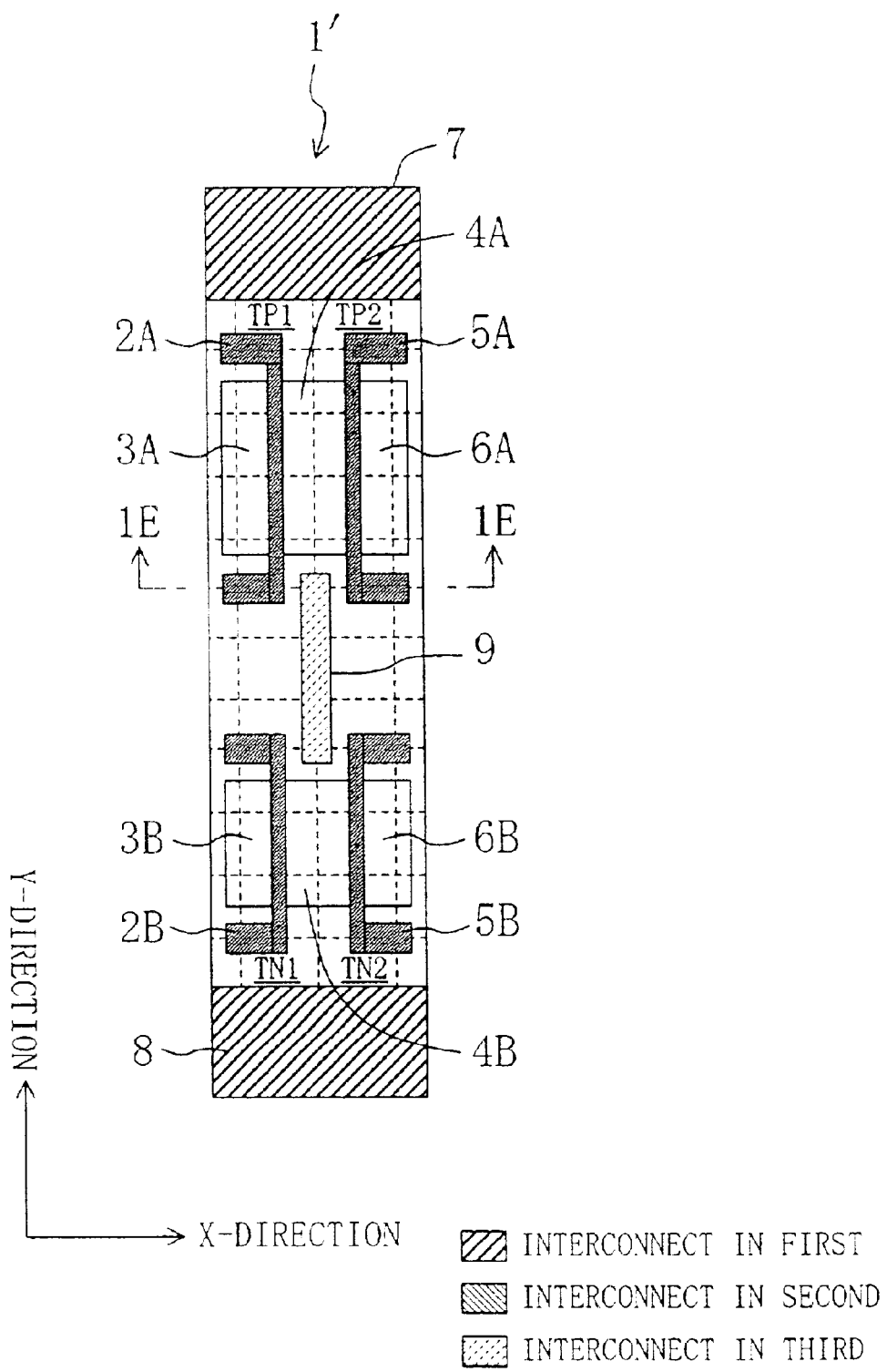
FIG. 1E is a diagram of a modification of the basic cell of FIG. 1A.
Figure 1F:
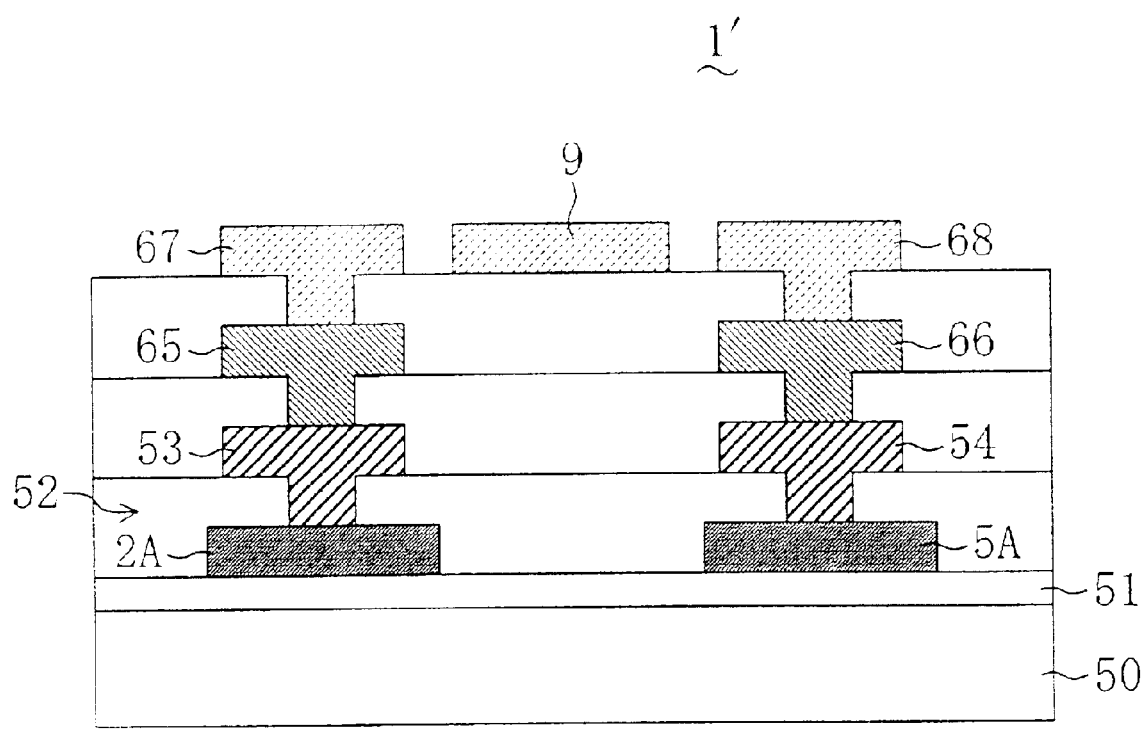
FIG. 1F is a cross-sectional view of the basic cell of FIG. 1E taken on line 1E—1E.

FIG. 1E is a diagram of a basic cell 1' obtained by modifying the basic cell 1 of FIG. 1A. In the basic cell 1 of FIG. 1A, the interconnect pattern 9 is disposed in the first interconnect layer, and in contrast, the interconnect pattern 9 is disposed in a third interconnect layer in the basic cell 1' of FIG. 1E. Specifically, as shown in FIG. 1F corresponding to a cross-sectional view taken on line 1E—1E of FIG. 1E, the basic cell 1' includes a first interconnect layer where the interconnects 53 and 54 are disposed, a second interconnect layer where interconnects 65 and 66 are disposed and a third interconnect layer where interconnects 67 and 68 are disposed, and the interconnect pattern 9 is disposed in the third interconnect layer. The interconnects 53, 65 and 67 are connected to the gate electrode 2A and the interconnects 54, 66 and 68 are connected to the gate electrode 5A.

In the case where a semiconductor integrated circuit is fabricated by arranging a plurality of basic cells 1' of FIG. 1E in parallel, a global interconnect 70 is disposed in a fourth interconnect layer (additional interconnect layer) 71, and the interconnect patterns 9 disposed in the third interconnect layer (corresponding to the uppermost interconnect layer of the basic cell 1') are connected to the global interconnect 70 disposed in the fourth interconnect layer through contact holes 73 and 74 formed in an interlayer insulating film 72 of the third interconnect layer.

Since the third interconnect layer is the uppermost layer in the basic cell 1' of FIG. 1F, the interconnect pattern 9 is disposed in the third interconnect layer. In the case where a basic cell has four or more interconnect layers, the interconnect pattern 9 is disposed in the uppermost layer among them.

Figure 2B:
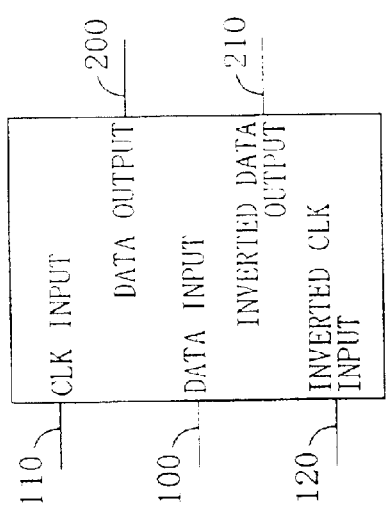
FIG. 2B is a symbol diagram of the DFF.
Figure 2C:
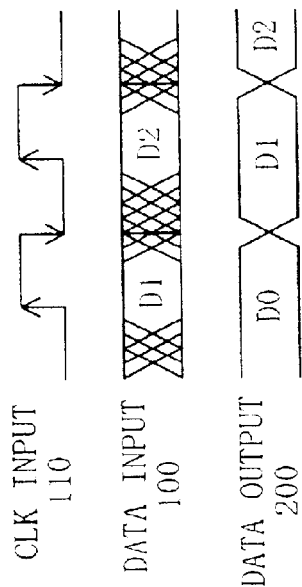
FIG. 2C is an operation timing chart of the DFF.
Figure 2A:
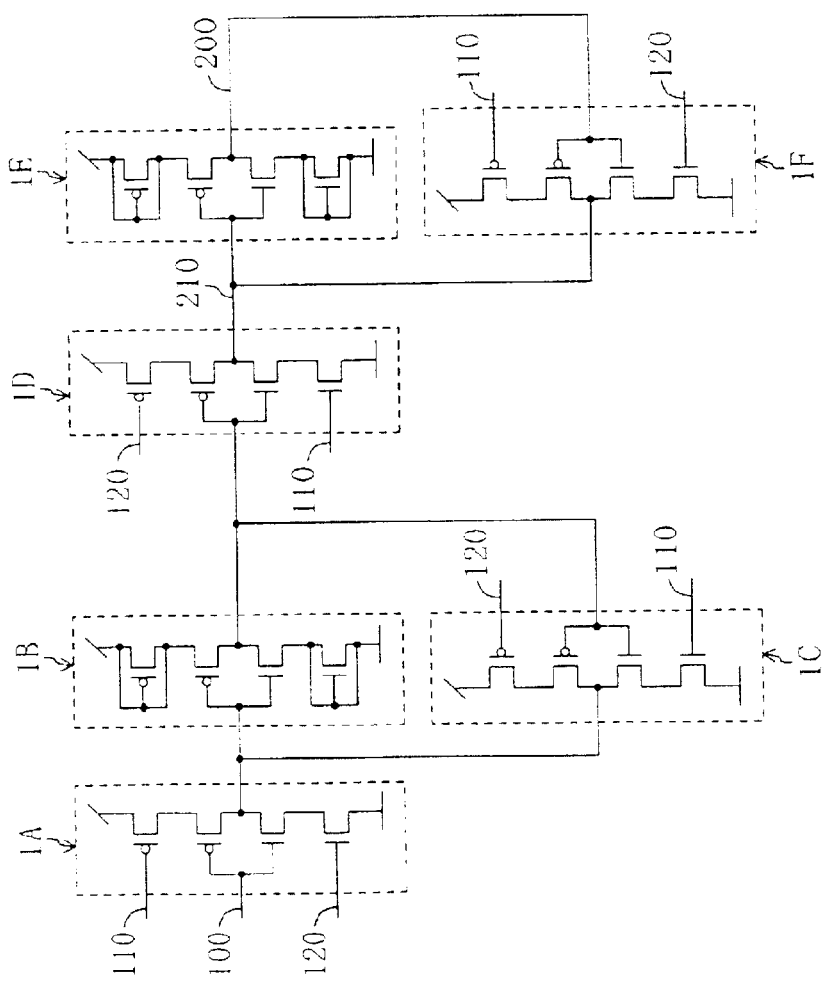
FIG. 2A is a circuit diagram of a DFF constructed by using the basic cell of FIG. 1A.
Figure 3A:
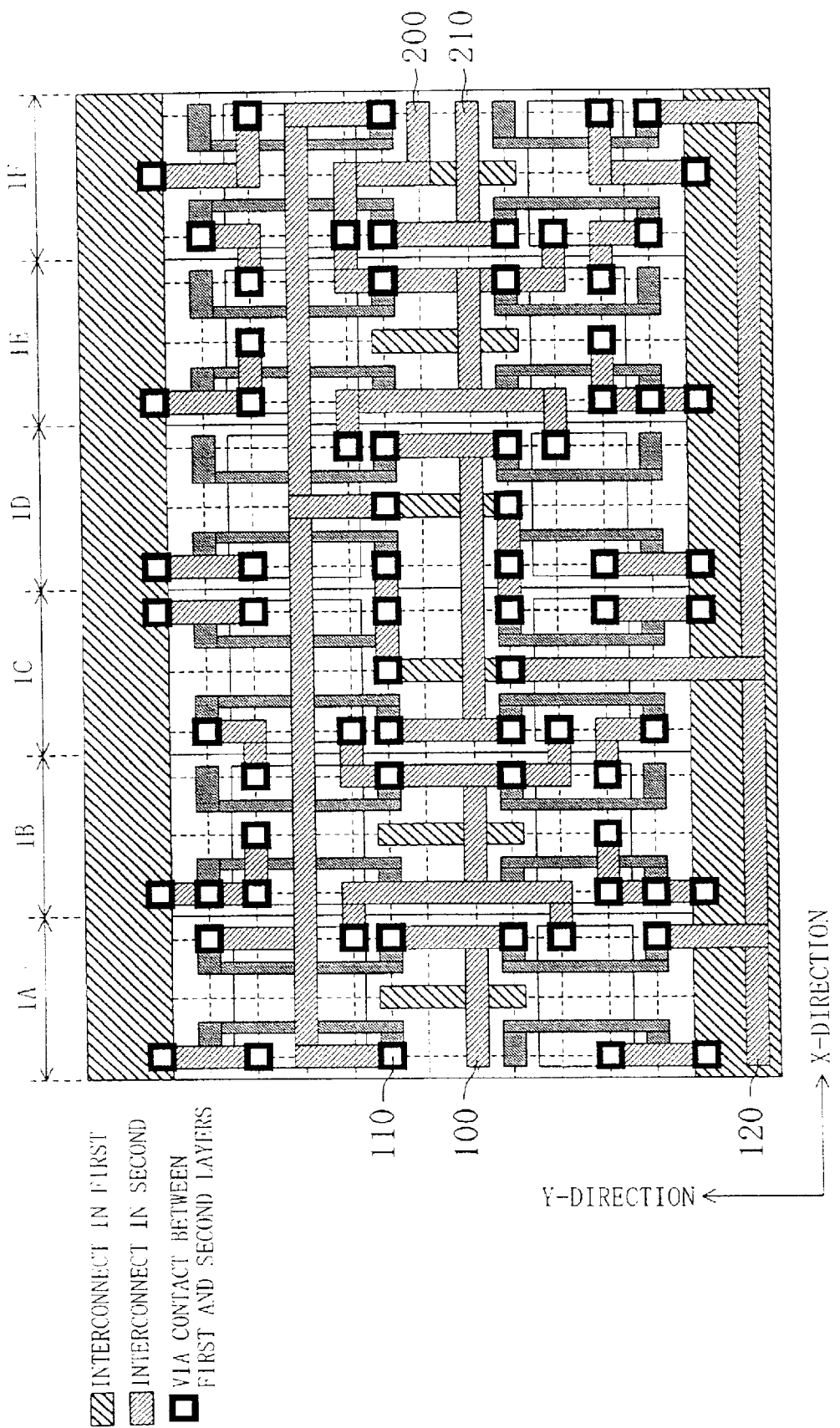
FIG. 3A is a layout wiring diagram of a DFF using the basic cell of FIG. 1A
Figure 3B:
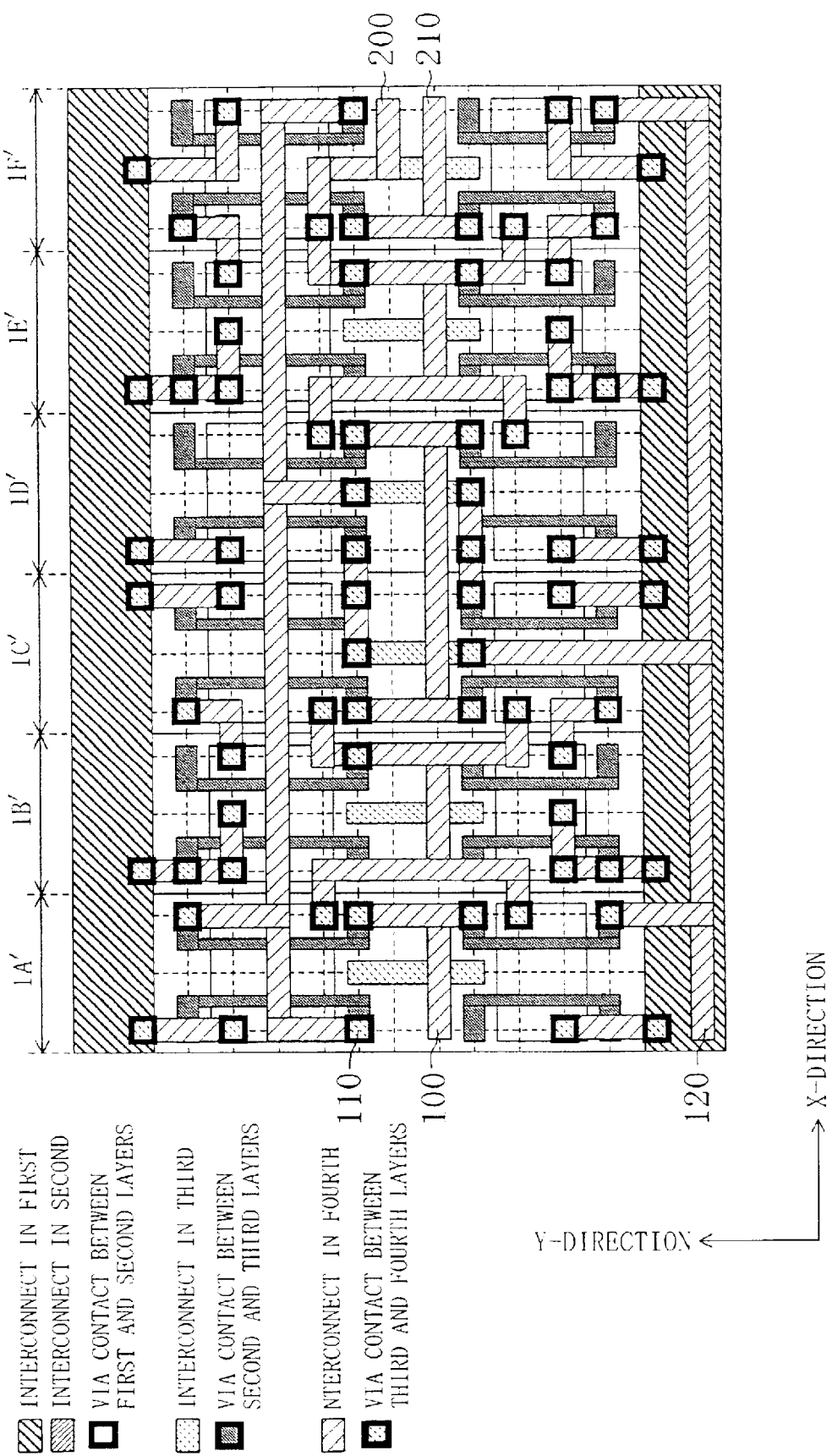
FIG. 3B is another layout wiring diagram of a DFF using the basic cell of FIG. 1E.

FIG. 2A shows an example of a DFF circuit, FIG. 2B is a symbol diagram of the DFF circuit of FIG. 2A and FIG. 2C is an operation timing chart thereof. In FIG. 2B, a reference numeral 100 denotes a DATA input terminal, a reference numeral 110 denotes a CLK input terminal, a reference numeral 120 denotes an inverted CLK input terminal, a reference numeral 200 denotes a DATA output terminal and a reference numeral 210 denotes an inverted DATA output terminal. FIG. 3A shows a layout structure of a semiconductor integrated circuit (corresponding to the DFF circuit of FIG. 2A) fabricated by arranging a plurality of basic cells 1 of FIG. 1A on a semiconductor substrate. In FIG. 3A, the basic cells 1A through 1F of FIG. 1A are arranged along the X-direction, and the interconnect patterns 9 of the basic cells 1A through 1F are effectively used so as to realize the DFF circuit of FIG. 2A by using the second interconnect layer alone for wiring. FIG. 3B shows a layout structure of the DFF circuit of FIG. 2A fabricated by arranging a plurality of basic cells 1' of FIG. 1E on a semiconductor substrate. Also in FIG. 3B, the basic cells 1A' through 1F' of FIG. 1E are arranged along the X-direction, and the interconnect patterns 9 of the basic cells 1A' through 1F' are effectively used so as to realize the DFF circuit of FIG. 2A by using the fourth interconnect layer alone for wiring.

Figure 4A:
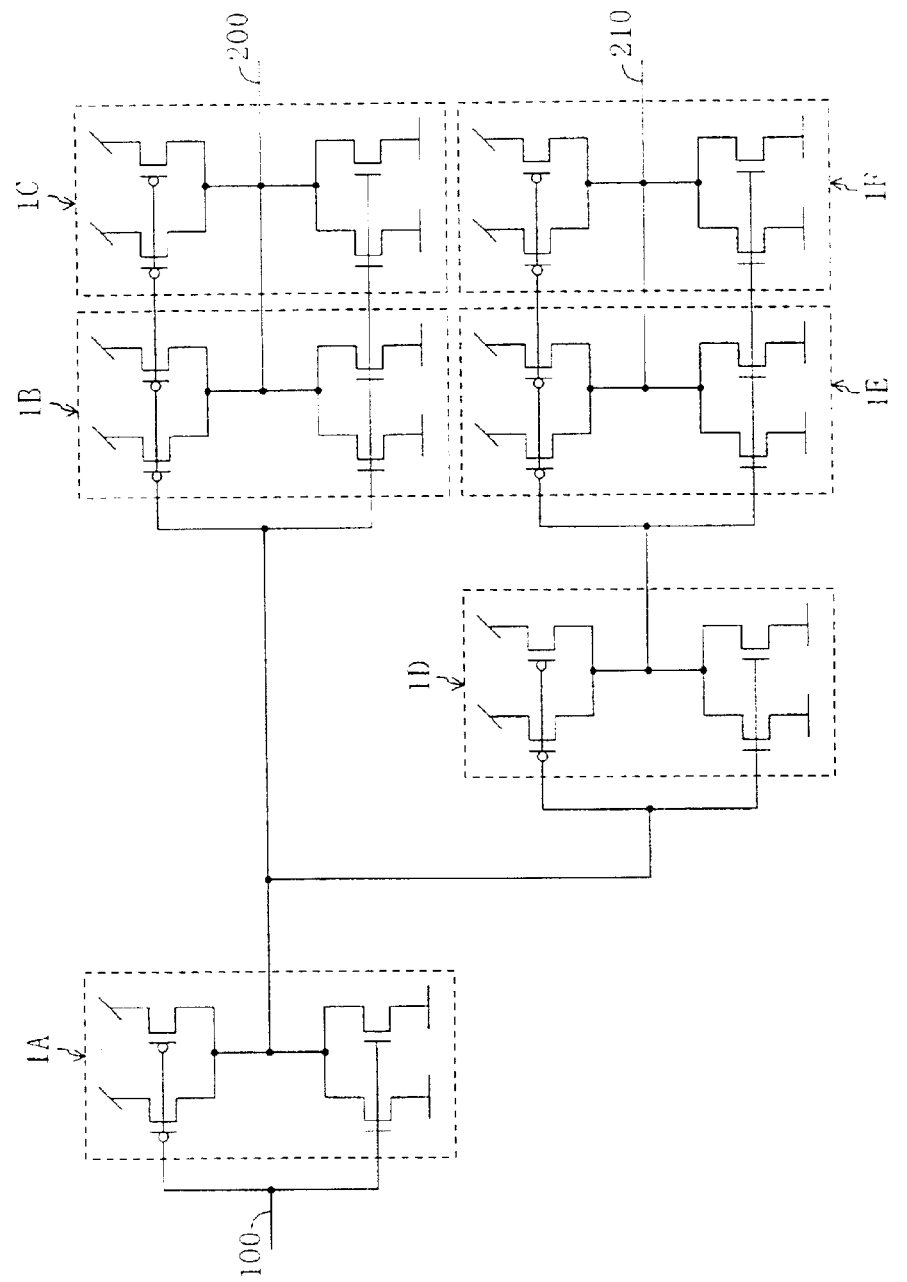
FIG. 4A is a circuit diagram of a buffer constructed by using the basic cell of FIG. 1A
Figure 4B:
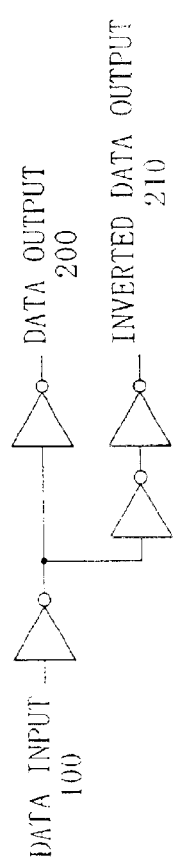
FIG. 4B is a symbol diagram of the buffer.
Figure 5:
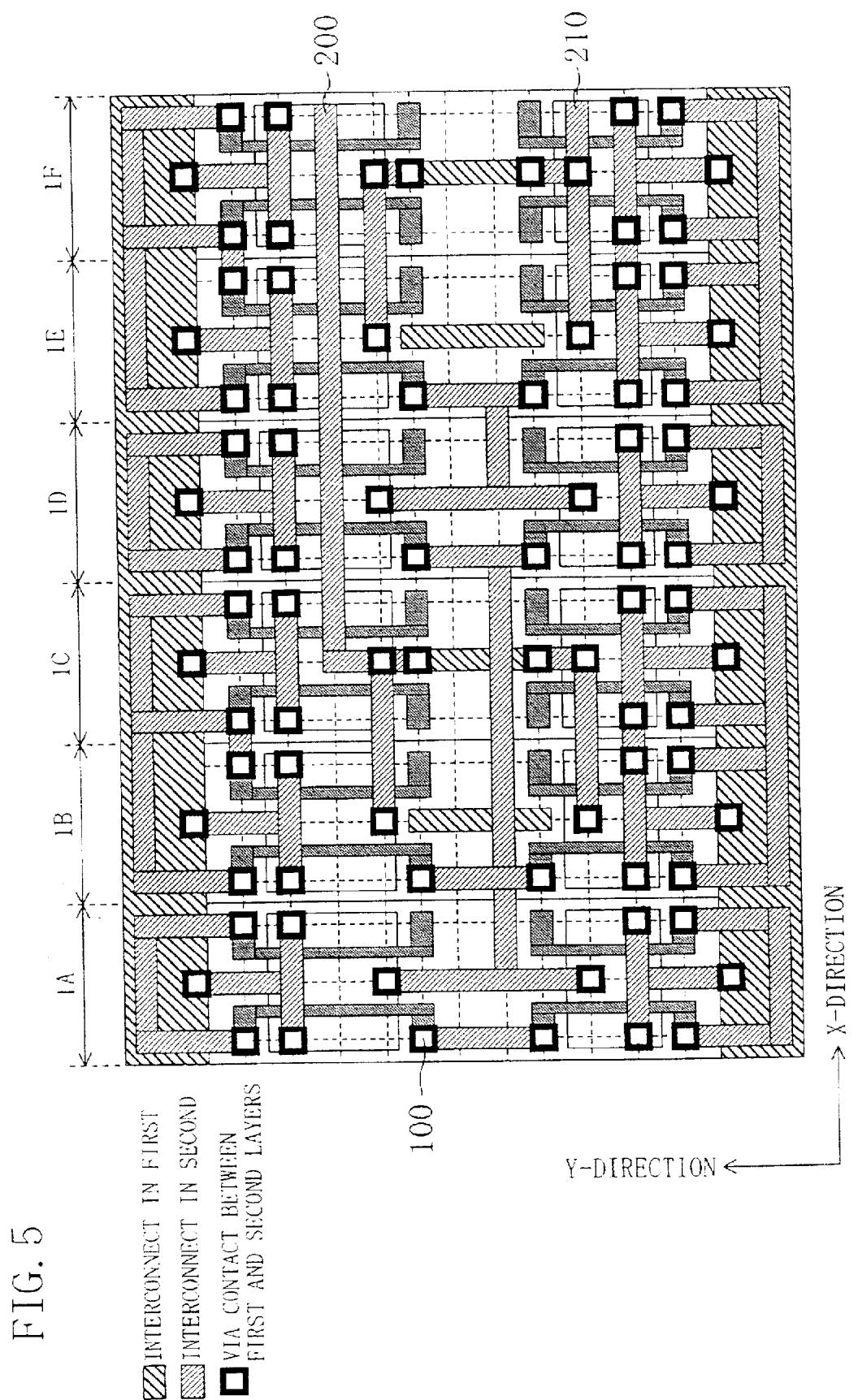
FIG. 5 is a layout wiring diagram of a buffer using the basic cell of FIG. 1A.

FIG. 4A shows an example of a buffer circuit, and FIG. 4B is a symbol diagram of the buffer circuit, wherein a reference numeral 100 denotes a DATA input terminal, a reference numeral 200 denotes a DATA output terminal and a reference numeral 210 denotes an inverted DATA output terminal. FIG. 5 shows a layout structure of the buffer circuit of FIG. 4A fabricated by arranging a plurality of basic cells 1 of FIG. 1A on a semiconductor substrate. In FIG. 5, the basic cells 1A through 1F of FIG. 1A are arranged along the X-direction, and the interconnect patterns 9 are effectively used so as to realize the buffer circuit of FIG. 4A by using the second interconnect layer alone for wiring.

Figure 6A:
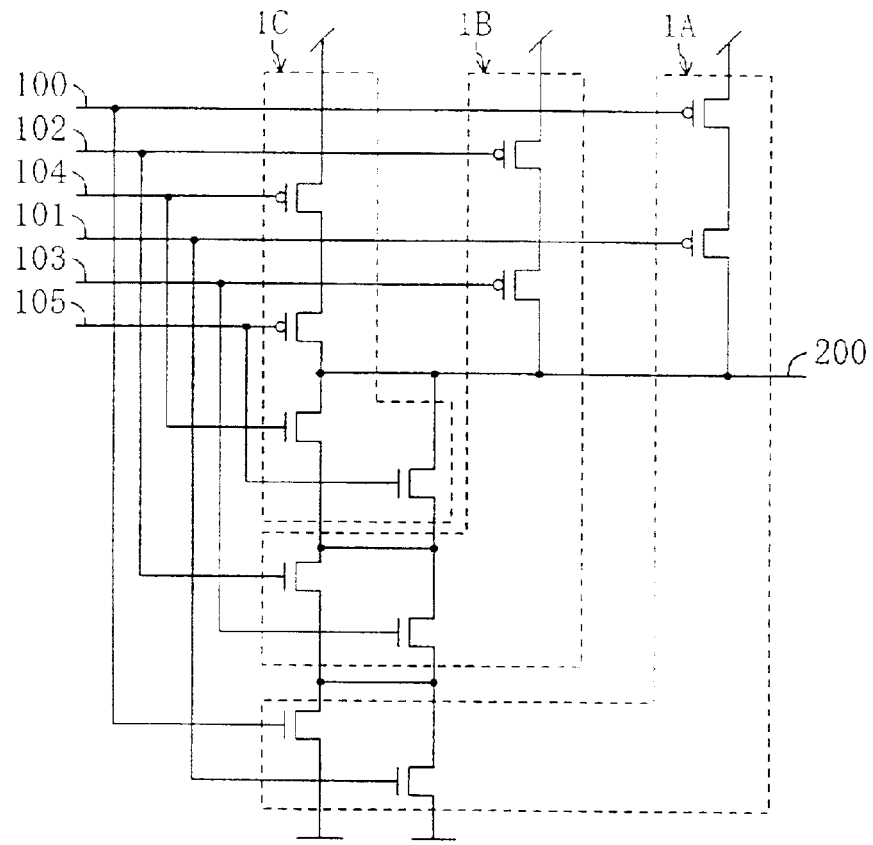
FIG. 6A is a circuit diagram of an ORNAND constructed by using the basic cell of FIG. 1A
Figure 6B:
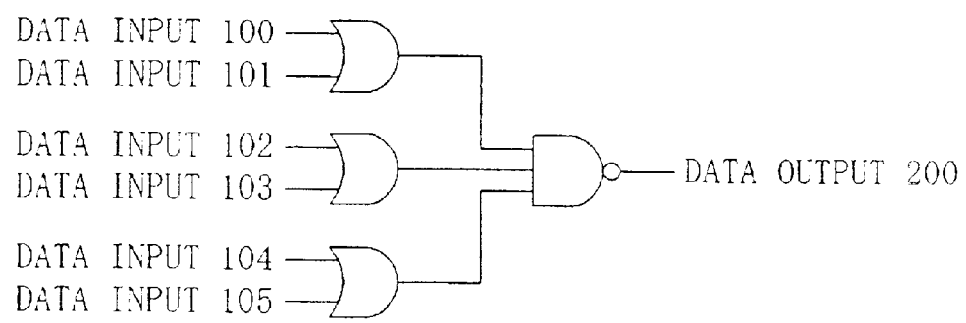
FIG. 6B is a symbol diagram of the ORNAND.
Figure 7:
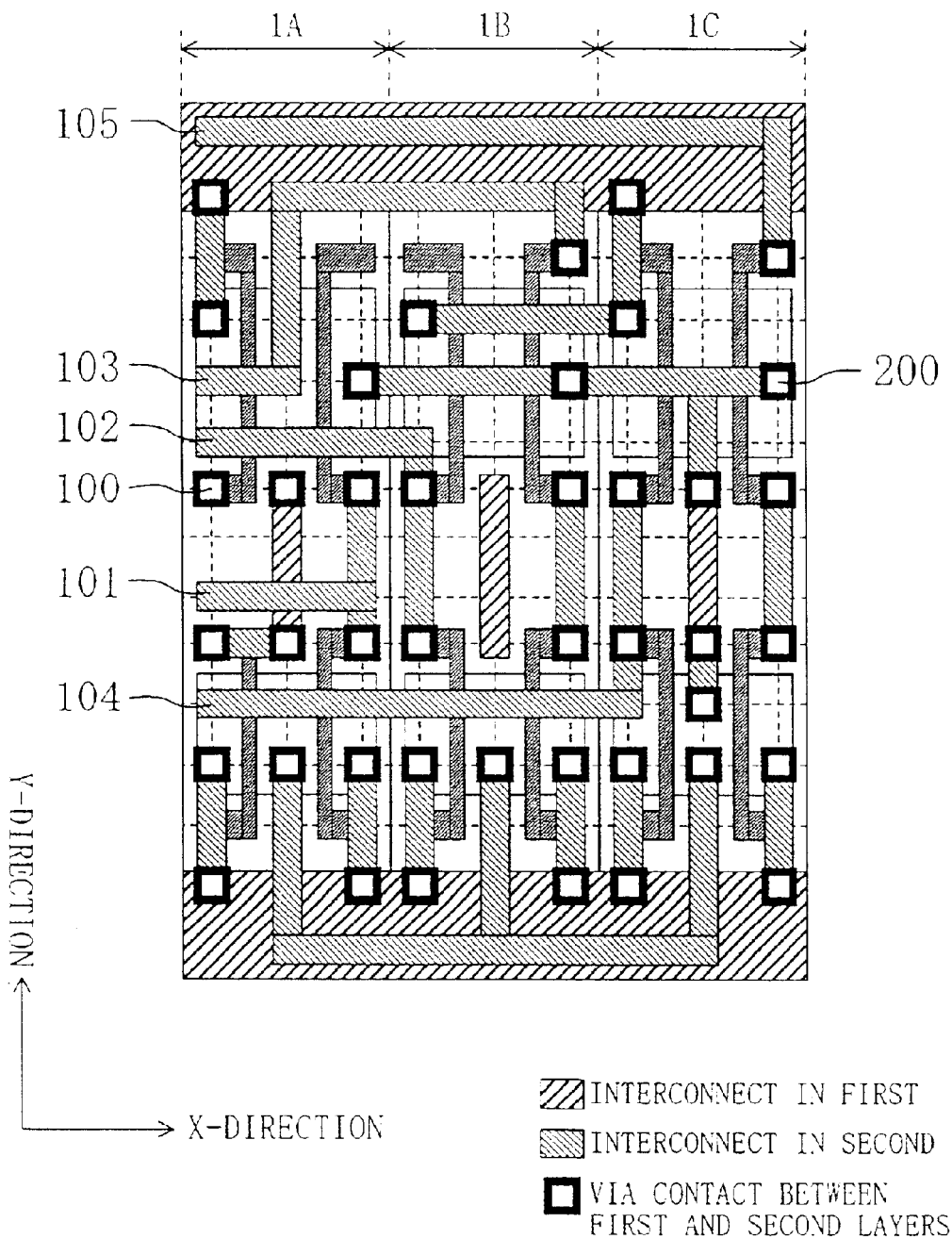
FIG. 7 is a layout wiring diagram of an ORNAND using the basic cell of FIG. 1A.

FIG. 6A shows an example of an ORNAND circuit, and FIG. 6B is a symbol diagram of the ORNAND circuit, wherein reference numerals 100 through 105 denote DATA input terminals and a reference numeral 200 denotes a DATA output terminal. FIG. 7 shows a layout structure of the ORNAND circuit of FIG. 6A fabricated by arranging a plurality of basic cells 1 of FIG. 1A on a semiconductor substrate. In FIG. 7, the basic cells 1A through 1C of FIG. 1A are arranged along the X (horizontal) direction, and the interconnect patterns 9 are effectively used so as to realize the ORNAND circuit of FIG. 6A by using the second interconnect layer alone for wiring.

Figure 8A:
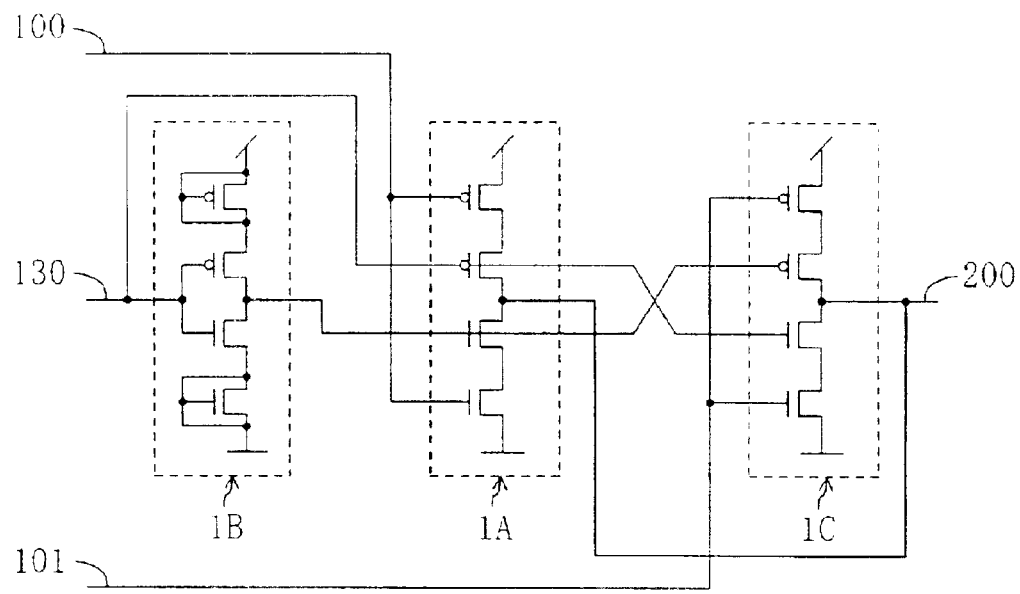
FIG. 8A is a circuit diagram of a selector constructed by using the basic cell of FIG. 1A
Figure 8B:
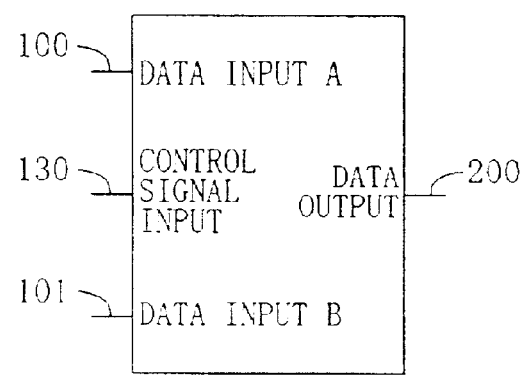
FIG. 8B is a symbol diagram of the selector.
Figure 9:
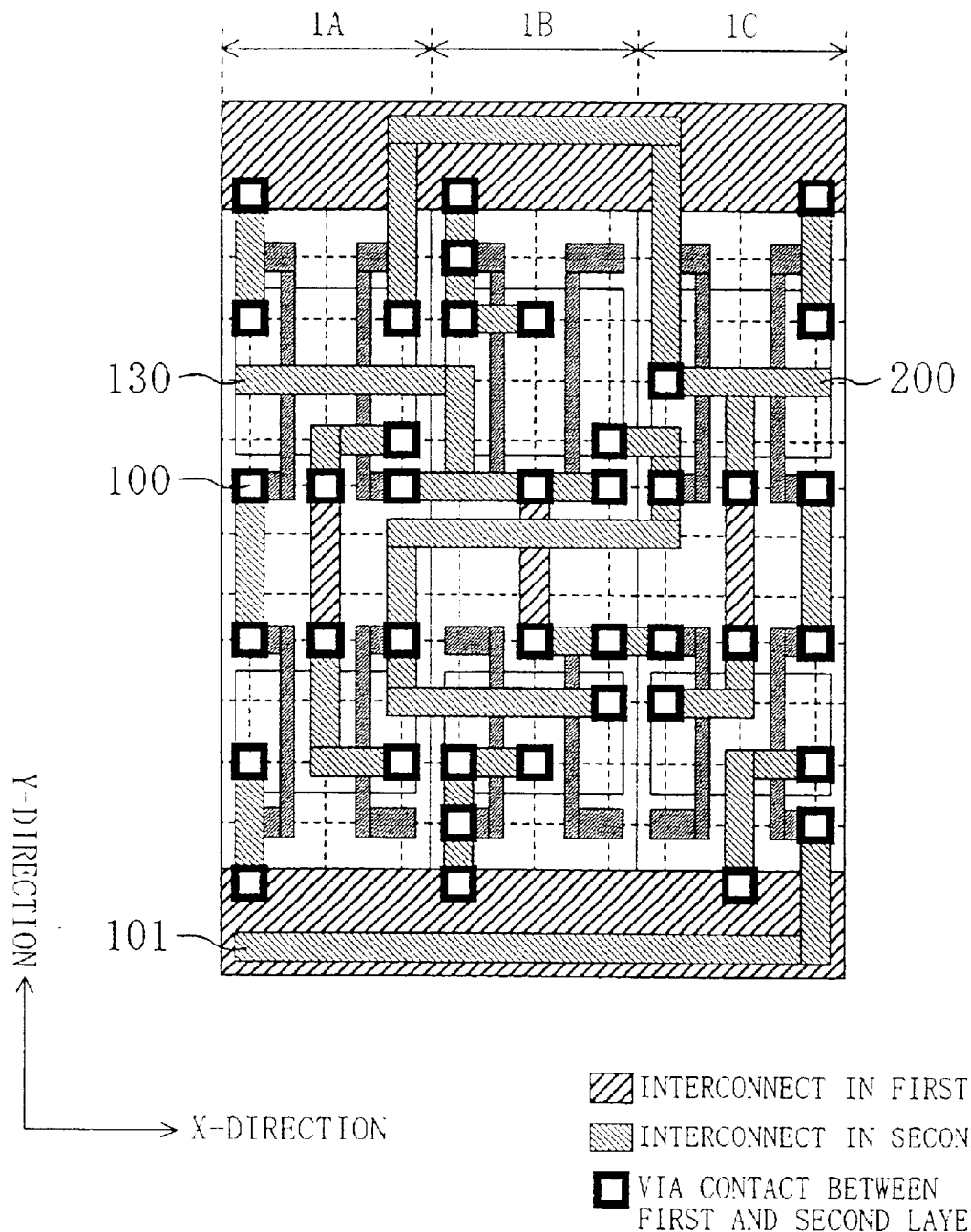
FIG. 9 is a layout wiring diagram of a selector using the basic cell of FIG. 1A.

FIG. 8A shows an example of a selector circuit, and FIG. 8B is a symbol diagram of the selector circuit, wherein a reference numeral 100 denotes a DATA input terminal on the A side, a reference numeral 101 denotes a DATA input terminal on the B side, a reference numeral 130 denotes an input terminal for a selecting control signal, and a reference numeral 200 denotes a DATA output terminal. FIG. 9 shows a layout structure of the selector circuit of FIG. 8A fabricated by arranging a plurality of basic cells 1 of FIG. 1A on a semiconductor substrate. In FIG. 9, the basic cells 1A through 1C of FIG. 1A are arranged along the X-direction, and the interconnect patterns 9 are effectively used so as to realize the selector circuit of FIG. 8A by using the second interconnect layer alone for wiring.

Embodiment 2

Figure 10:
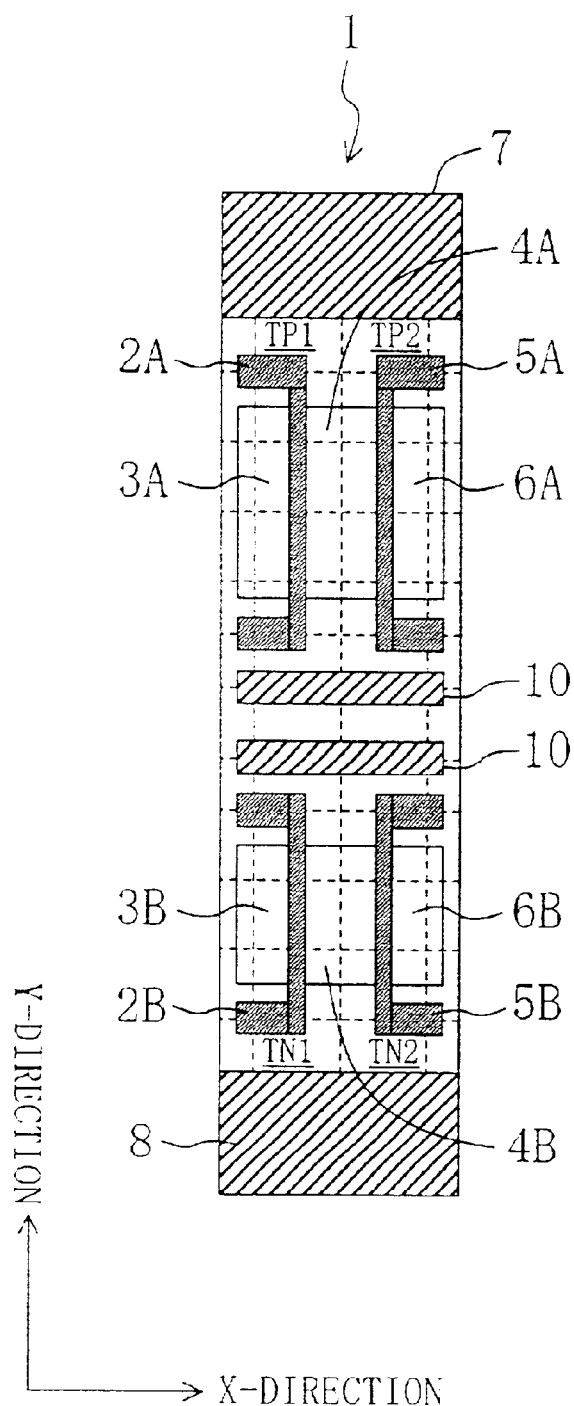
FIG. 10 is a layout diagram of a CMOS basic cell according to Embodiment 2 of the invention.

FIG. 10 shows the structure of a basic cell according to Embodiment 2 of the invention. The circuit diagram of this basic cell is the same as that shown in FIG. 1B. In FIG. 10, like reference numerals TP1, TP2, TN1, TN2, 1, 7, 8, 2A through 6A and 2B through 6B are used to refer to like elements used in the conventional basic cell of FIG. 30, so that the detailed description can be omitted.

The basic cell 1 of this embodiment has two interconnect patterns 10 extending along a direction parallel to a boundary between the N-channel transistor region and the P-channel transistor region. The interconnect patterns 10 are independent of the N-channel and P-channel transistor regions. Although two interconnect patterns 10 are shown in FIG. 10, the number of interconnect patterns may be one, three or more.

FIG. 11A shows a method for connecting the interconnect pattern 10 of the basic cell 1 of FIG. 10 to an interconnect pattern of another adjacent basic cell 1. In general, the interconnect patterns 10 are connected to an interconnect 30 disposed in the second layer by using two vias 20 formed on the grid if necessary as shown in FIG. 11B. However, if possible in view of the process, the interconnect pattern 10 formed in the first layer for signal lines is disposed in the vicinity of the adjacent basic cell with a minimum separation spacing therebetween, so that the interconnect pattern 10 can be connected to the interconnect 30 in the second layer through one via 20 if necessary as shown in FIG. 11C. In embodiments described below, the connection shown in FIG. 11B alone will be employed.

Figure 12:
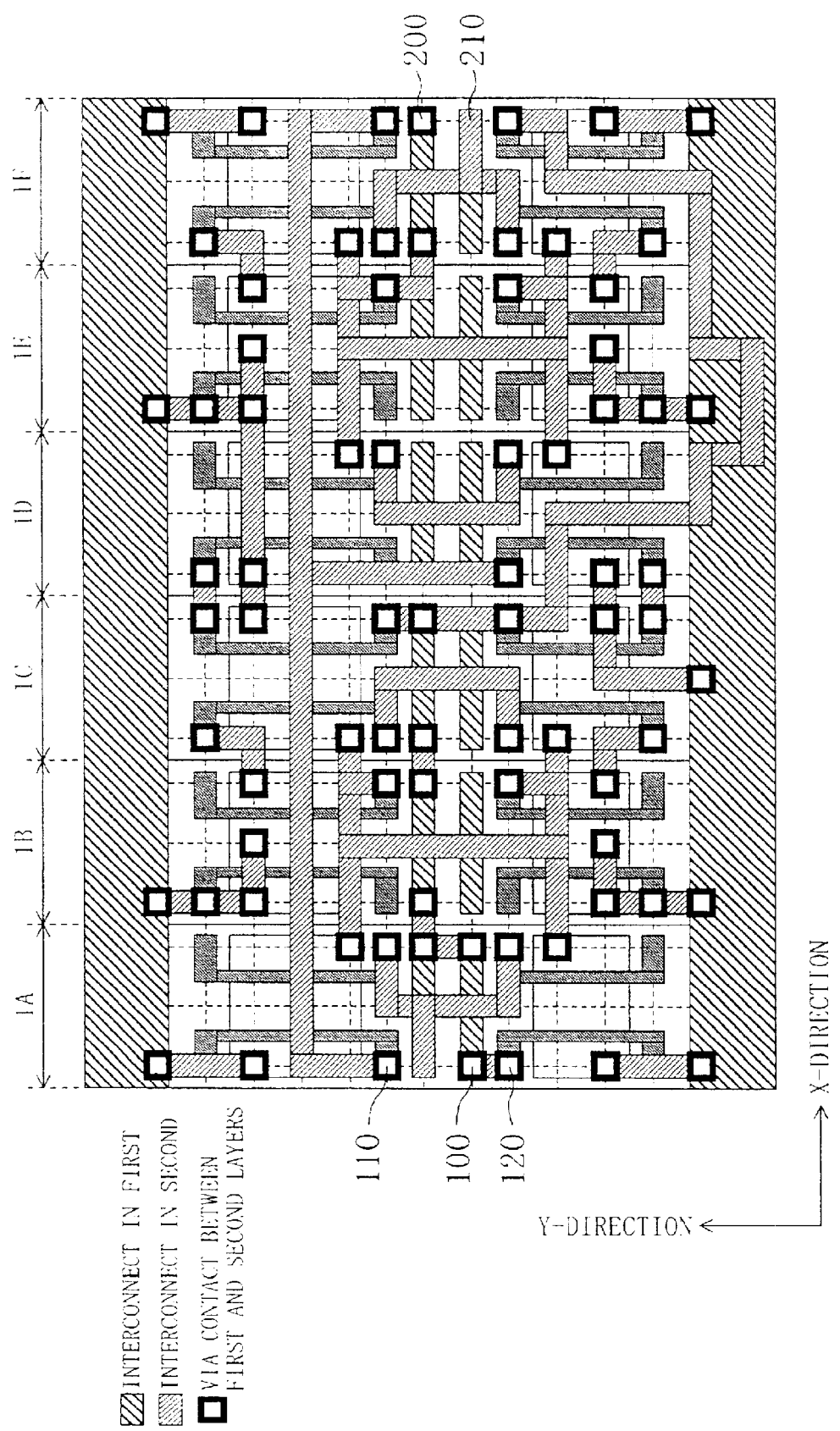
FIG. 12 is a layout wiring diagram of a DFF using the basic cell of FIG. 10.

FIG. 12 shows a layout structure obtained in fabricating the DFF circuit of FIG. 2A. The layout structure of FIG. 12 is obtained in fabricating the DFF circuit by arranging a plurality of basic cells 1 of FIG. 10 on a semiconductor substrate, and like reference numerals are used to refer to like elements used in FIG. 2B so as to omit the detailed description. In FIG. 12, the basic cells 1A through 1F of FIG. 10 are arranged along the X-direction, and the interconnect patterns 10 of the basic cells 1 are effectively used so as to realize the DFF circuit of FIG. 2A by using the second interconnect layer alone.

Figure 13:
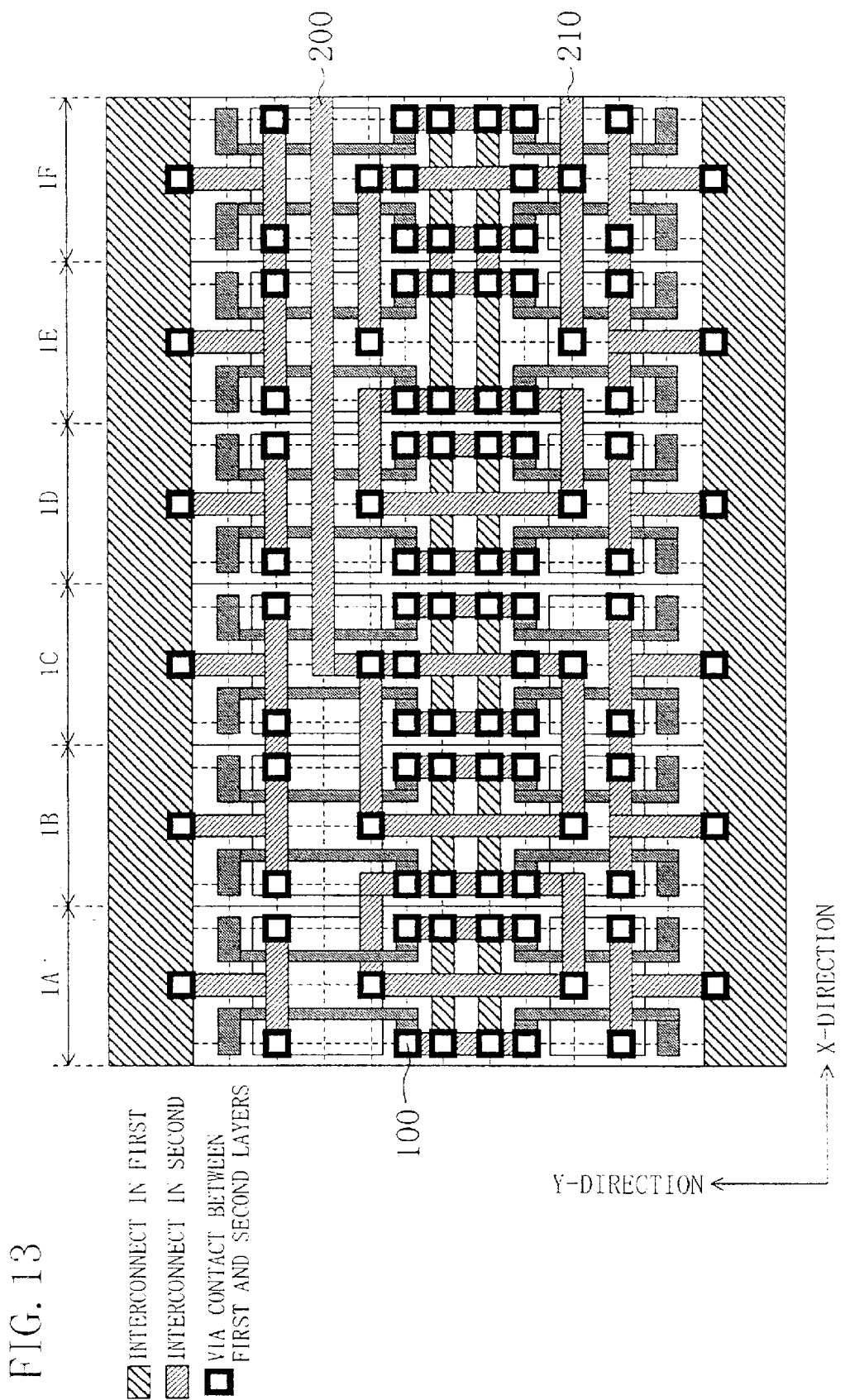
FIG. 13 is a layout wiring diagram of a buffer using the basic cell of FIG. 10.

FIG. 13 shows a layout structure obtained in fabricating the buffer circuit of FIG. 4A. The layout structure is obtained in fabricating the buffer circuit by arranging a plurality of basic cells 1 of FIG. 10 on a semiconductor substrate, and like reference numerals are used to refer to like elements used in FIG. 4B so as to omit the detailed description. In FIG. 13, the basic cells 1A through 1F of FIG. 10 are arranged along the X-direction, and the interconnect patterns 10 of the basic cells 1 are effectively used so as to realize the buffer circuit of FIG. 4A by using the second interconnect layer alone.

Figure 14:
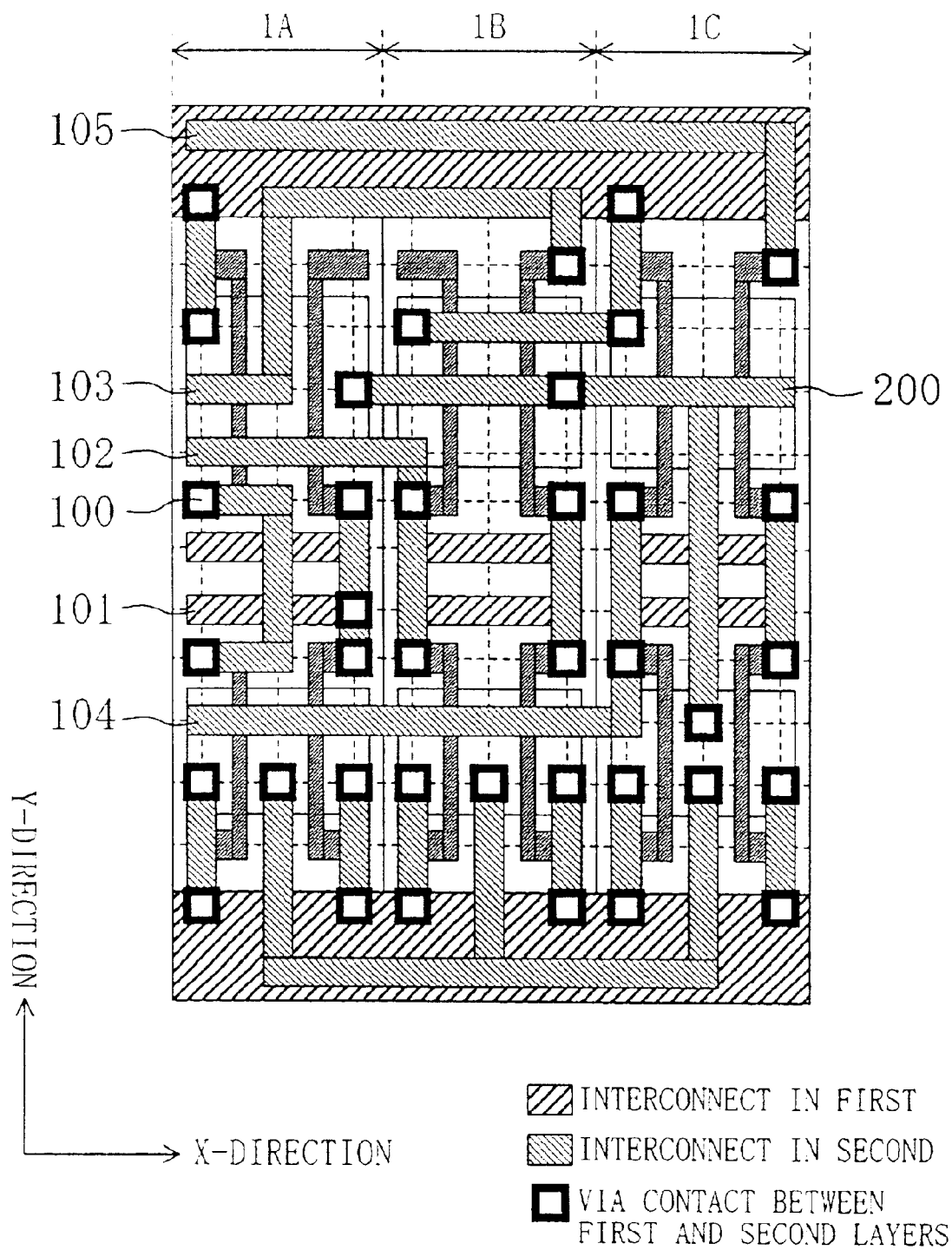
FIG. 14 is a layout wiring diagram of an ORNAND using the basic cell of FIG. 10.

FIG. 14 shows a layout structure obtained in fabricating the ORNAND circuit of FIG. 6A. The layout structure of FIG. 14 is obtained in fabricating the ORNAND circuit by arranging a plurality of basic cells 1 of FIG. 10 on a semiconductor substrate, and like reference numerals are used to refer to like elements used in FIG. 6B so as to omit the detailed description. In FIG. 14, the basic cells 1A through 1C of FIG. 10 are arranged in the X-direction, and the interconnect patterns 10 of the basic cells 1 are effectively used so as to realize the ORNAND circuit of FIG. 6A by using the second interconnect layer alone.

Figure 15:
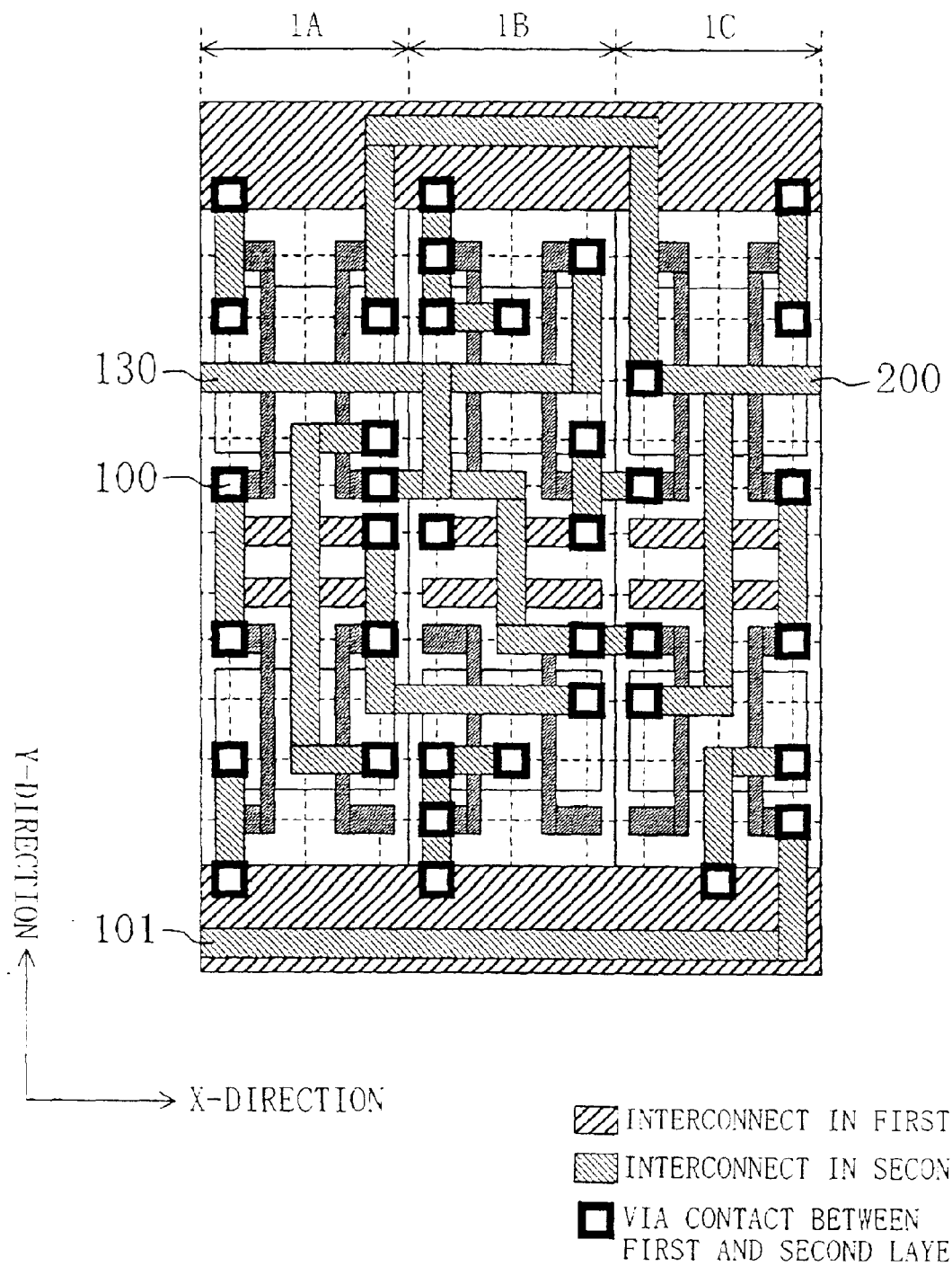
FIG. 15 is a layout wiring diagram of a selector using the basic cell of FIG. 10.

FIG. 15 shows a layout structure obtained in fabricating the selector circuit of FIG. 8A. The layout structure of FIG. 15 is obtained in fabricating the selector circuit by arranging a plurality of basic cells 1 of FIG. 10 on a semiconductor substrate, and like reference numerals are used to refer to like elements shown in FIG. 8B so as to omit the detailed description. In FIG. 15, the basic cells 1A through 1C are arranged along the X-direction, and the interconnect patterns 10 of the basic cells 1 are effectively used so as to realize the selector circuit of FIG. 8A by using the second interconnect layer alone.

Embodiment 3

Figure 16:
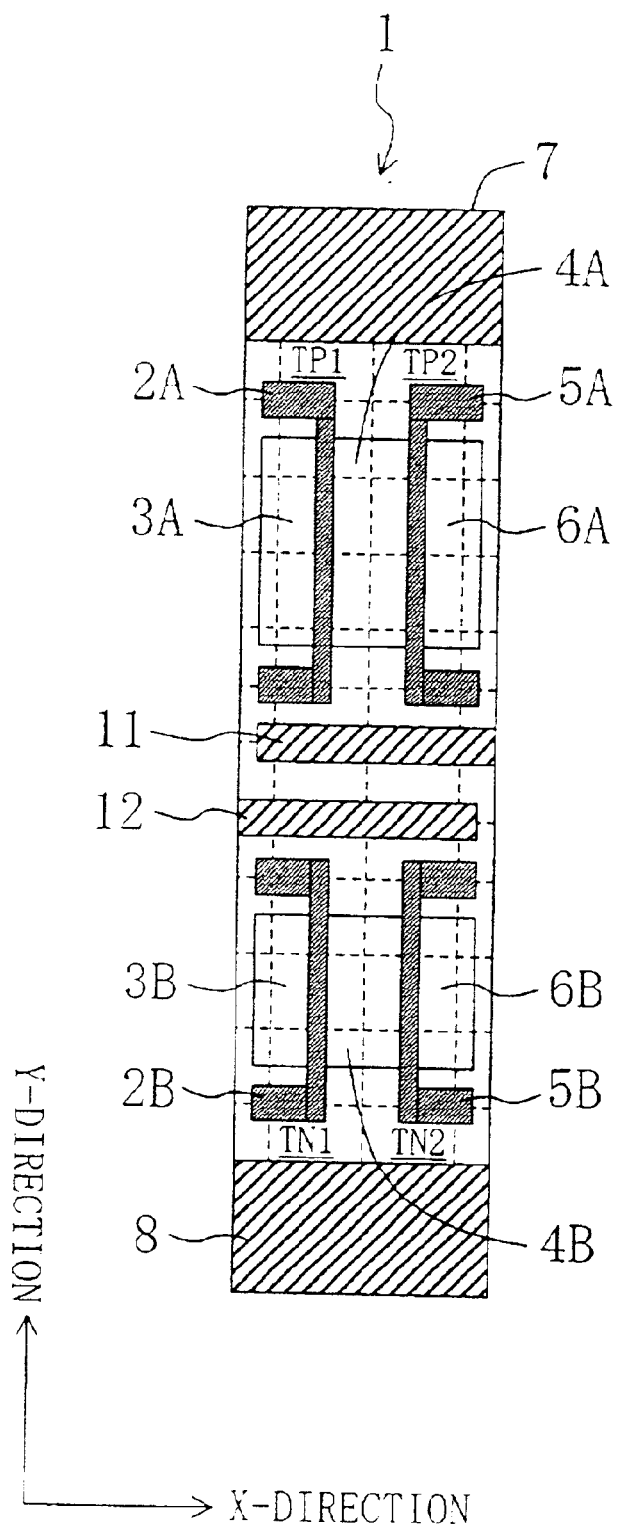
FIG. 16 is a layout diagram of a CMOS basic cell according to Embodiment 3 of the invention.

FIG. 16 shows the structure of a CMOS basic cell according to Embodiment 3 of the invention. The circuit diagram of this basic cell is the same as that shown in FIG. 1B. In FIG. 16, like reference numerals TP1, TP2, TN1, TN2, 1, 7, 8, 2A through 6A and 2B through 6B are used to refer to like elements used in the conventional basic cell of FIG. 30, so that the detailed description can be omitted.

The basic cell 1 of this embodiment includes two interconnect patterns 11 and 12 extending in a direction parallel to a boundary between the N-channel transistor region and the P-channel transistor region. The interconnect patterns 11 and 12 are independent of the N-channel and P-channel transistor regions, and the interconnect pattern 11 extends to the right edge of the basic cell 1 so as to be connected to an interconnect pattern 11 of another basic cell (not shown) adjacent on the right hand side in the drawing. Also, the interconnect pattern 12 extends to the left edge of the basic cell 1 so as to be connected to an interconnect pattern 12 of another basic cell (not shown) adjacent on the left hand side in the drawing. Specifically, other basic cells adjacent to this basic cell 1 on the right and left hand sides, which are not shown, also have the two interconnect patterns 11 and 12 similarly to the basic cell 1 of FIG. 16, and the adjacent basic cells are different from the basic cell 1 of FIG. 16 in the interconnect pattern 11 extending to the left edge differently from that of FIG. 16 and the interconnect pattern 12 extending to the right edge differently from that of FIG. 16.

Although the two interconnect patterns 11 and 12 are shown in FIG. 16, it goes without saying that the number of the interconnect patterns can be one, three or more.

Figure 17:
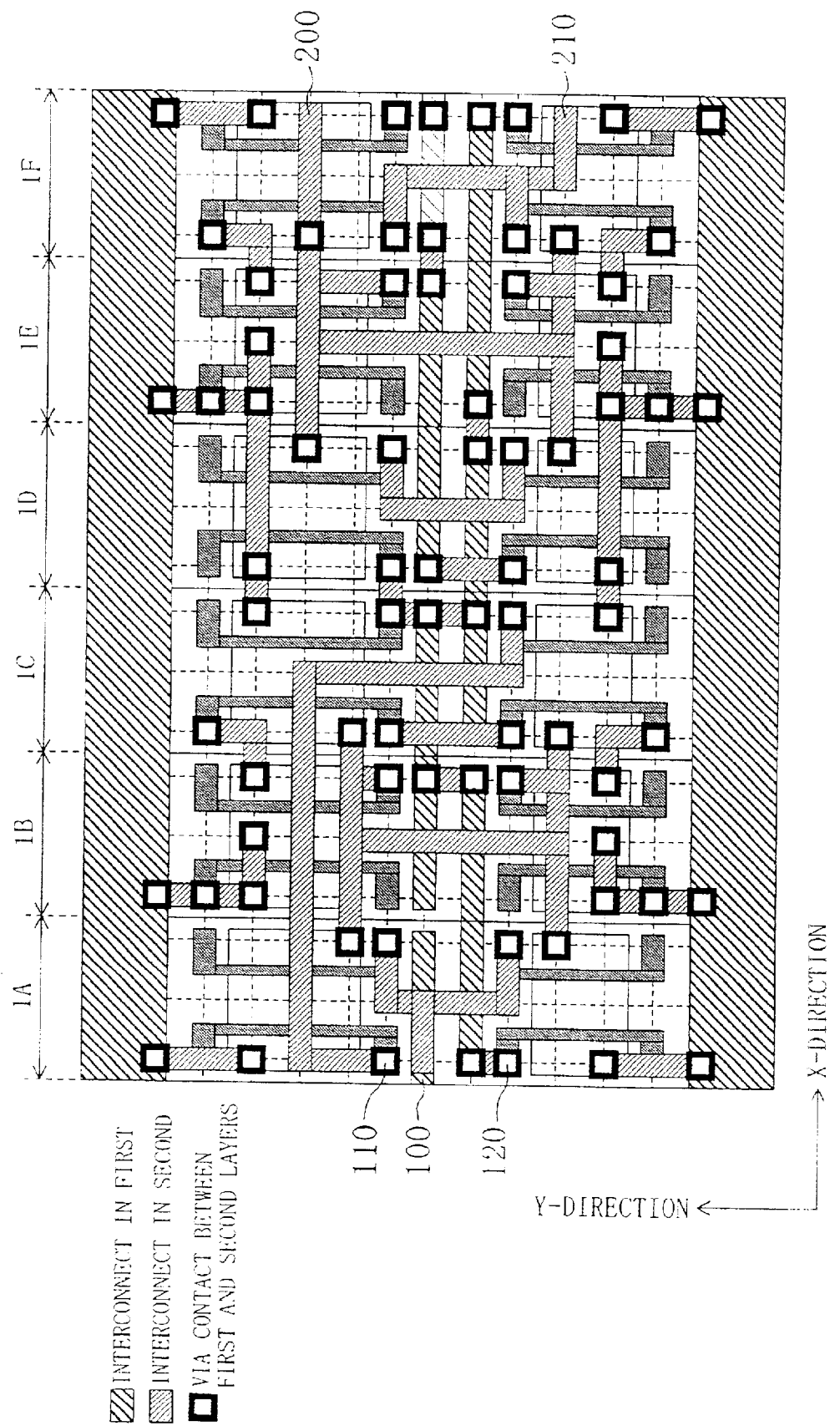
FIG. 17 is a layout wiring diagram of a DFF using the basic cell of FIG. 16.

FIG. 17 shows a layout structure obtained in fabricating the DFF circuit of FIG. 2A. The layout structure of FIG. 17 is obtained in fabricating the DFF circuit by arranging a plurality of basic cells 1 of FIG. 16 on a semiconductor substrate, and like reference numerals are used to refer to like elements shown in FIG. 2B so as to omit the detailed description. In FIG. 17, the basic cells 1A through 1F are arranged along the X-direction, and the interconnect patterns 11 and 12 of the basic cells 1 are effectively used so as to realize the DFF circuit of FIG. 2A by using the second interconnect layer alone.

Figure 18:
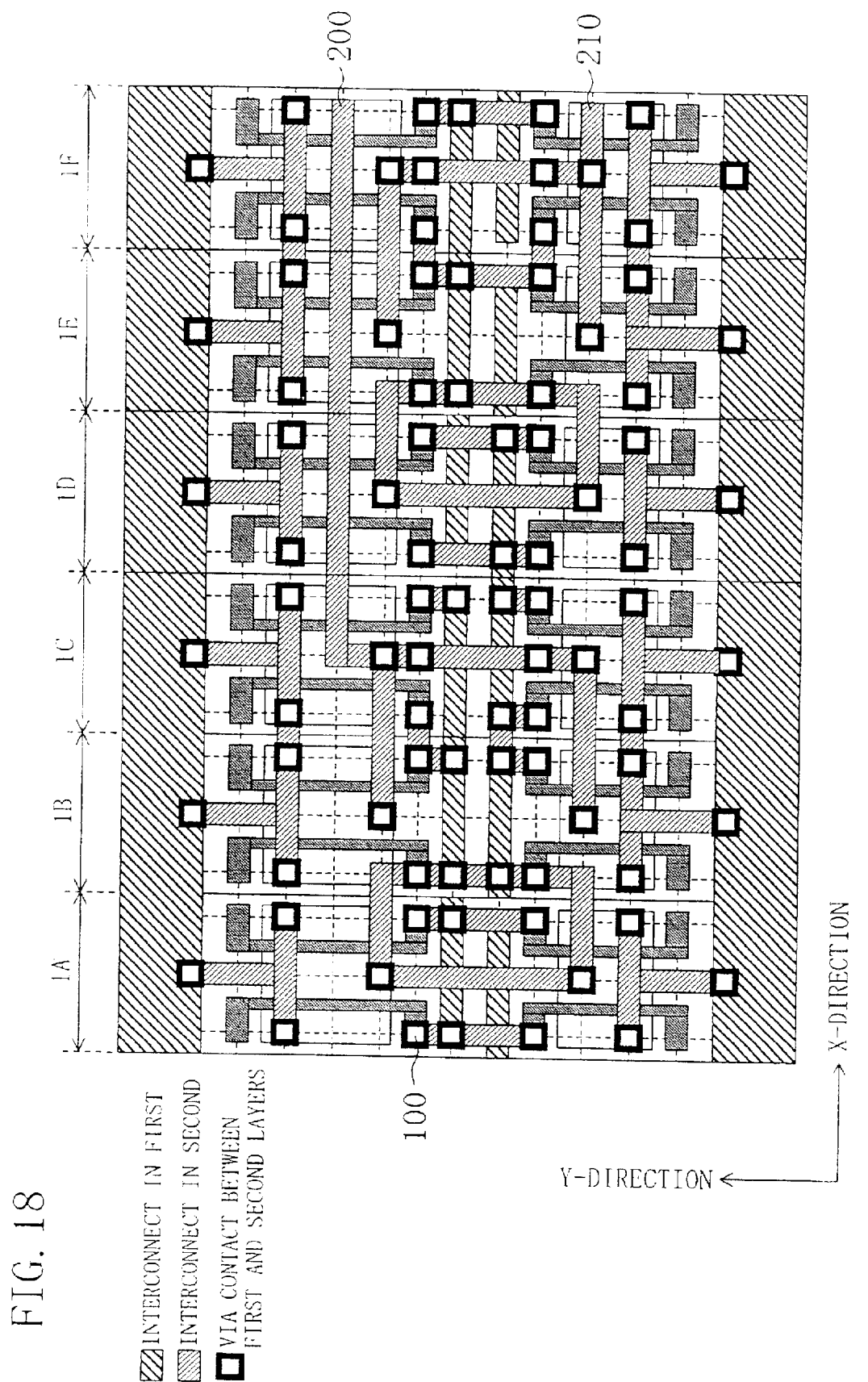
FIG. 18 is a layout wiring diagram of a buffer using the basic cell of FIG. 16.

FIG. 18 shows a layout structure obtained in fabricating the buffer circuit of FIG. 4A. The layout structure of FIG. 18 is obtained in fabricating the buffer circuit by arranging a plurality of basic cells 1 of FIG. 16 on a semiconductor substrate, and like reference numerals are used to refer to like elements shown in FIG. 4B so as to omit the detailed description. In FIG. 18, the basic cells 1A through 1F are arranged along the X-direction, and the interconnect patterns 11 and 12 of the basic cells 1 are effectively used so as to realize the buffer circuit of FIG. 4A by using the second interconnect layer alone.

Figure 19A:
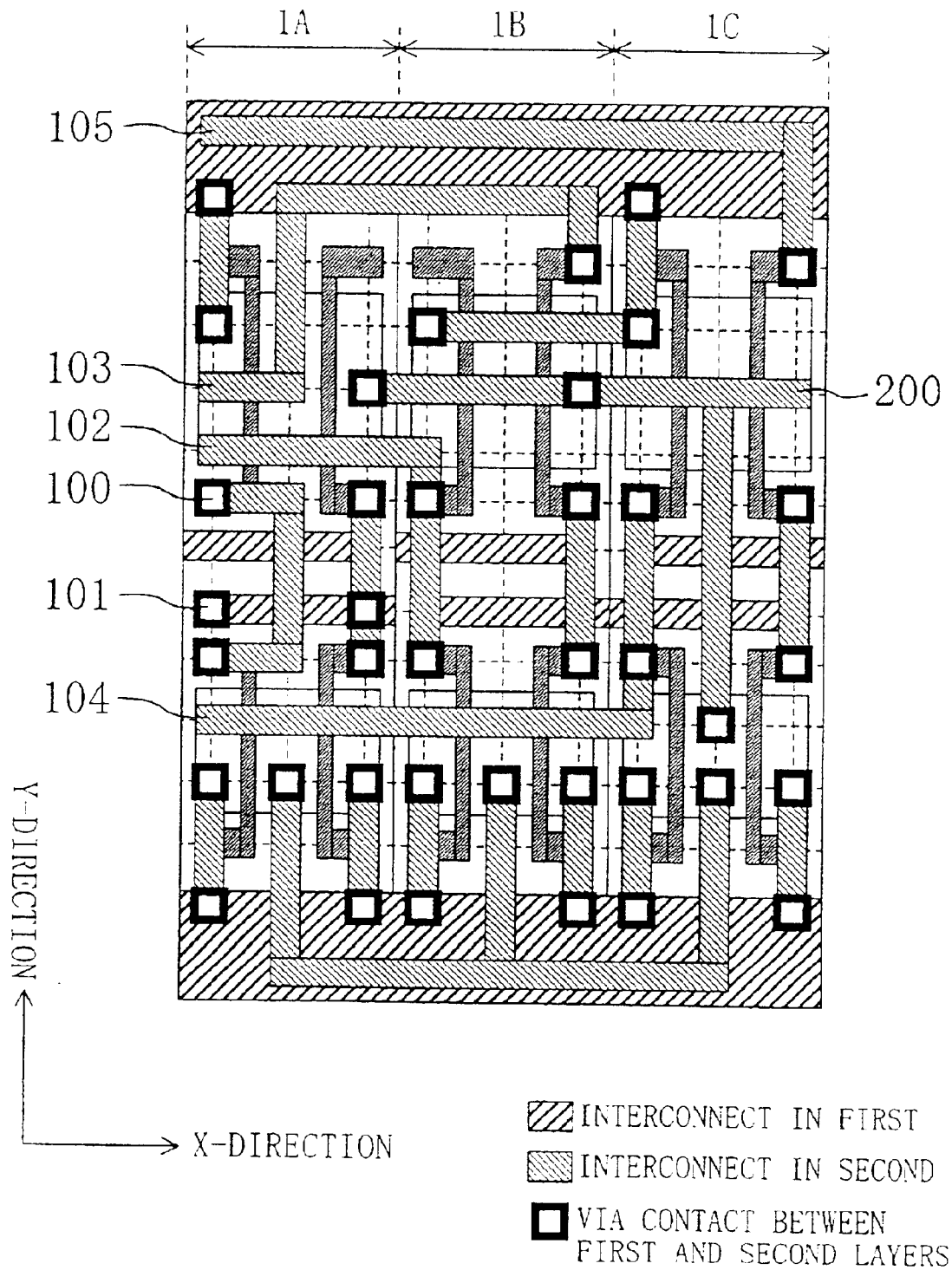
FIG. 19A is a layout wiring diagram of an ORNAND using the basic cell of FIG. 16

FIG. 19A shows a layout structure obtained in fabricating the ORNAND circuit of FIG. 6A. The layout structure of FIG. 19A is obtained in fabricating the ORNAND circuit by arranging a plurality of basic cells 1 of FIG. 16 on a semiconductor substrate, and like reference numerals are used to refer to like elements shown in FIG. 6B so as to omit the detailed description. In FIG. 19A, the basic cells 1A through 1C are arranged along the X-direction, and the interconnect patterns 11 and 12 of the basic cells 1 are effectively used so as to realize the ORNAND circuit of FIG. 6A by using the second interconnect layer alone.

Figure 19B:
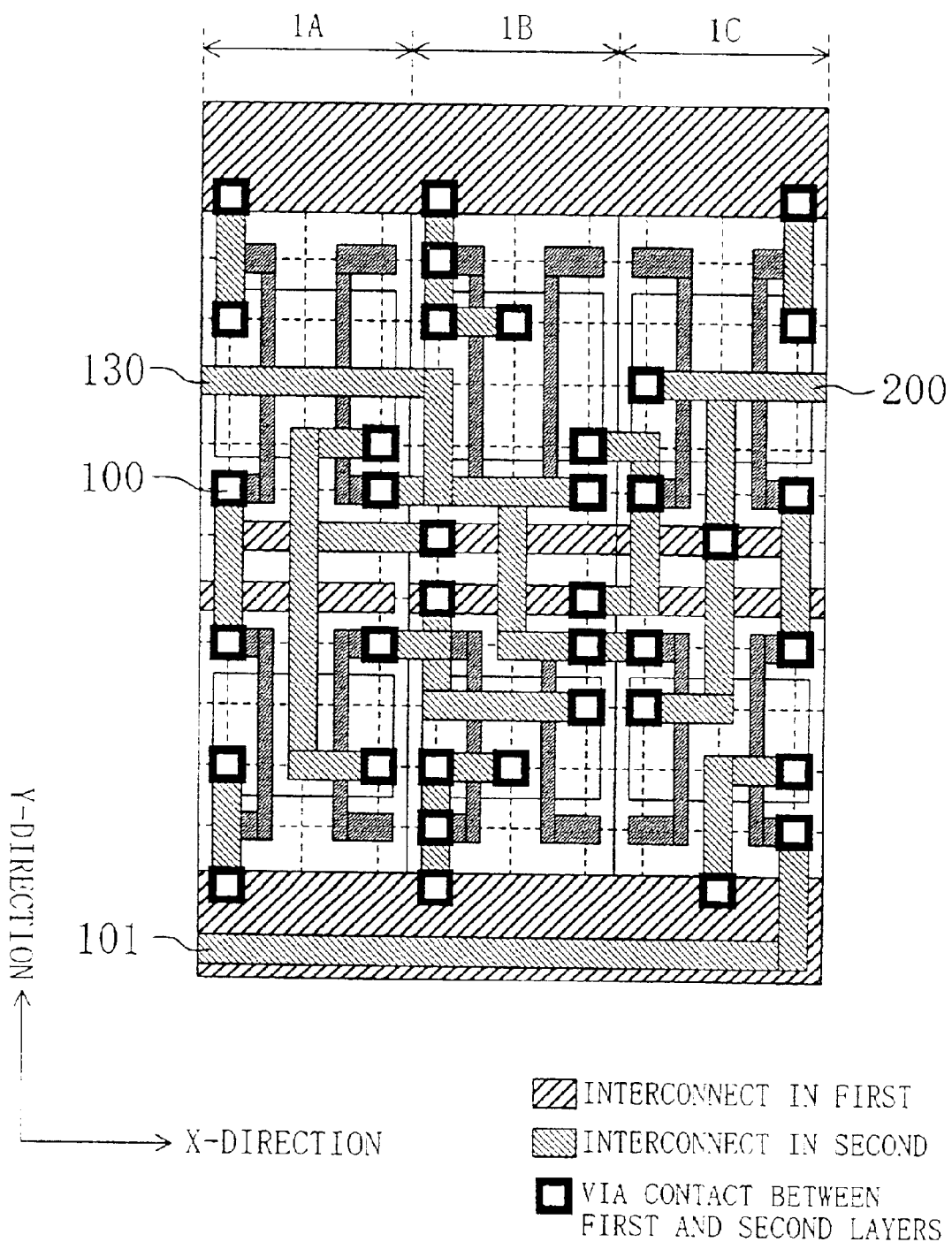
FIG. 19B is a layout wiring diagram of a selector using the basic cell of FIG. 16.

FIG. 19B shows a layout structure obtained in fabricating the selector circuit of FIG. 8A. The layout structure of FIG. 19B is obtained in fabricating the selector circuit by arranging a plurality of basic cells 1 of FIG. 16 on a semiconductor substrate, and like reference numerals are used to refer to like elements shown in FIG. 8B so as to omit the detailed description. In FIG. 19B, the basic cells 1A through 1C are arranged along the X-direction, and the interconnect patterns 11 and 12 of the basic cells 1 are effectively used so as to realize the selector circuit of FIG. 8A by using the second interconnect layer alone.

Figure 20A:
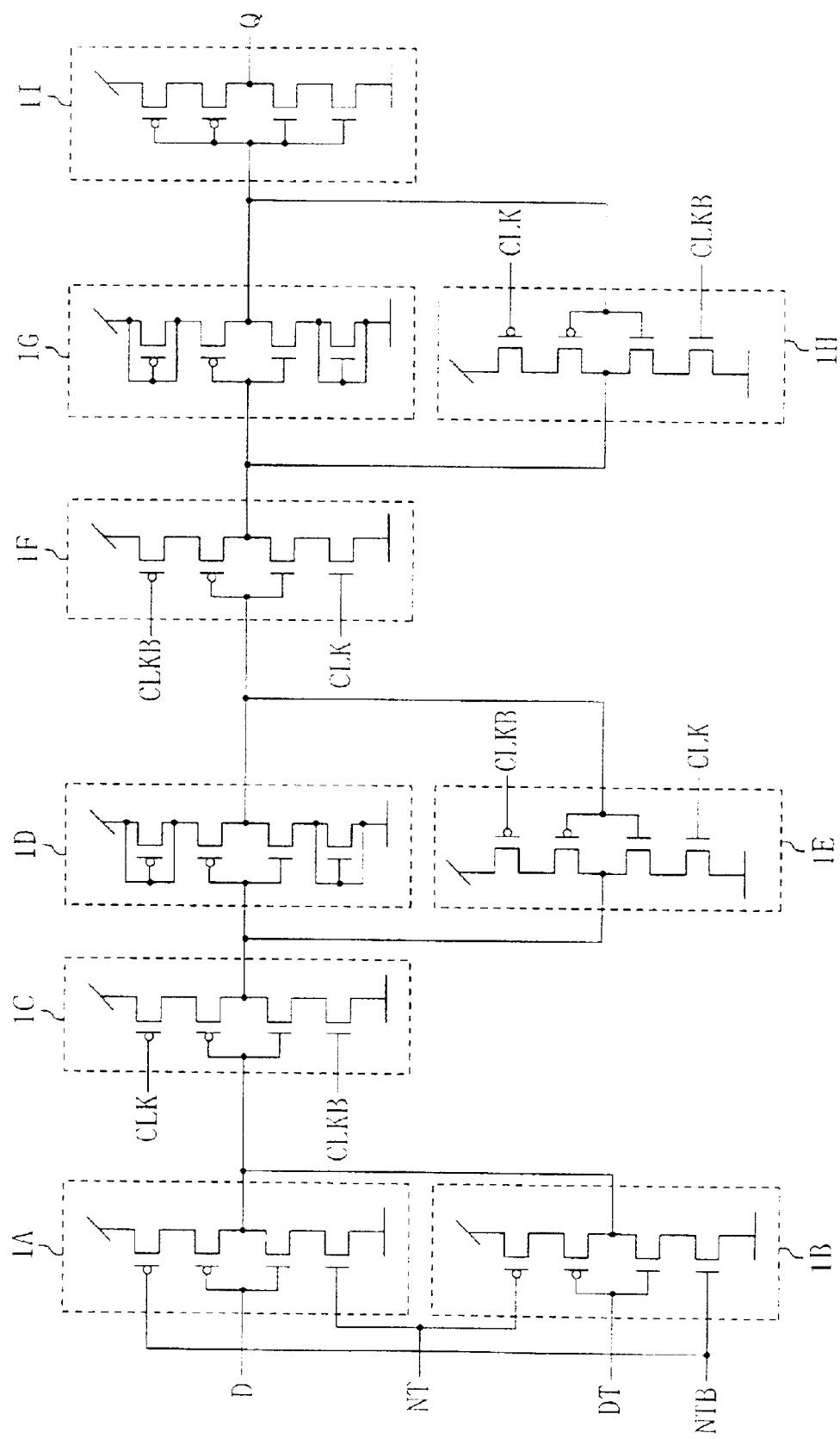
FIG. 20A is a circuit diagram of a D flip-flop circuit having a scanning function constructed by using the basic cell of FIG. 16.
Figure 20B:
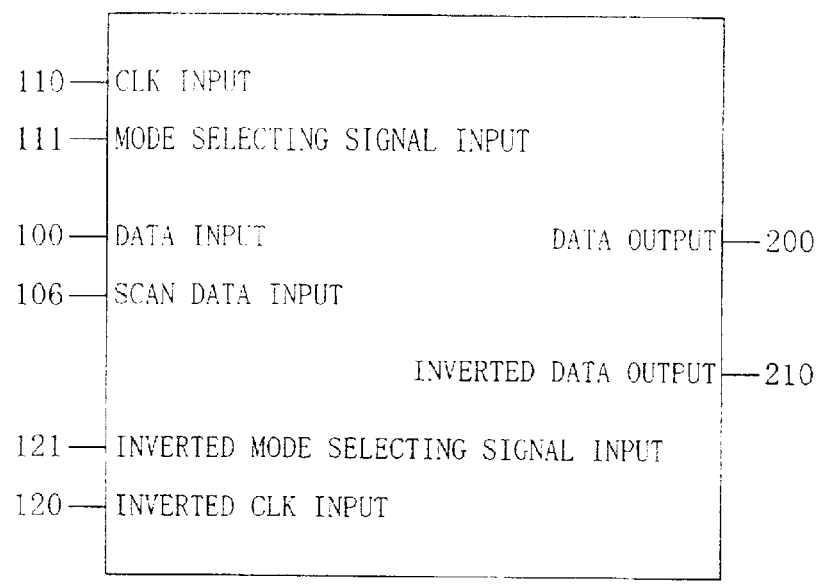
FIG. 20B is a symbol diagram of the D flip-flop circuit.
Figure 20C:
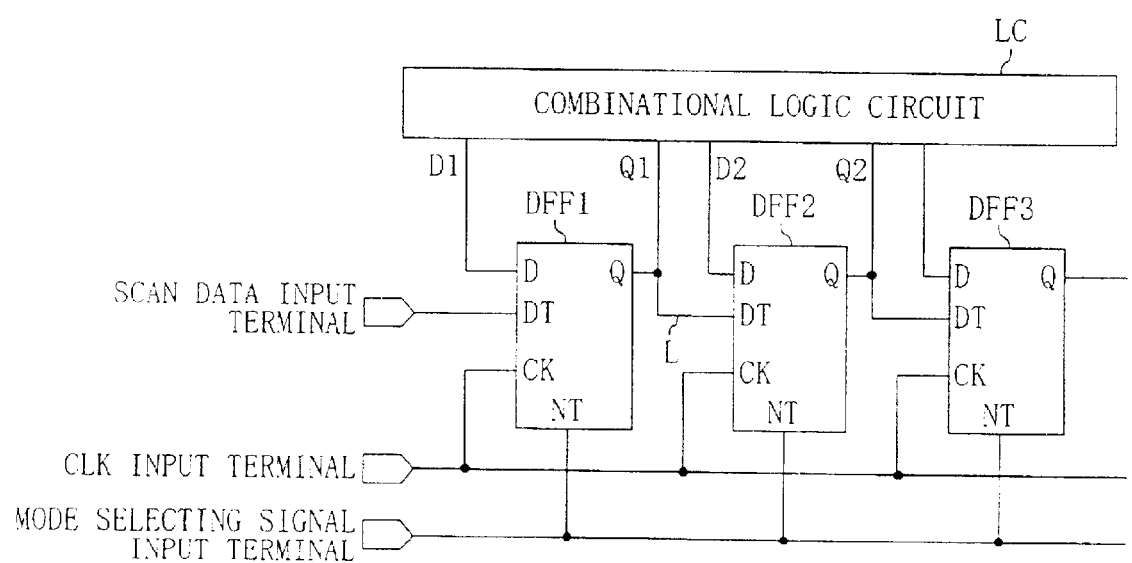
FIG. 20C is a block diagram of a logic circuit using the D flip-flop circuit.
Figure 20D:
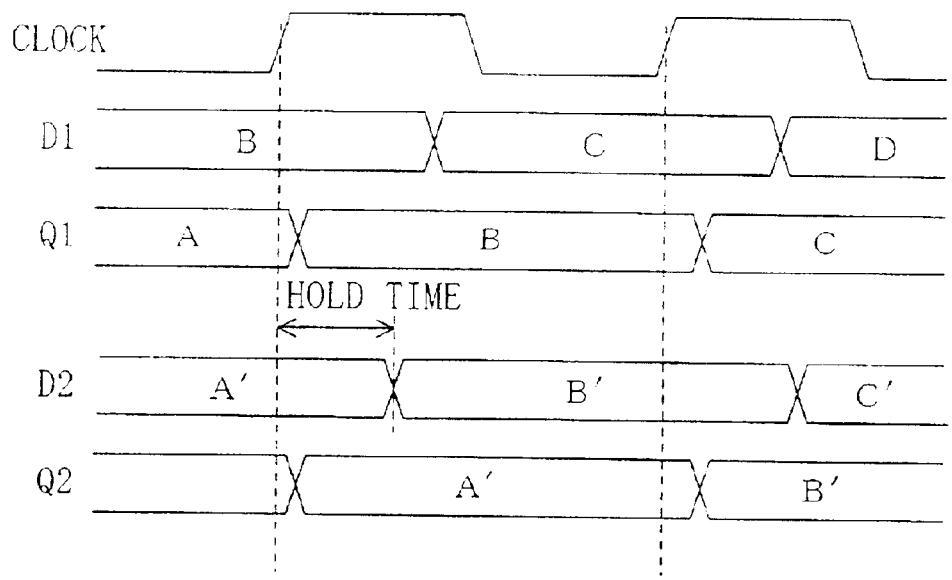
FIG. 20D is an operation timing chart of a general operation of the logic circuit.
Figure 20E:
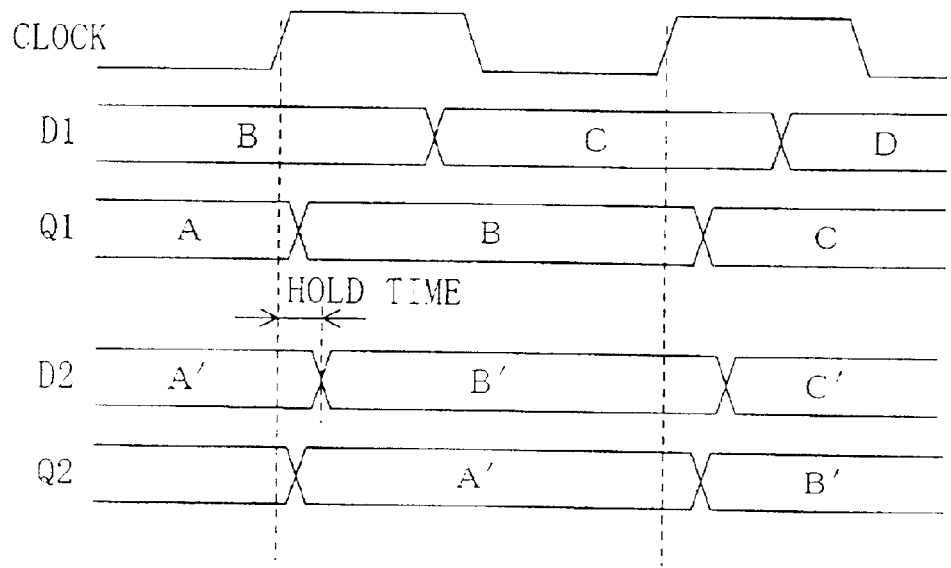
FIG. 20E is an operation timing chart of a scan operation of the logic circuit.
Figure 20F:
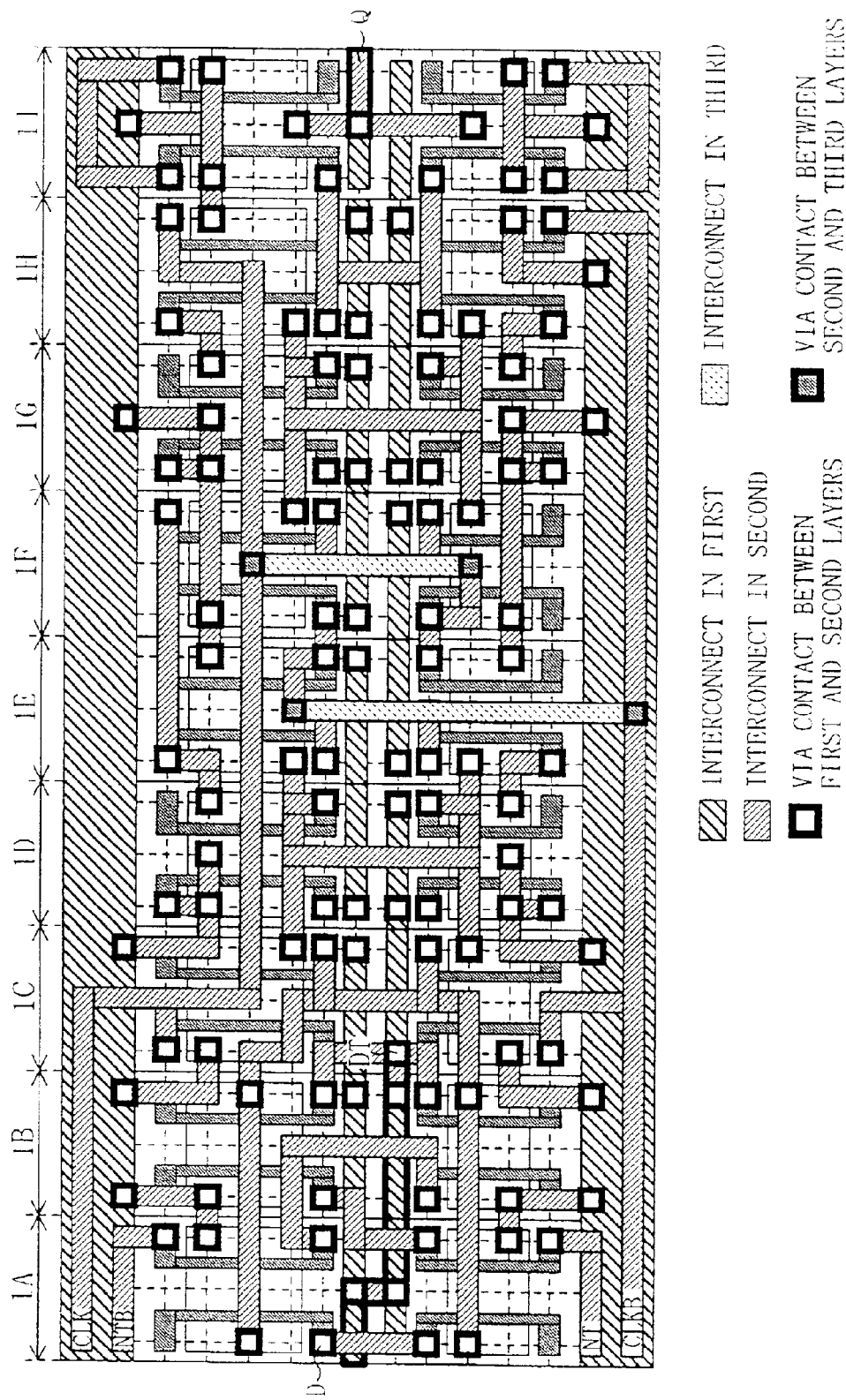
FIG. 20F is a diagram for showing an example of the layout wiring of a D flip-flop circuit having a scanning function using the basic cell of FIG. 16.
Figure 20G:
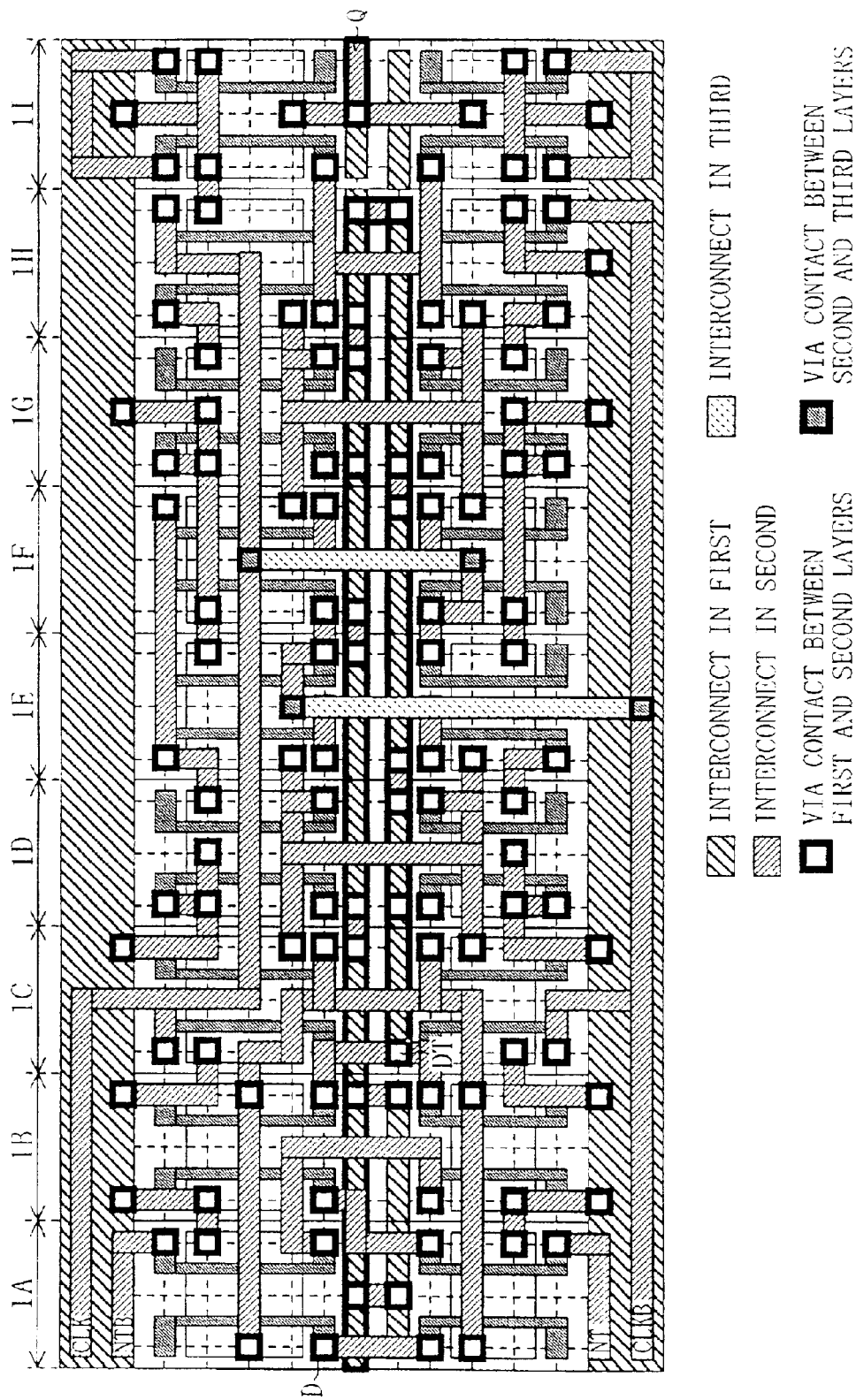
FIG. 20G is a diagram for showing another example of the layout wiring.
Figure 20H:
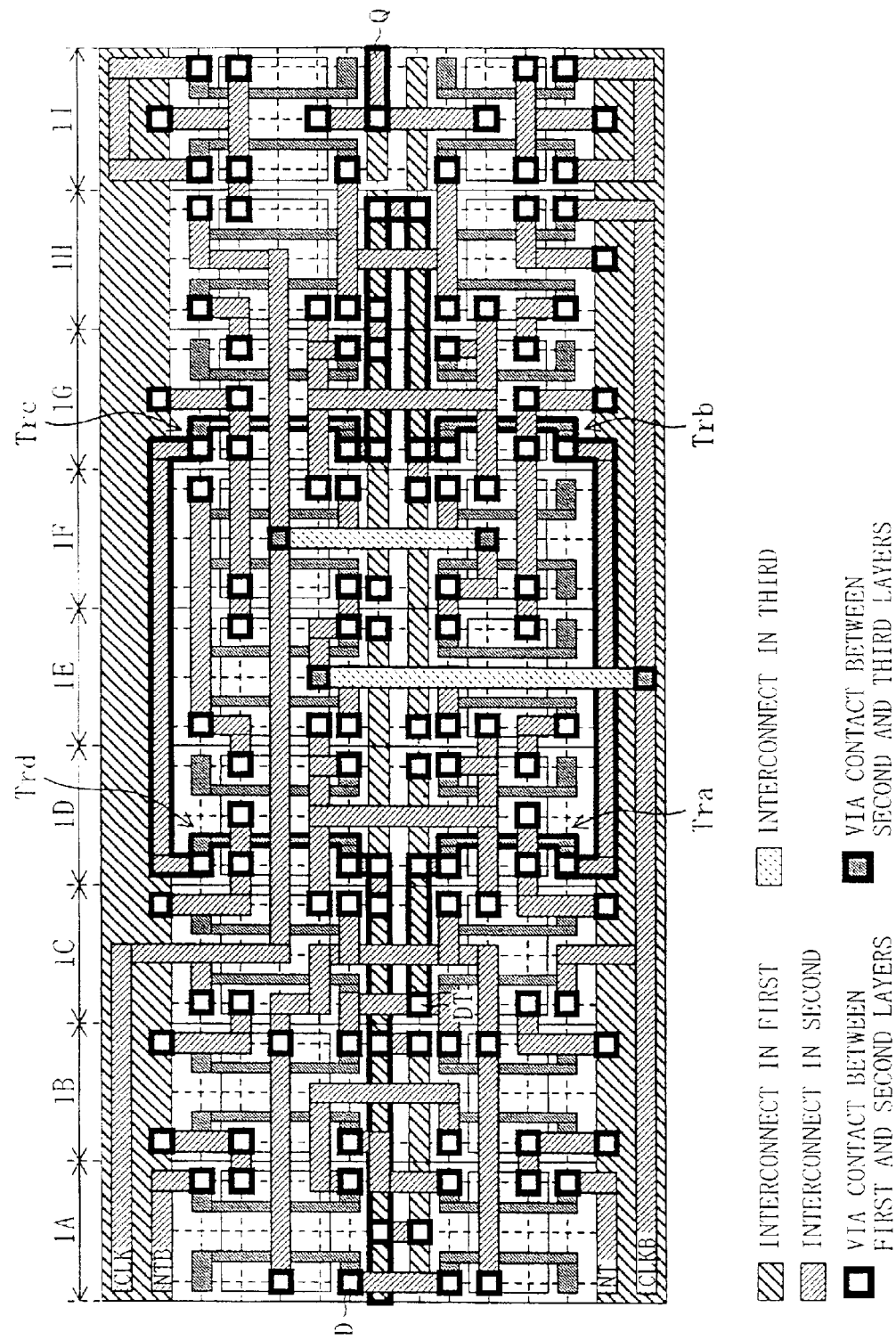
FIG. 20H is a diagram for showing still another example of the layout wiring.

FIG. 20A shows an example of a D flip-flop circuit having a scanning function, FIG. 20B is a symbol diagram of the circuit of FIG. 20A, FIG. 20C shows an example of the structure of a semiconductor integrated circuit including three circuits of FIG. 20A, FIG. 20D is a timing chart of a general operation of the semiconductor integrated circuit, and FIG. 20E is a timing chart of a scan operation of the semiconductor integrated circuit. FIGS. 20F through 20H show layout structures of the D flip-flop circuit having a scanning function of FIG. 20A. Each of the layout structures is obtained by arranging a plurality of basic cells 1 of FIG. 16 on a semiconductor substrate. In FIGS. 20F through 20H, like reference numerals are used to refer to like elements shown in FIG. 20B so as to omit the detailed description. FIG. 20F shows an example of the layout where an interconnect shown with a thick line extending to a scan data input terminal DT has the minimum length, FIG. 20G shows an example of the layout where the interconnect shown with a thick line extending to the scan data input terminal DT has a larger length, and FIG. 20H shows an example of the layout where polysilicon gates of four idle transistors Tra through Trd are disposed on the interconnects shown with the thick lines extending to the scan data input terminals DT so as to increase the line delay time as compared with that in the layout of FIG. 20G. In any of the layouts of FIGS. 20F through 20H, the basic cells 1A through 11 of FIG. 16 are arranged along the horizontal direction, and the interconnect patterns 11 and 12 of the basic cells 1 are effectively used so as to adjust the line delay by using the second interconnect layer alone.

Embodiments 4 and 5

Figure 21:
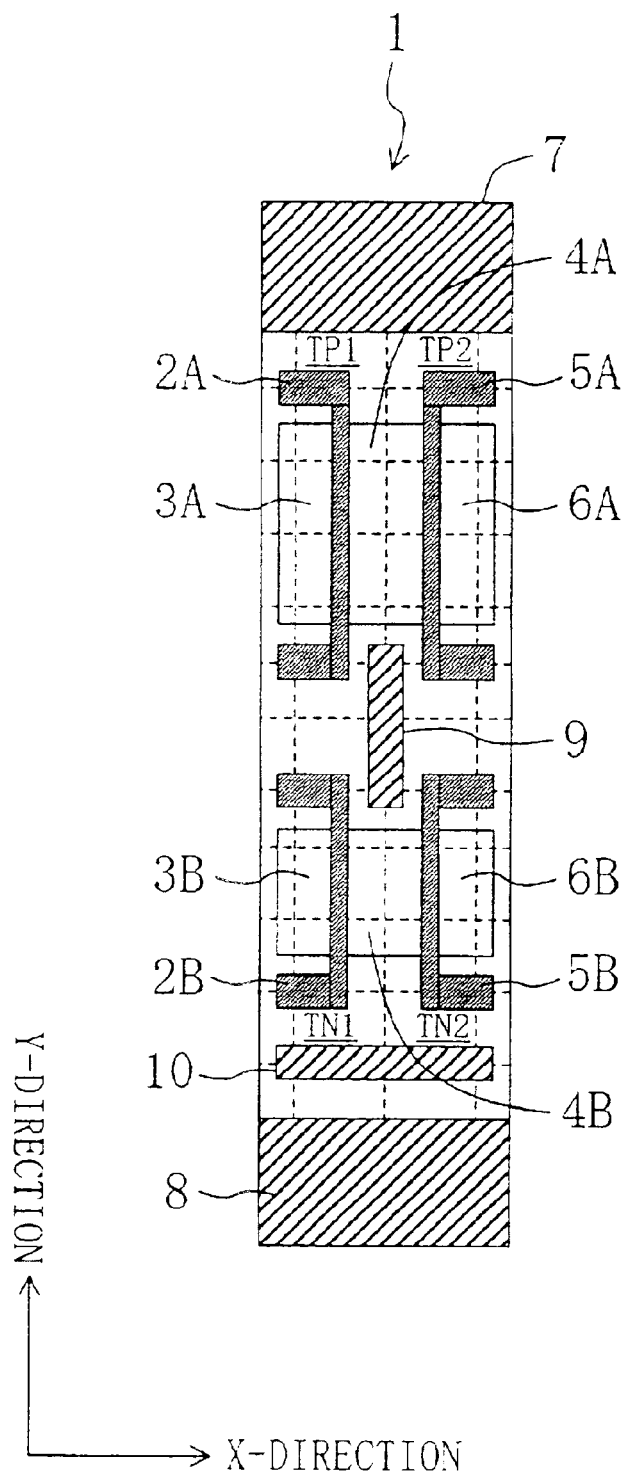
FIG. 21 is a layout diagram of a CMOS basic cell according to Embodiment 4 of the invention.

FIG. 21 shows the structure of a CMOS basic cell 1 according to Embodiment 4 of the invention. The circuit diagram of this basic cell is omitted because it is the same as that shown in FIG. 1B. Also, in FIG. 21, like reference numerals TP1, TP2, TN1, TN2, 1, 7, 8, 2A through 6A and 2B through 6B are used to refer to like elements used in the conventional basic cell of FIG. 30, so that the detailed description can be omitted.

The basic cell 1 of FIG. 21 is obtained by combining the basic cell of FIG. 1A and the basic cell of FIG. 10. Specifically, an interconnect pattern 9 extending in the vertical direction is disposed between the P-channel transistor region and the N-channel transistor region, and an interconnect pattern 10 extending in the horizontal direction is disposed between the N-channel transistor region and the GND pattern 8.

Figure 22:
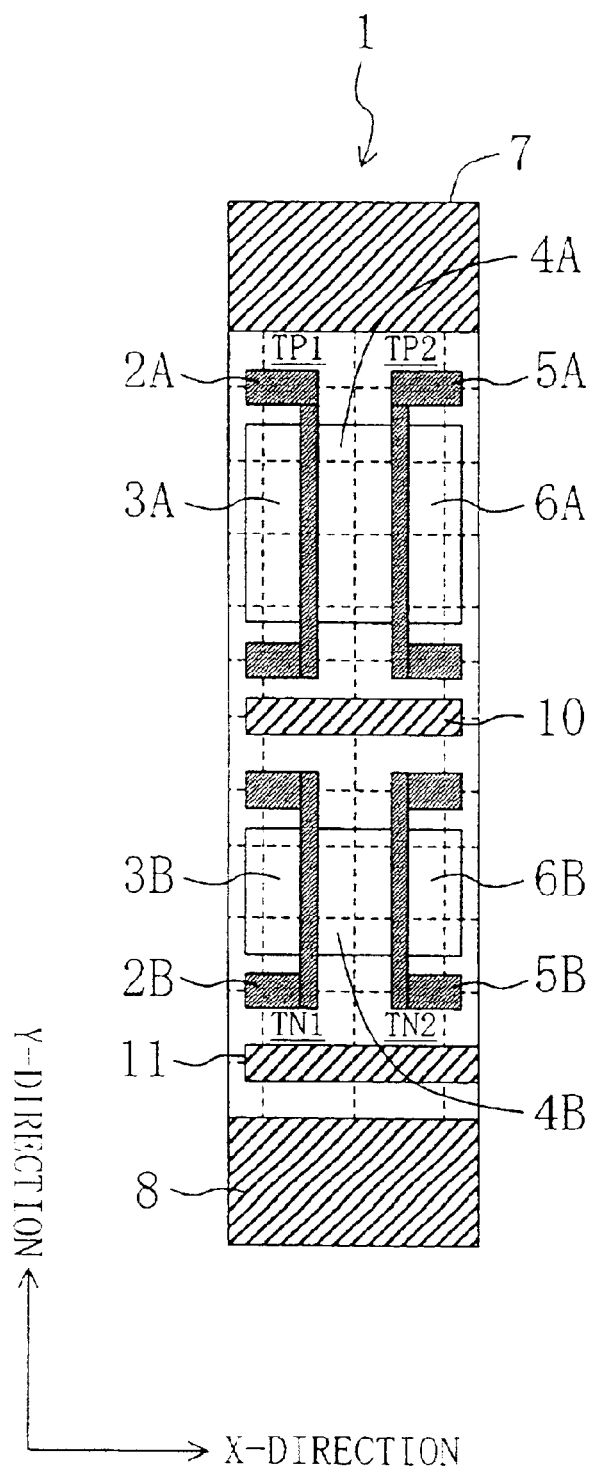
FIG. 22 is a layout diagram of a CMOS basic cell according to Embodiment 5 of the invention.

FIG. 22 shows the structure of a CMOS basic cell 1 according to Embodiment 5 of the invention. The basic cell 1 of FIG. 22 is obtained by combining the basic cell of FIG. 10 and the basic cell of FIG. 16. Specifically, an interconnect pattern 10 independently extending in the horizontal direction is disposed between the P-channel transistor region and the N-channel transistor region, and an interconnect pattern 11 extending in the horizontal direction to the right edge is disposed between the N-channel transistor region and the GND pattern 8.

In this manner, according to the invention, the basic cell of FIG. 1A, the basic cell of FIG. 10 and the basic cell of FIG. 16 can be flexibly combined. For example, in addition to the basic cells shown in FIGS. 21 and 22, it goes without saying that the interconnect pattern 9 extending in the vertical direction in the basic cell of FIG. 22 may be replaced with the interconnect pattern 10 extending in the horizontal direction. Alternatively, a basic cell may be provided with the interconnect pattern 9 of FIG. 1A, the interconnect pattern 10 of FIG. 10 and the interconnect pattern 11 and/or the interconnect pattern 12 of FIG. 16.

Although the number of interconnect patterns 9, 10 and 11 provided in each of the basic cells of FIGS. 21 and 22 is one each, the number of each interconnect pattern can be two or more.

Figure 23:
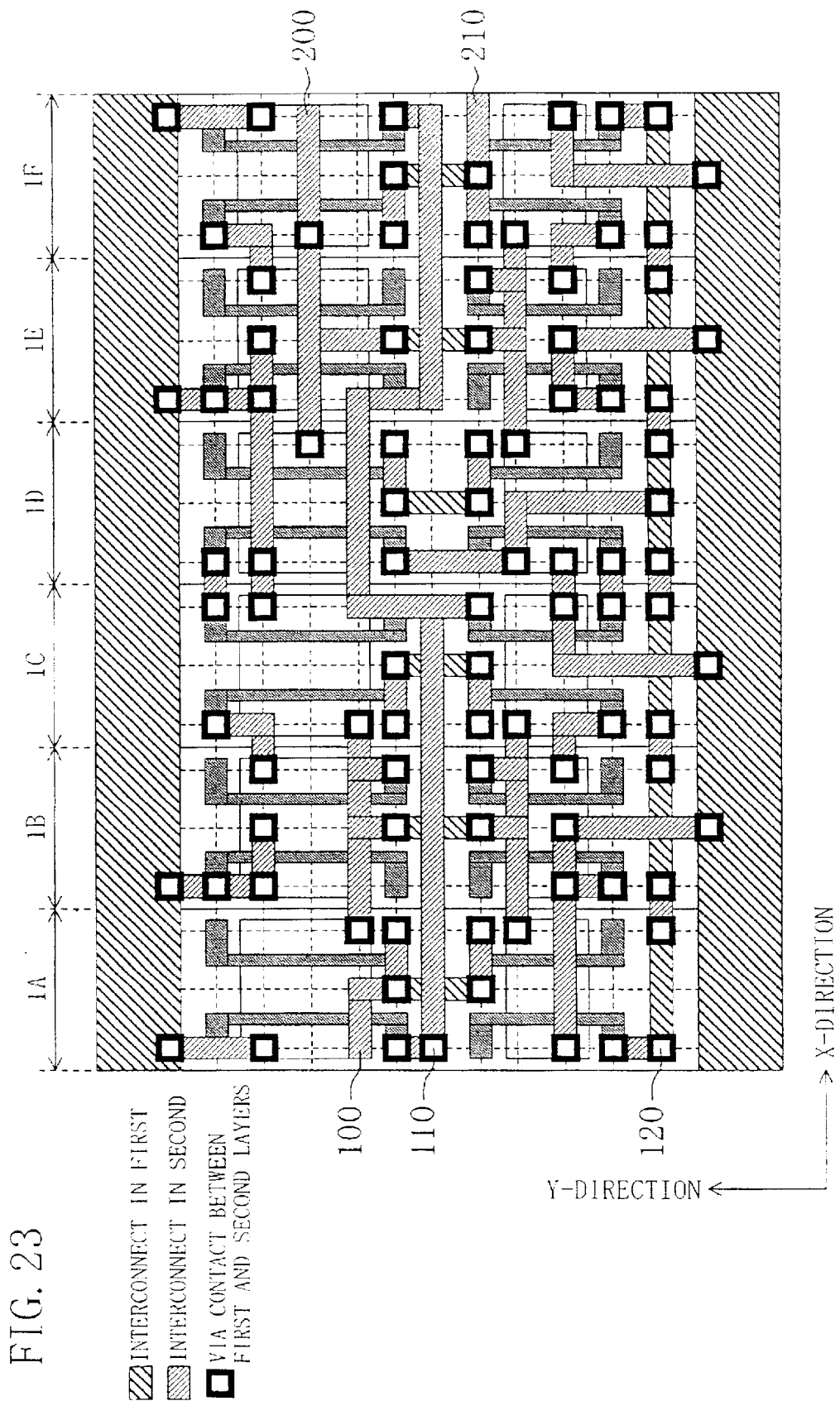
FIG. 23 is a layout wiring diagram of a DFF using the basic cell of FIG. 21.

FIG. 23 shows a layout structure obtained in fabricating the DFF circuit of FIG. 2A. The layout structure of FIG. 23 is obtained in fabricating the DFF circuit by arranging a plurality of basic cells 1 of FIG. 21 on a semiconductor substrate, and like reference numerals are used to refer to like elements shown in FIG. 2B so as to omit the detailed description. In FIG. 23, the basic cells 1A through 1F of FIG. 21 are arranged along the X-direction, and the interconnect patterns 9 and 10 of the basic cells 1 are effectively used so as to realize the DFF circuit of FIG. 2A by using the second interconnect layer alone.

Figure 24:
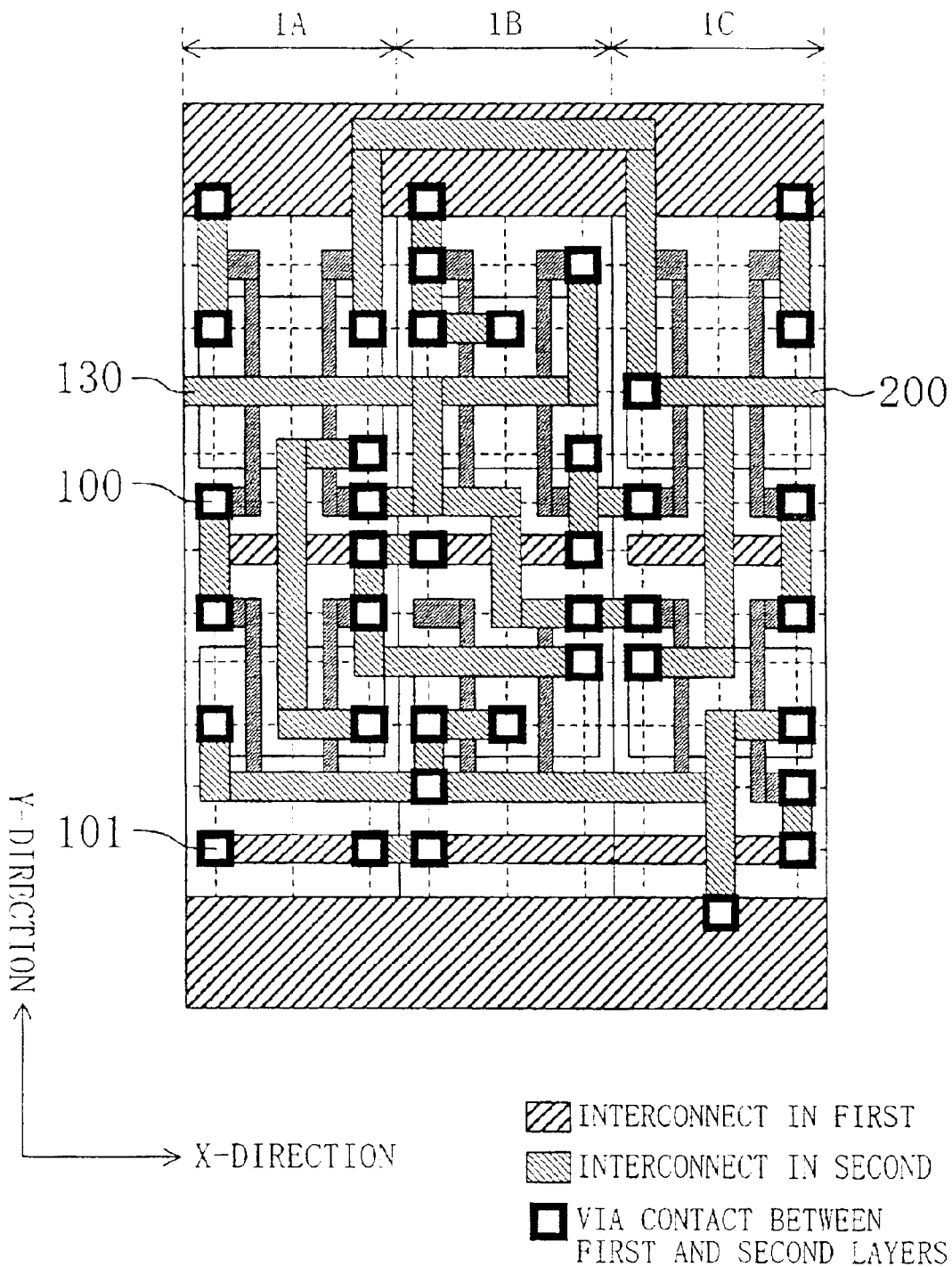
FIG. 24 is a layout wiring diagram of a selector using the basic cell of FIG. 22.
Figure 25:
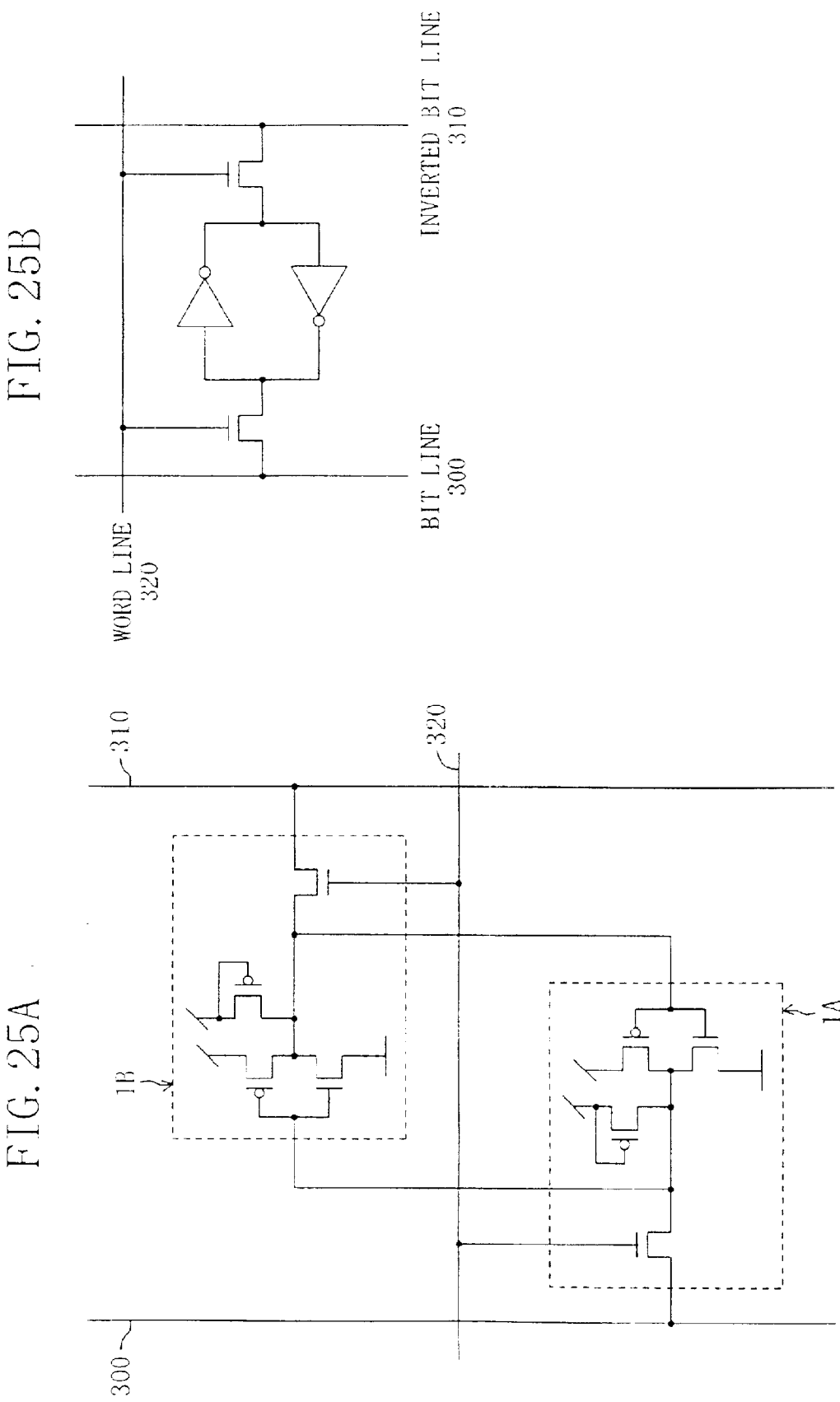
FIG. 25A is a circuit diagram of an SRAM constructed by using the basic cell and FIG. 25B is a symbol diagram of the SRAM.

FIG. 24 shows a layout structure obtained in fabricating the selector circuit of FIG. 8A. The layout structure of FIG. 24 is obtained in fabricating the selector circuit by arranging a plurality of basic cells 1 of FIG. 22 on a semiconductor substrate, and like reference numerals are used to refer to like elements shown in FIG. 8B so as to omit the detailed description. In FIG. 24, the basic cells LA through 1C of FIG. 22 are arranged along the X-direction, and the interconnect patterns 10 and 11 of the basic cells 1 are effectively used so as to realize the selector circuit of FIG. 8A by using the second interconnect layer alone.

Figure 26:
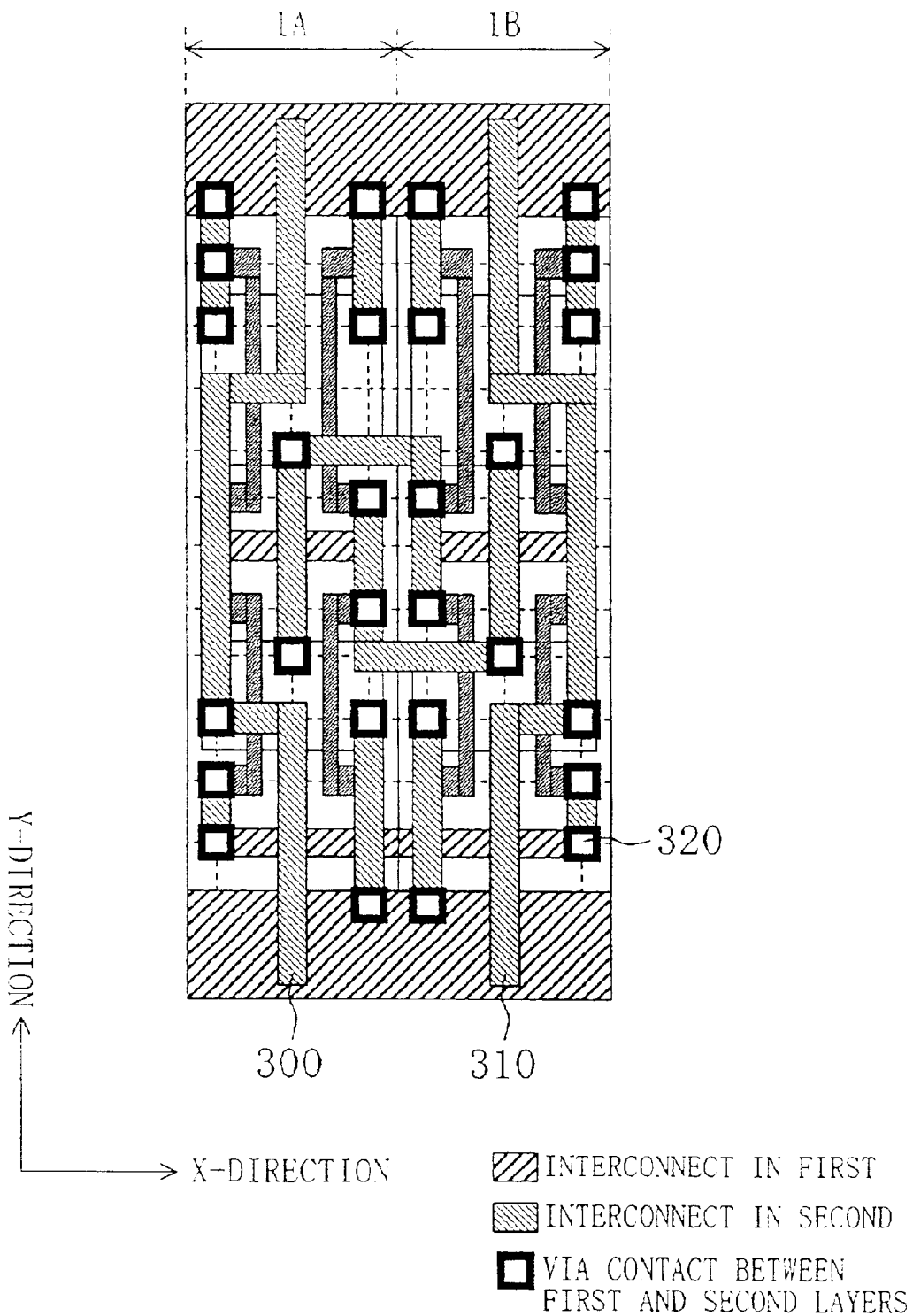
FIG. 26 is a layout wiring diagram of an SRAM using the basic cell of FIG. 22.

FIG. 26 shows a layout structure obtained in fabricating the SRAM circuit of FIG. 25A. The layout structure of FIG. 26 is obtained in fabricating the SRAM circuit by arranging a plurality of basic cells 1 of FIG. 22 on a semiconductor substrate, and a reference numeral 300 denotes a bit line, a reference numeral 310 denotes an inverted bit line and a reference numeral 320 denotes a word line as in a symbol diagram of the SRAM circuit shown in FIG. 25B. In FIG. 26, the basic cells 1A and 1B are arranged along the X-direction, and the interconnect patterns 10 and 11 of the basic cells 1 are effectively used so as to realize the SRAM circuit of FIG. 25A by using the second interconnect layer alone.

Embodiment 6

Figure 28B:
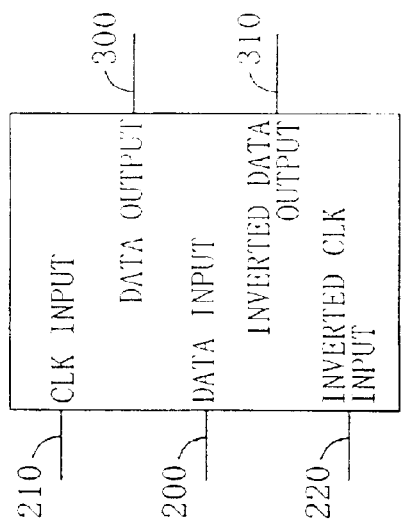
FIG. 28B is a symbol diagram of the D flip-flop circuit and FIG. 28C is an operation timing chart of the D flip-flop circuit.
Figure 28C:
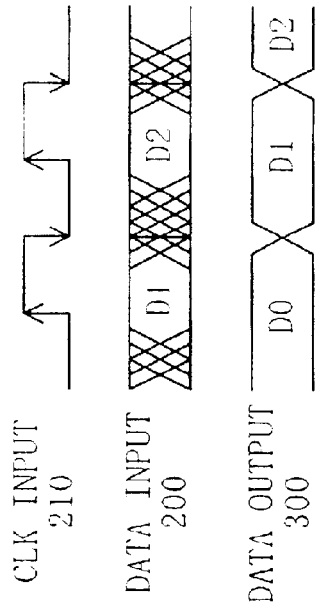

A CMOS basic cell and a method for fabricating a semiconductor integrated circuit using the basic cell according to Embodiment 6 of the invention will now be described with reference to FIGS. 27 through 29.

FIG. 27A shows the structure of the CMOS basic cell of this embodiment and FIG. 27B is an equivalent circuit diagram of the basic cell.

In FIG. 27A, a reference numeral 120 denotes a basic cell composed of four transistors TP1, TP2, TN1 and TN2 formed on a semiconductor substrate 121. In designing a semiconductor integrated circuit such as a logic cell, other basic cells having the same configuration as the basic cell 120 are arranged on the left and right hand sides, in the drawing, of the basic cell 120.

In the basic cell 120, the two P-channel transistors TP1 and TP2 are isolated from the two N-channel transistors TN1 and TN2 by an insulating film (not shown). The first P-channel transistor TP1 includes a gate electrode 101 and dopant diffusion regions 102 and 103 formed on both sides of the gate electrode 101. The dopant diffusion regions 102 and 103 work as the source and the drain. The second P-channel transistor TP2 is disposed on the right hand side, in the drawing, of the first P-channel transistor TP1. The transistor TP2 includes a gate electrode 104, a dopant diffusion region 105 formed on the right side, in the drawing, of the gate electrode 104 and the dopant diffusion region (shared diffusion region) 103 shared with the first P-channel transistor TP1.

The first and second N-channel transistors TN1 and TN2 are formed below, in the drawing, the two P-channel transistors TP1 and TP2. The first N-channel transistor TN1 includes a gate electrode 107 and dopant diffusion regions 108 and 109 formed on both sides of the gate electrode 107. The dopant diffusion regions 108 and 109 work as the source and the drain. The second N-channel transistor TN2 includes a gate electrode 110, a dopant diffusion region 111 formed on the right side, in the drawing, of the gate electrode 110 and the dopant diffusion region (shared diffusion region) 109 shared with the first N-channel transistor TN1.

In the basic cell 120 of FIG. 27A, reference numerals 112 and 113 respectively denote a global power supply pattern and a global GND pattern provided in upper and lower portions by using the first interconnect layer. Also, broken lines drawn in the basic cell 120 denote wiring grids, and eleven wiring tracks are provided in the X (horizontal) direction and three wiring tracks v1, v2 and v3 are provided in the Y (vertical) direction.

Now, the characteristic structure of the basic cell 120 of FIG. 27A will be described. In the basic cell 120, the gate electrode 101 of the first P-channel transistor TP1 includes a base part 101a extending in the Y-direction, a first bent part 101b formed by bending the upper portion of the base part 101a to the right in the drawing, and a second bent part 101c formed by bending the lower portion of the base part 101a to the left in the drawing. Accordingly, the gate electrode 101 is in a hooked shape similar to "S" including the base part 101a provided with the first and second bent parts 101b and 101c at the upper and lower portions thereof. Similarly, the gate electrode 104 of the second P-channel transistor TP2 includes a base part 104a extending in the Y-direction, a first bent part 104b formed by bending the upper portion of the base part 104a to the right in the drawing and a second bent part 104c formed by bending the lower portion of the base part 104a to the left in the drawing. Accordingly, also the gate electrode 104 of the second P-channel transistor TP2 is in the hooked shape similar to "S" including the base part 104a provided with the first and second bent parts 104b and 104c at the upper and lower portions thereof.

The first bent part 101b of the first P-channel transistor TP1 and the second bent part 104c of the second P-channel transistor TP2 are disposed so that the tips thereof can be positioned on the center wiring track v2 extending in the Y-direction, namely, so that the bent parts can overlap when seen along the Y-direction from the position of the wiring track v2 in the X-direction.

Also, in the basic cell 120, the dopant diffusion region (first dedicated diffusion region) 102 of the first P-channel transistor TP1 has a first bent part 102a formed by bending the upper portion thereof to the left in the drawing. Similarly, the dopant diffusion region (second dedicated diffusion region) 105 of the second P-channel transistor TP2 includes a second bent part 105a formed by bending the lower portion thereof to the right in the drawing. Accordingly, the dopant diffusion regions 102, 103 and 105 of the first and second P-channel transistors TP1 and TP2 are together in a hooked shape similar to "Z" including the first and second bent parts 102a and 105a at the upper left portion and the lower right portion thereof.

The aforementioned characteristic structure is also applied to the first and second N-channel transistors TN1 and TN2. Specifically, the gate electrode 107 of the first N-channel transistor TN1 includes a base part 107a extending in the Y-direction, a first bent part 107b formed by bending the upper portion of the base part 107a to the left in the drawing, and a second bent part 107c formed by bending the lower portion to the right in the drawing. Accordingly, the gate electrode 107 of the first N-channel transistor TN1 is in a hooked shape similar to "Z" including the base part 107a provided with the first and second bent parts 107b and 107c at the upper and lower portions thereof. Similarly, the gate electrode 110 of the second N-channel transistor TN2 includes a base part 110a extending in the Y-direction, a first bent part 110b formed by bending the upper portion of the base part 110a to the left in the drawing and a second bent part 110c formed by bending the lower portion thereof to the right in the drawing. Accordingly, the gate electrode 110 of the second N-channel transistor TN2 is in a hooked shape similar to "Z" including the base part 110a provided with the first and second bent parts 110b and 110c at the upper and lower portions thereof. The second bent part 107c of the first N-channel transistor TN1 and the first bent part 110b of the second N-channel transistor TN2 are disposed so that the tips thereof can be positioned on the center wiring track v2 extending in the Y-direction, namely, so that the bent parts can overlap when seen along the Y-direction from the position of the wiring track v2 in the X-direction.

Furthermore, in the basic cell 120, the dopant diffusion region (first dedicated diffusion region) 111 of the second N-channel transistor TN2 has a first bent part 111a formed by bending the upper portion thereof to the right in the drawing. Similarly, the dopant diffusion region (second dedicated diffusion region) 108 of the first N-channel transistor TN1 has a second bent part 108a formed by bending the lower portion thereof to the left in the drawing. Accordingly, the dopant diffusion regions 108, 109 and 111 of the first and second N-channel transistors TN1 and TN2 together are in a hooked shape similar to "S" including the first and second bent parts 111a and 108a at the upper right portion and the lower left portion thereof.

Figure 28A:
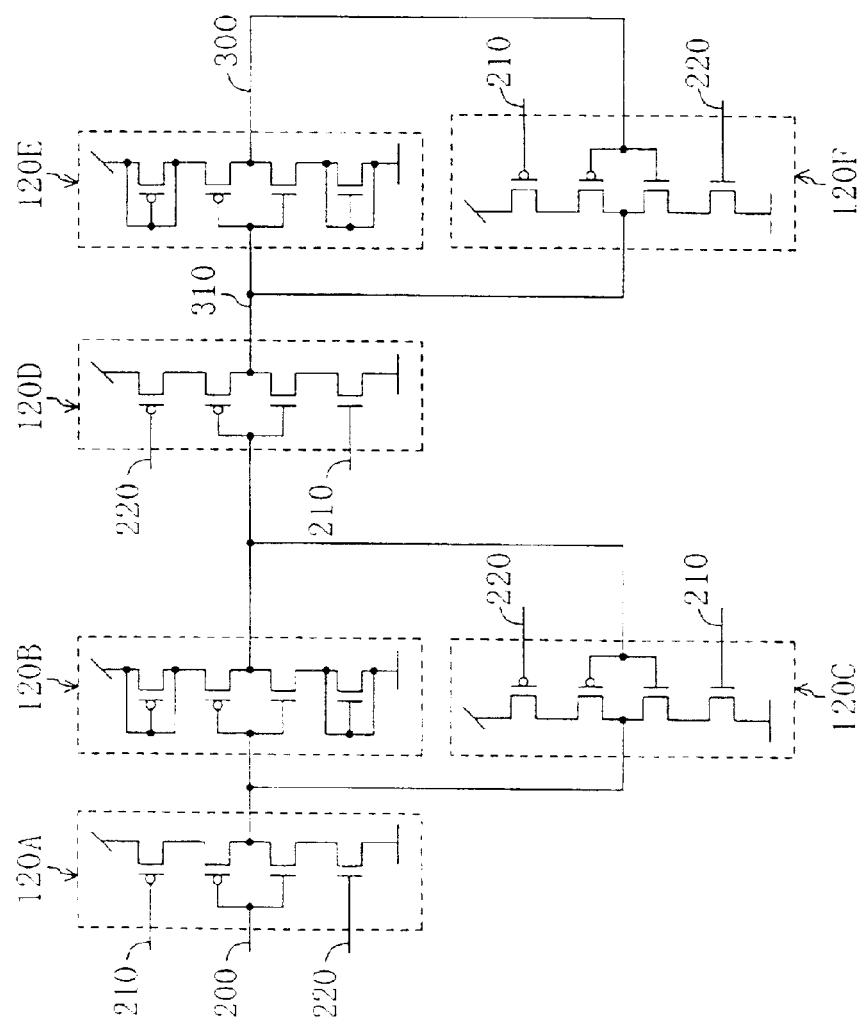
FIG. 28A is a circuit diagram of a D flip-flop circuit constructed by using the basic cell of FIG. 27A.
Figure 29:
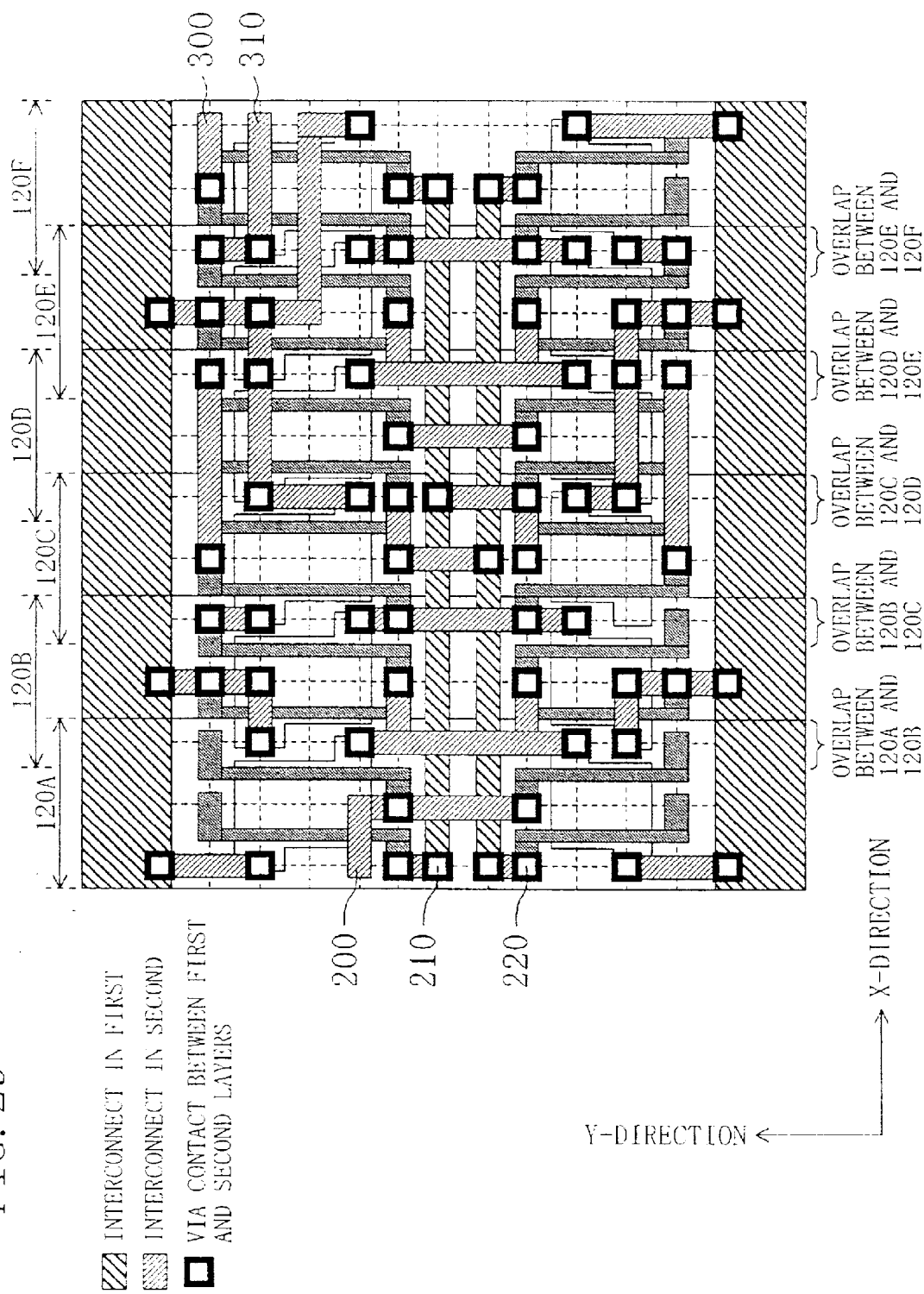
FIG. 29 is a layout wiring diagram of a D flip-flop circuit constructed by using the CMOS basic cell of FIG. 27A.

FIG. 29 shows an example of a semiconductor integrated circuit obtained by fabricating a DFF circuit of FIG. 28A by arranging six CMOS basic cells 120 of FIG. 27A on a semiconductor substrate. In FIG. 29, the basic cells 120A through 120F of FIG. 27A are arranged in the X-direction so that adjacent basic cells can overlap by portions thereof corresponding to one grid. Specifically, as understood from FIG. 29, with respect to the relationship between, for example, the basic cell 120A and the adjacent basic cell 120B, the basic cells are arranged as follows: The first bent part 102a of the dopant diffusion region 102 of the first PrU channel transistor TP1 of the basic cell 120B is disposed below, in the drawing, the first bent part 104b of the gate electrode 104 of the second P-channel transistor TP2 of the basic cell 120A, and the second bent part 101c of the gate electrode 101 of the first P-channel transistor TP1 of the basic cell 120B is disposed below, in the drawing, the second bent part 105a of the dopant diffusion region 105 of the second P-channel transistor TP2 of the basic cell 120A. The second N-channel transistor TN2 of the basic cell 120A and the first N-channel transistor TN1 of the basic cell 120B are disposed in a similar relationship.

Figure 31A:
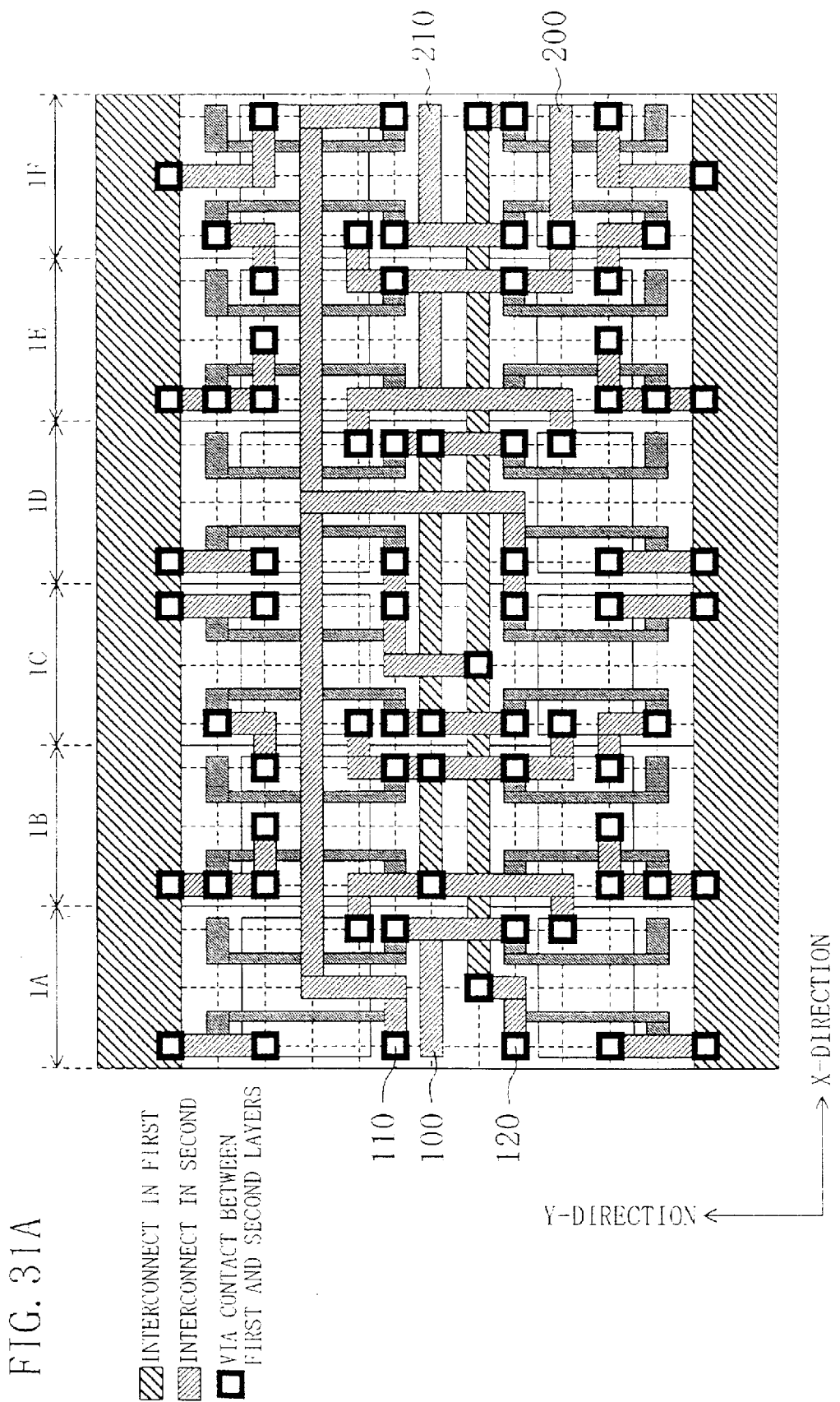
FIG. 31A is a layout wiring diagram of a DFF using the conventional basic cell and FIG. 31B is another layout wiring diagram of the DFF using the conventional basic cell.
Figure 31B:
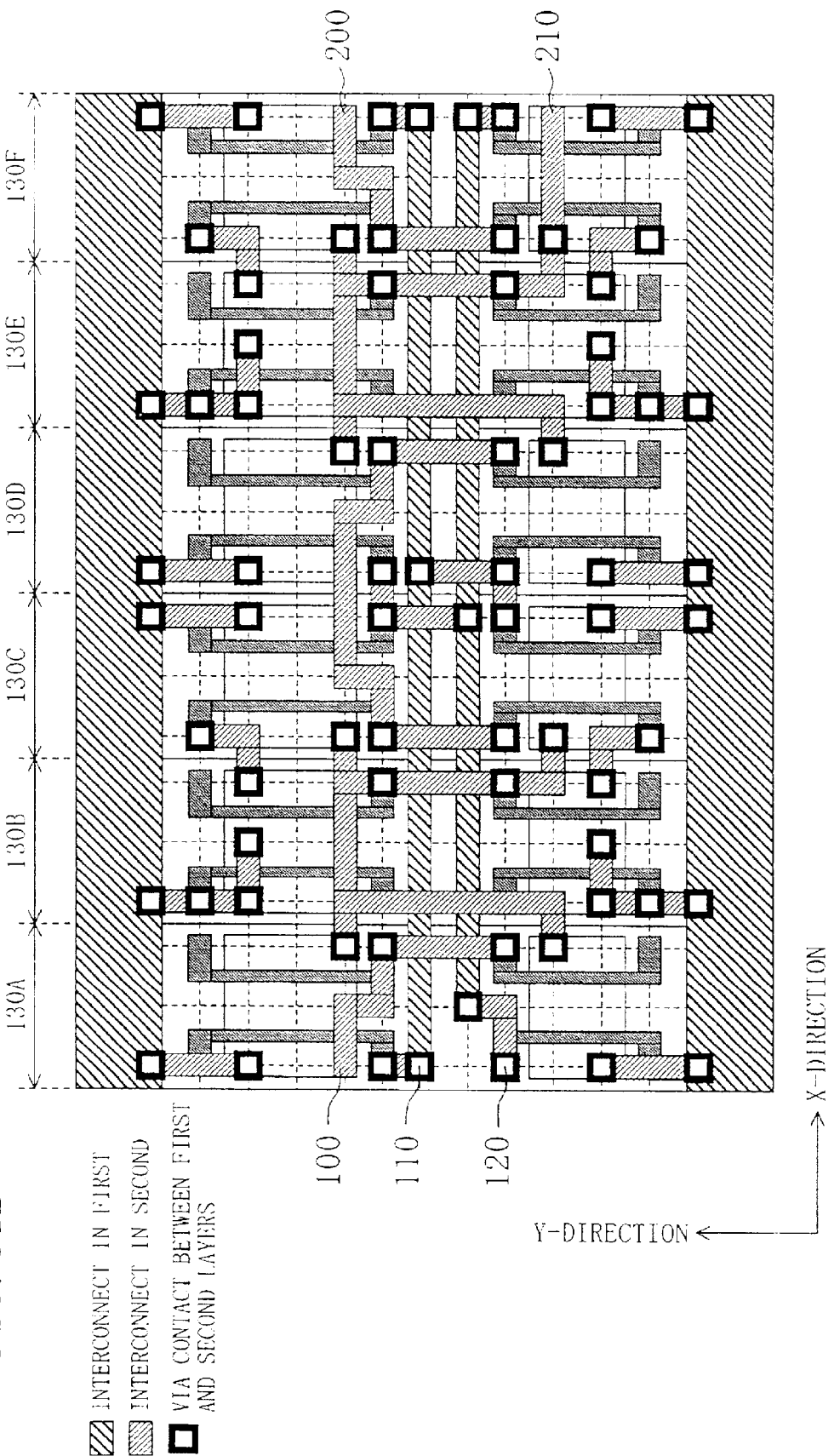
Figure 32:
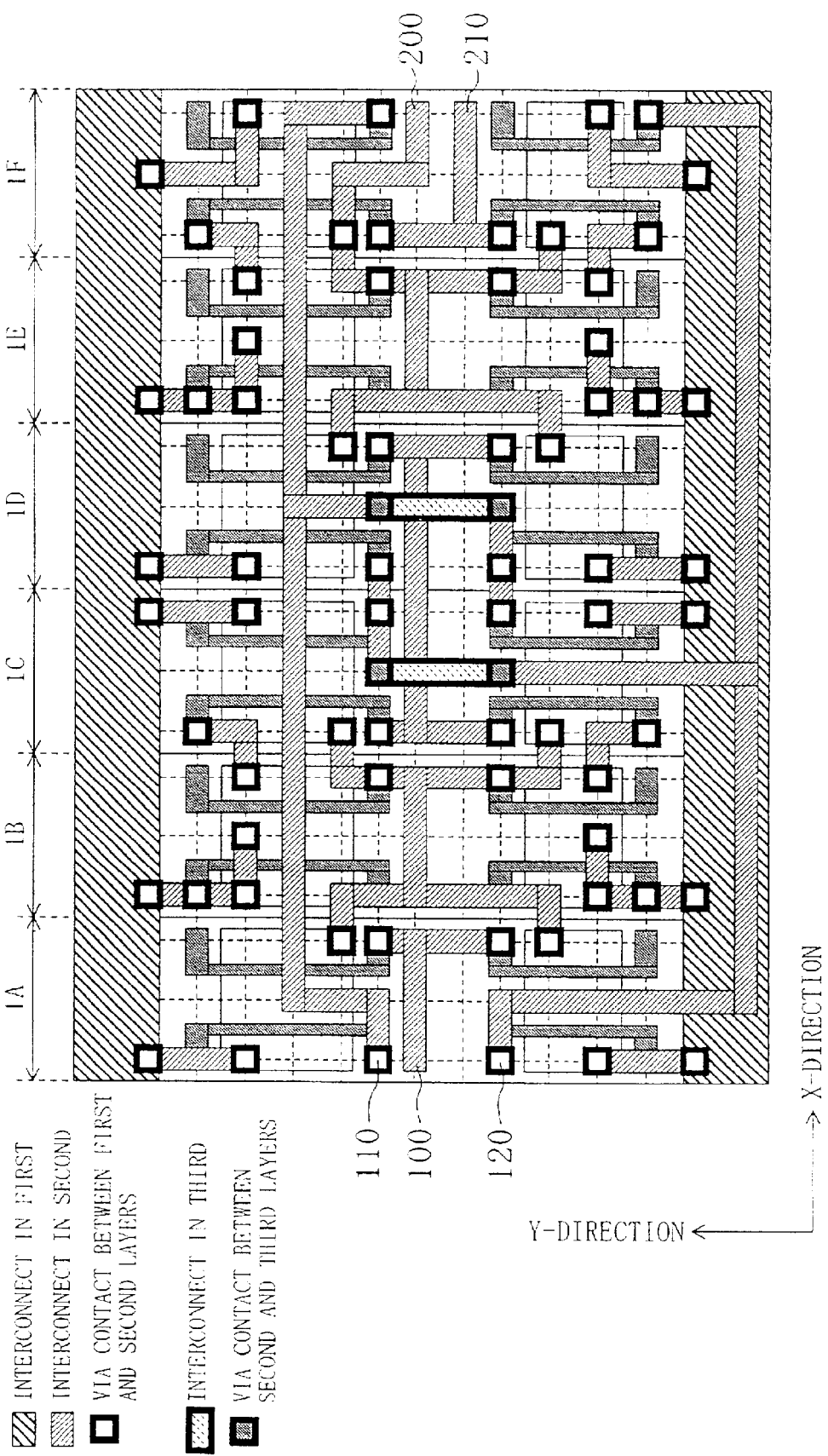
FIG. 32 is another layout wiring diagram of the DFF using the conventional basic cell.
Figure 33:
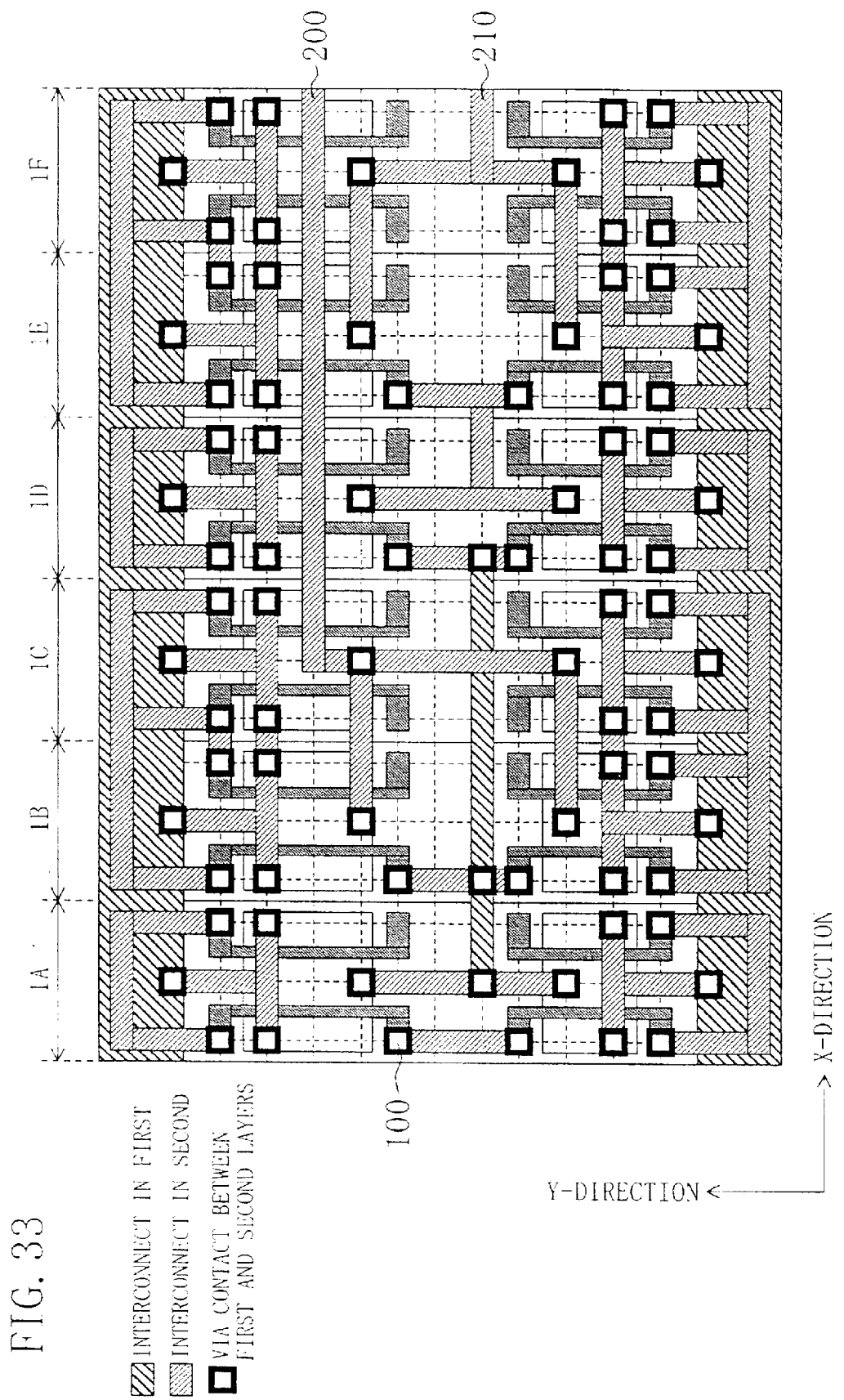
FIG. 33 is a layout wiring diagram of a buffer using the conventional basic cell.
Figure 34:
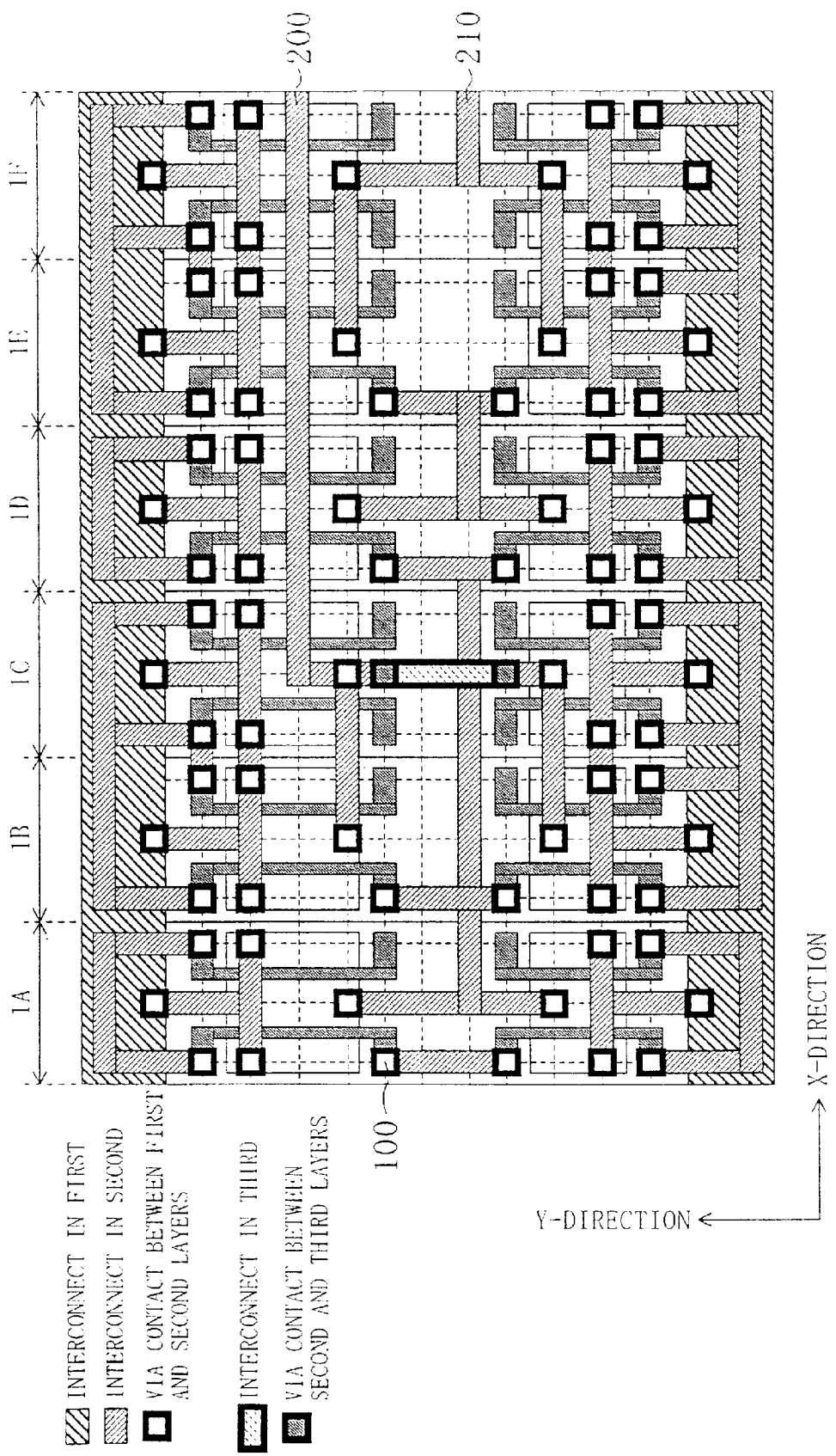
FIG. 34 is another layout wiring diagram of the buffer using the conventional basic cell.
Figure 35:
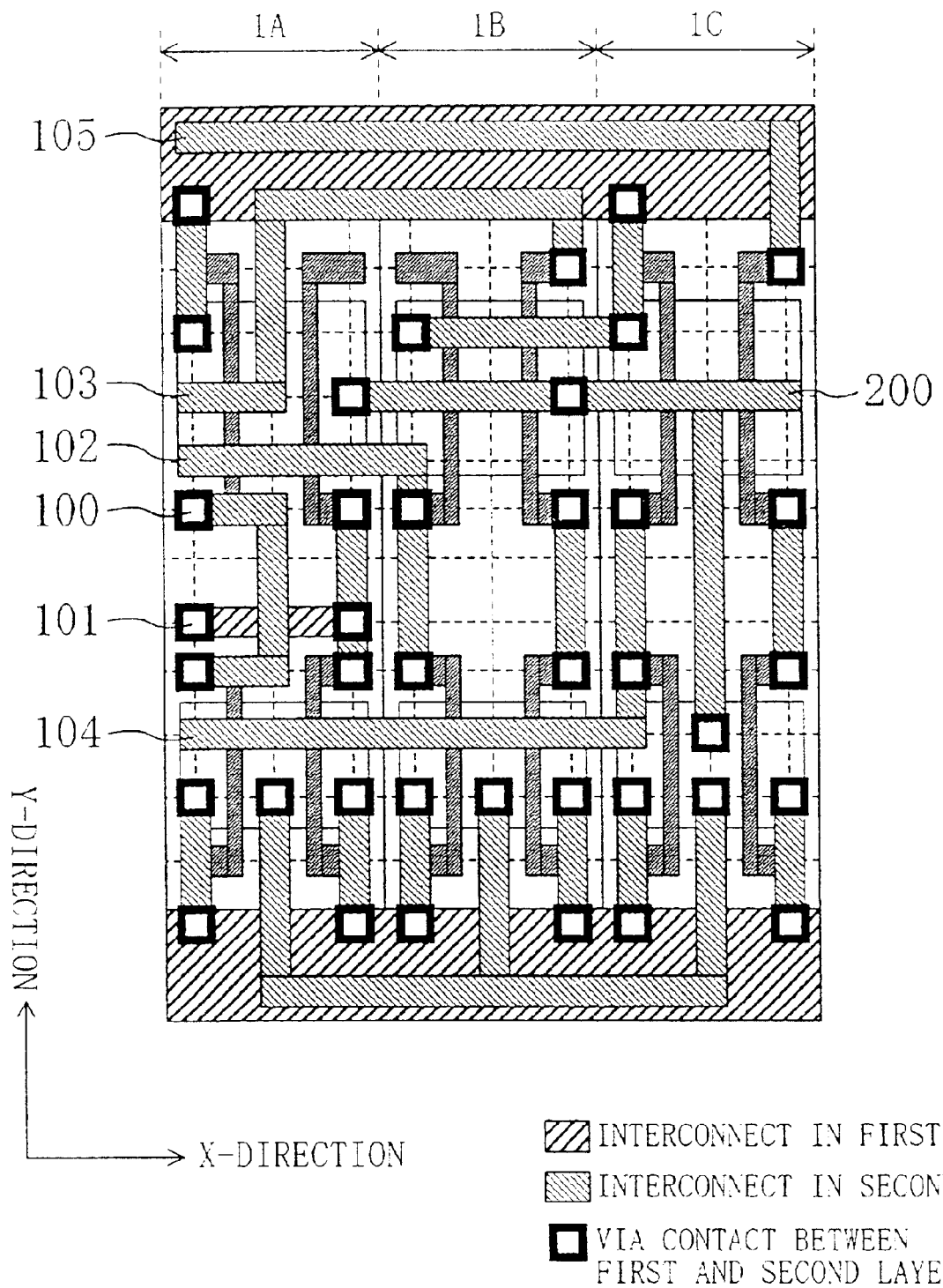
FIG. 35 is a layout wiring diagram of an ORNAND using the conventional basic cell.
Figure 36:
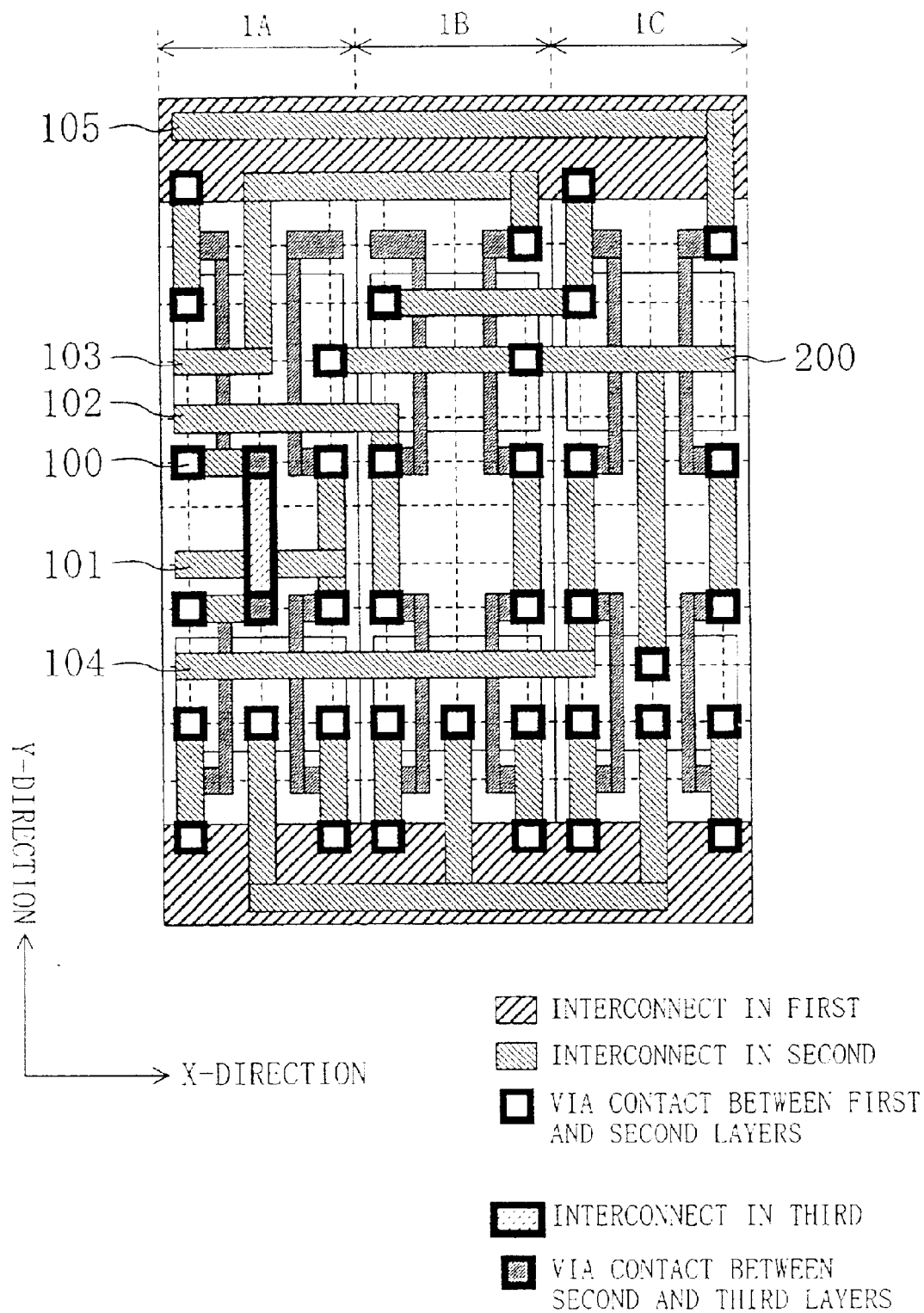
FIG. 36 is another layout wiring diagram of the ORNAND using the conventional basic cell.
Figure 37:
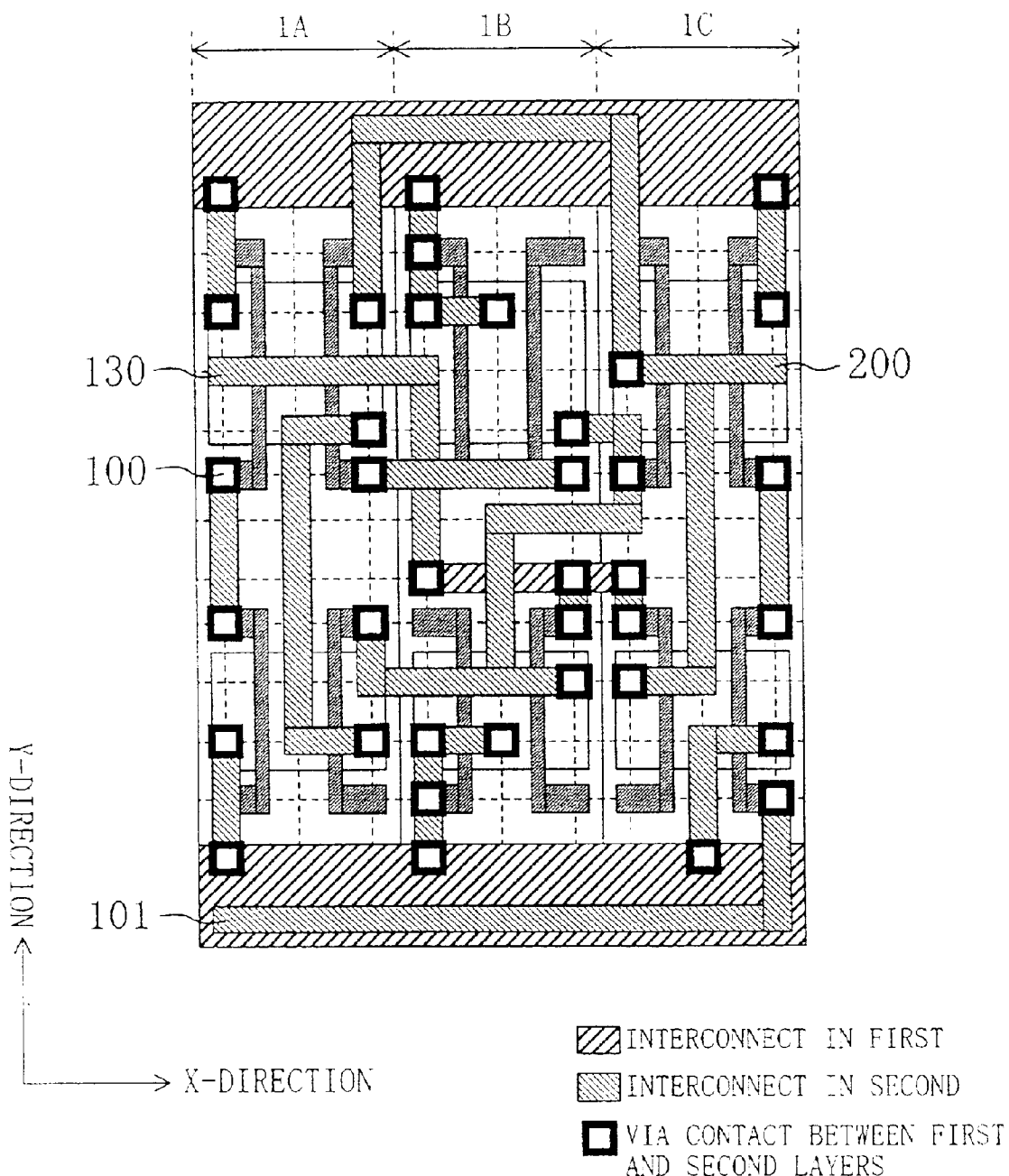
FIG. 37 is a layout wiring diagram of a selector using the conventional basic cell.
Figure 38:
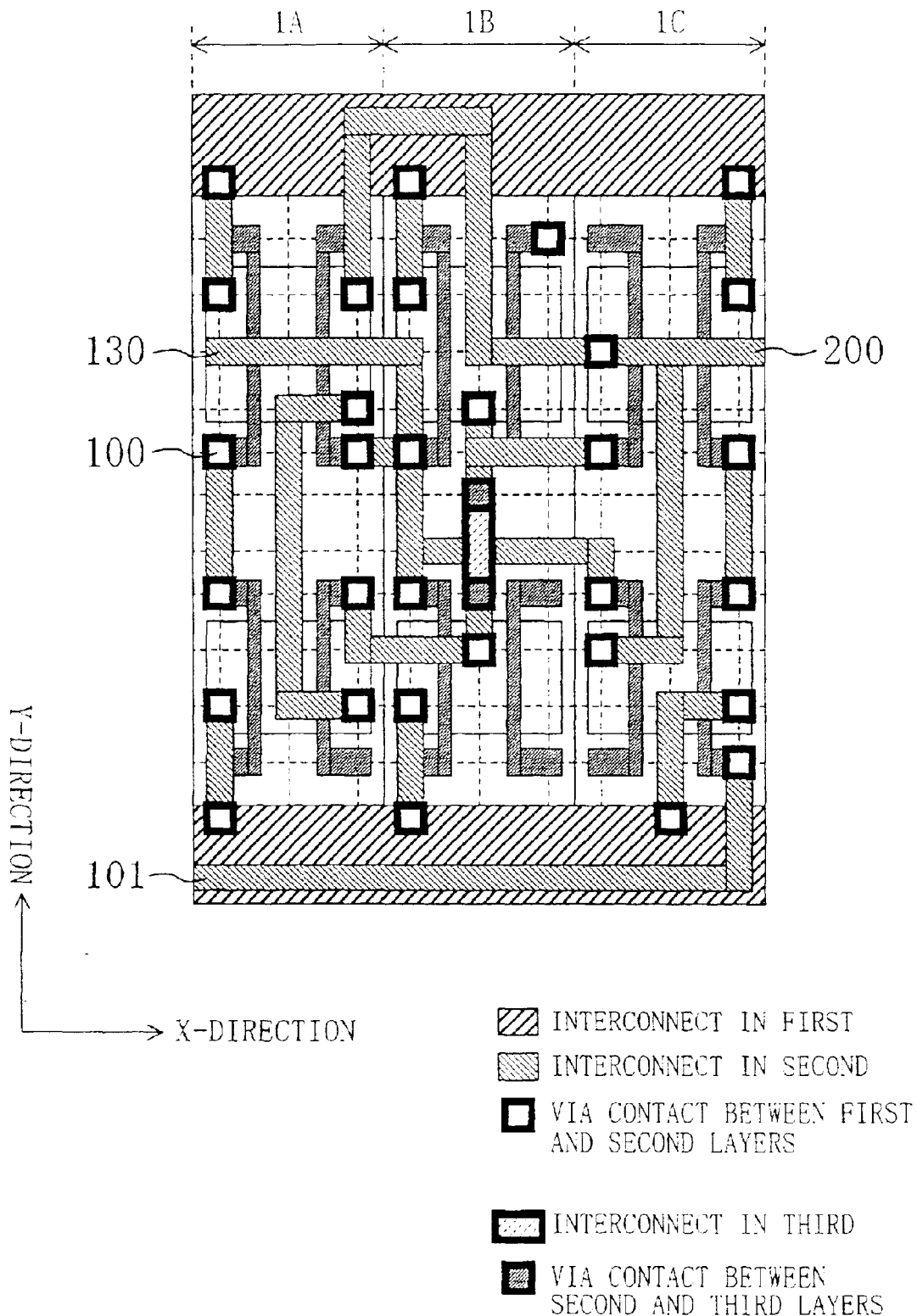
FIG. 38 is another layout wiring diagram of the selector using the conventional basic cell.
Figure 39:
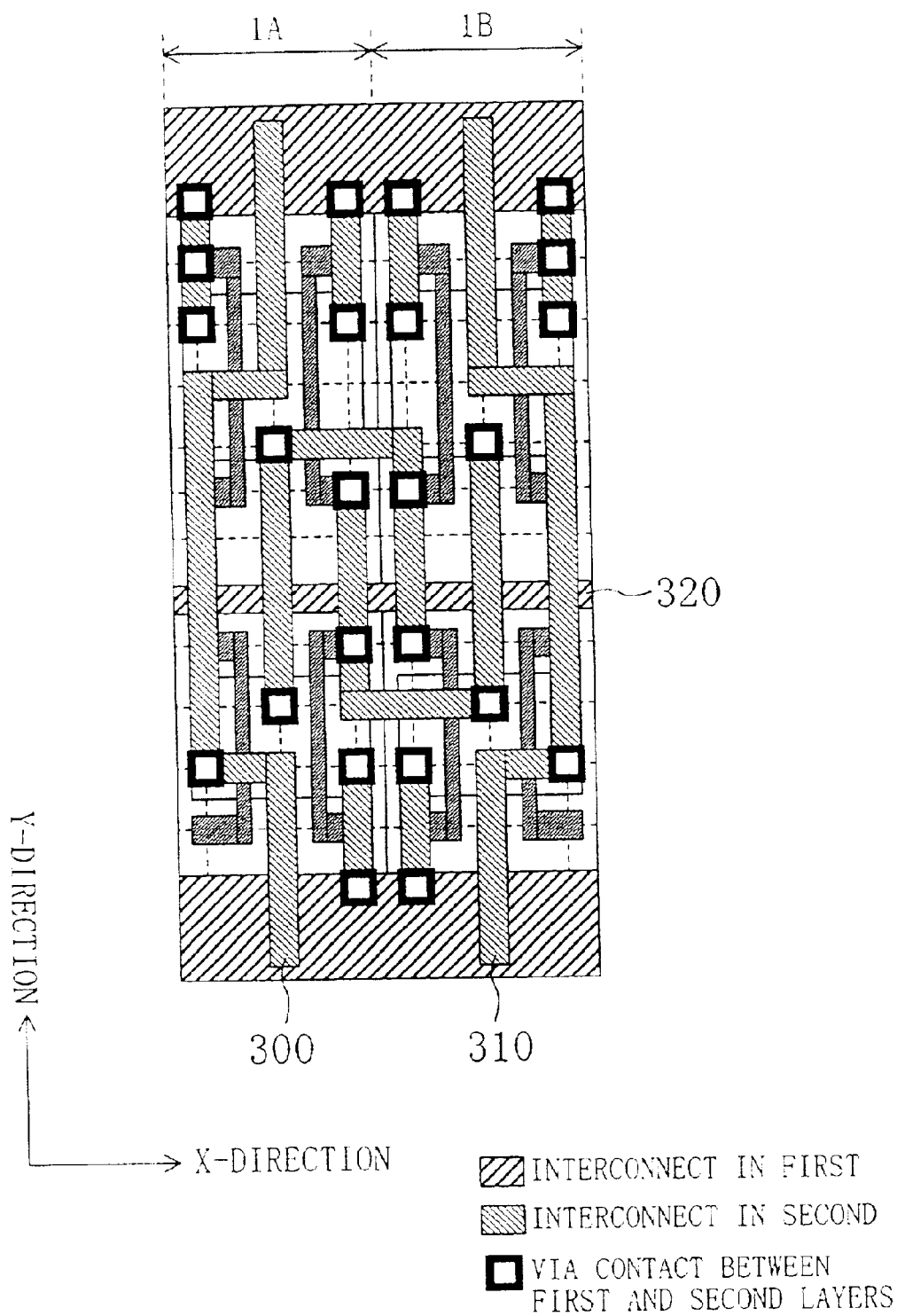
FIG. 39 is a layout wiring diagram of an SRAM using the conventional basic cell.
Figure 40:
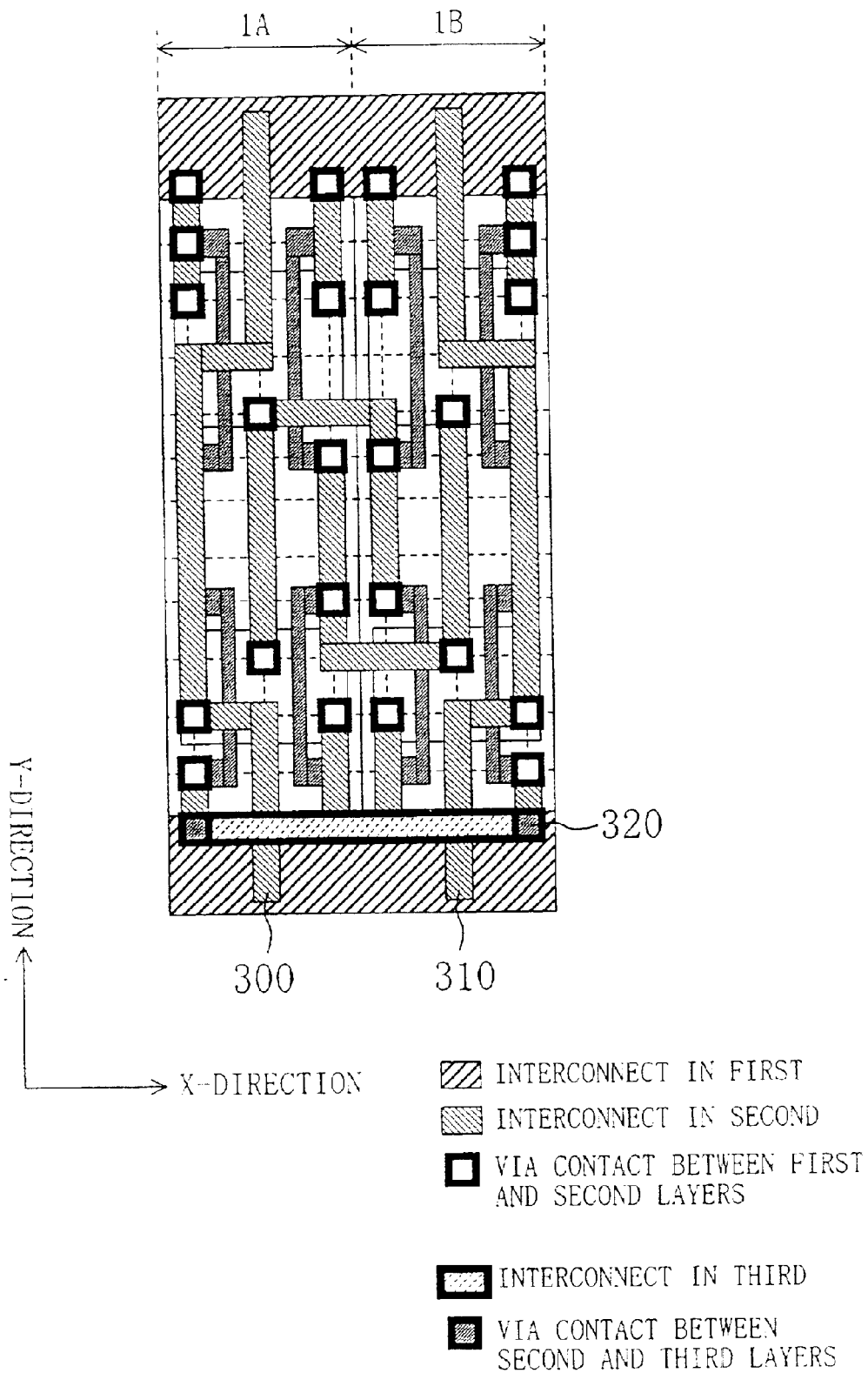
FIG. 40 is another layout wiring diagram of the SRAM using the conventional basic cell.
Figure 41:
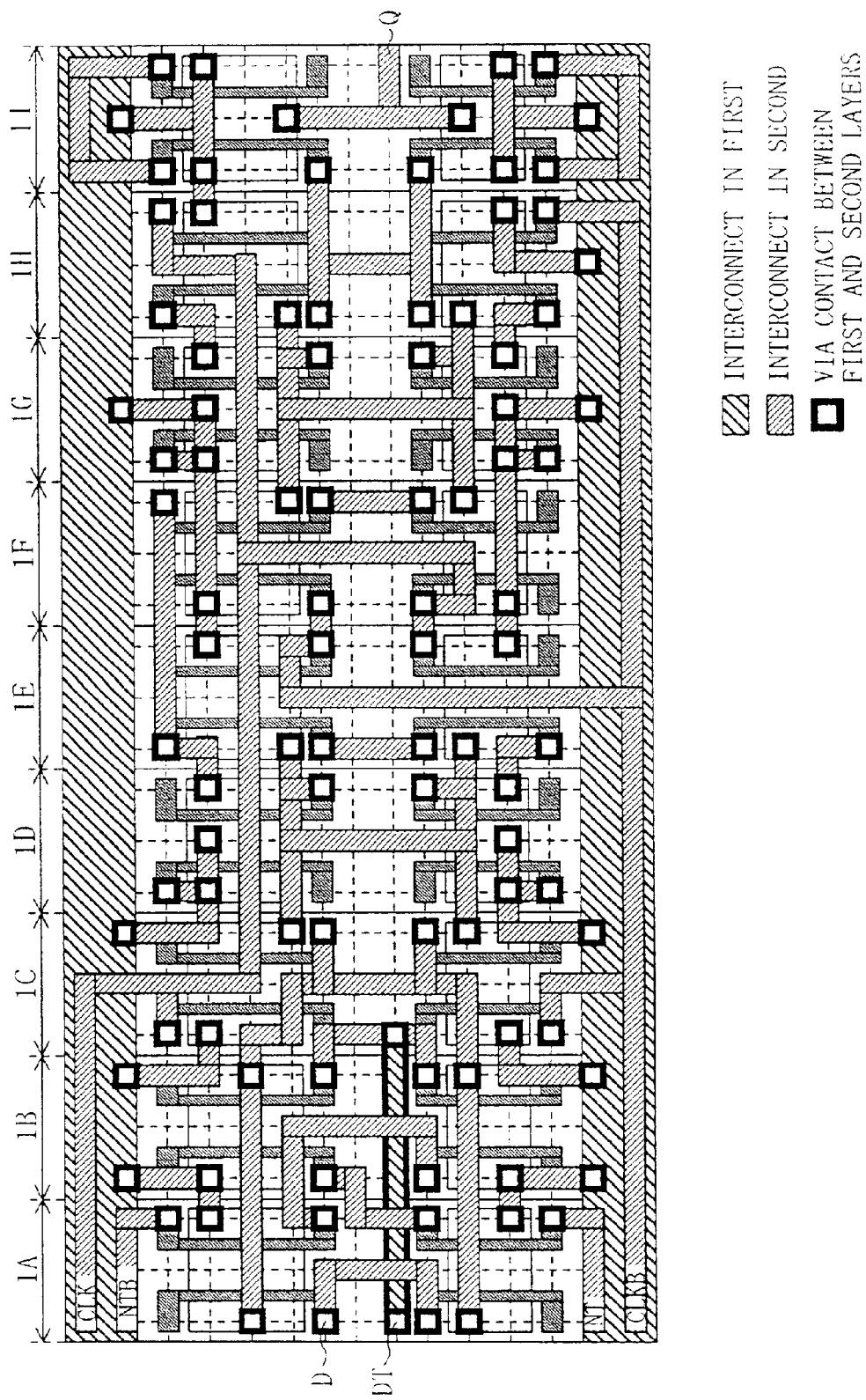
FIG. 41 is a layout wiring diagram of a D flip-flop circuit having a scanning function using the conventional basic cell.

When the layout of FIG. 29 of this embodiment is compared with the conventional layout of FIG. 31B, the layout area of the entire logic circuit of the DFF is reduced to approximately 70% and the number of used wiring grids is also reduced to approximately 80% in this embodiment.

In addition, in the case where, for example, the gate electrode 104 of the second P-channel transistor TP2 of the basic cell 120B is connected to the dopant diffusion region 102 of the first P-channel transistor TP1 of the basic cell 120C, the first bent part 104b of the gate electrode 104 can be connected to the first bent part 102a of the dopant diffusion region 102. Therefore, the line length for connecting them corresponds to merely one grid, and thus, the line length can be reduced. Accordingly, as a result of the reduction in the line length and reduction in load capacitance derived from the reduction in the layout area, the operation speed of the fabricated semiconductor integrated circuit can be increased.

The first and second bent parts 101b, 101c, 104b, 104c, 107b, 107c, 110b, 110c, 102a, 105a, 108a and 111a are all bent at right angles in any of the sideward directions in this embodiment, which does not limit the invention. Each bent part may be bent in a sideward direction in any manner, for example, may be bent in a curved manner.

As described so far, according to the CMOS basic cells and the methods for fabricating a semiconductor integrated circuit using any of the CMOS basic cells of this invention, a complicated logic circuit, which conventionally needs two or more interconnect layers, can be fabricated by using one additional interconnect layer alone. Also, timing of hold time of a flip-flop circuit having a scanning function can be adjusted by using one additional interconnect layer alone. Accordingly, the line crowdedness in design of a semiconductor integrated circuit is reduced and the ratio of used gates to all gates in a gate array is increased, resulting in improving the integration of the semiconductor integrated circuit. Moreover, not only the cost can be lowered but also, even when logic or wiring should be modified, merely one interconnect layer is sufficient for the modification. Accordingly, the period and cost required for the development can be reduced.

What is claimed:

1. A CMOS basic cell comprising:
    an N-channel transistor, a P-channel transistor on a semiconductor substrate;
    at least one interconnect connected to said N-channel transistor or said P-channel transistor through at least one contact hole; and
    an interconnect pattern which is isolated from every contact hole in said CMOS basic cell and every interconnect in said CMOS basic cell,
    wherein said interconnect pattern exists between said N-channel transistor and said P-channel transistor, and
    wherein said interconnect pattern is formed in an uppermost interconnect layer of said CMOS basic cell, and
    wherein said CMOS basic cell has a boundary defining the edges of the CMOS basic cell, and at least one end of said interconnect pattern does not contact any edge of said CMOS basic cell.

2. The CMOS basic cell of claim 1, wherein said CMOS basic cell has a longitudinal axis, said interconnect pattern extending either perpendicular to said longitudinal axis or parallel to said longitudinal axis.

3. The CMOS basic cell of claim 1 further comprising: a power supply pattern, a master pattern and another interconnect pattern different from said interconnect pattern,
    wherein said another interconnect pattern exists between said N-channel transistor and said master pattern, said another interconnect pattern extending either perpendicular to or parallel to said longitudinal axis, said another interconnect pattern electrically disconnected from said N-channel transistor and said P-channel transistor and formed in said interconnect layer.

4. The CMOS basis cell of any one of claim 1 wherein said interconnect pattern is mutually connected electrically with an interconnect pattern of another CMOS basic cell, when said CMOS basic cell is adjacent to said another CMOS basic cell.

5. The CMOS basic cell of any one of claim 1 wherein two or more said CMOS basic cells are electrically connected by a higher interconnect pattern located in a layer that is higher than said interconnect pattern.

6. The CMOS basic cell according to claim 5, wherein said higher interconnect pattern is located in a region between said P-channel transistors and said N-channel transistors except the both ends of said interconnect pattern, and
    wherein said interconnect pattern which intersects said higher interconnect pattern is electrically connected with said higher interconnect pattern, said interconnect pattern being isolated from a second higher interconnect pattern which intersects said interconnect pattern.

7. A method for fabricating a gate array semiconductor integrated circuit including a plurality of basic cells and a higher interconnect pattern provided above said basic cells, comprising the steps of:
    arranging a plurality of CMOS basic cells according to any one of claim 1 on a semiconductor substrate; and
    realizing a logic circuit including a clock signal line by using said interconnect patterns formed in the uppermost interconnect layers of said CMOS basic cells and said higher interconnect pattern.

8. A method for fabricating a gate array semiconductor integrated circuit including a plurality of basic cells and a higher interconnect pattern provided above said basic cells, comprising the steps of:
    arranging a plurality of CMOS basic cells according to one of claim 1 on a semiconductor substrate; and realizing a logic circuit including transistors connected to each other in parallel by using said interconnect patterns formed in the uppermost interconnect layers of said CMOS basic cells and said higher interconnect pattern.

9. A method for fabricating a gate array semiconductor integrated circuit including a plurality of basic cells and a higher interconnect pattern provided above said basic cells, comprising the steps of:
arranging a plurality of CMOS basic cells according to one of claim 1 on a semiconductor substrate; and
realizing a composite logic circuit by using said interconnect patterns formed in the uppermost interconnect layers of said CMOS basic cells and said higher interconnect pattern.

10. A method for fabricating a gate array semiconductor integrated circuit including a plurality of basic cells and a higher interconnect pattern provided above said basic cells, comprising the steps of:
arranging a plurality of CMOS basic cells according to claim 1 on a semiconductor substrate; and
realizing a logic circuit including a control signal line by using said interconnect patterns formed in the uppermost interconnect layers of said CMOS basic cells and said higher interconnect pattern.

11. A method for fabricating a gate array semiconductor integrated circuit including a plurality of basic cells and a higher interconnect pattern provided above said basic cells, comprising the steps of:
arranging a plurality of CMOS basic cells according to one of claim 1 on a semiconductor substrate; and
realizing a logic circuit for a memory by using said interconnect patterns formed in the uppermost interconnect layers of said CMOS basic cells and said higher interconnect pattern.

12. A method for fabricating a gate array semiconductor integrated circuit including a plurality of basic cells and a higher interconnect pattern provided above said basic cells, comprising the steps of:
arranging a plurality of CMOS basic cells according to one of claim 1 on a semiconductor substrate; and
realizing a flip-flop circuit having a scan test function by using said interconnect patterns formed in the uppermost interconnect layers of said CMOS basic cells and said higher interconnect pattern.

13. A CMOS basic cell comprising:
an N-channel transistor and a P-channel transistor existing on a semiconductor substrate, said CMOS basic cell being electrical coupled with other adjacent CMOS basic cells;
wherein a gate of at least one of said N-channel transistor and said P-channel transistor has a hooked shape including a first bent part bending in one sideward direction at an upper portion thereof and a second bent part bending in an opposite sideward direction at a lower portion thereof, and
a diffusion region of at least one of said N-channel transistor and said P-channel transistor having a hooked shape having a first bent part bending in one sideward direction at an upper portion thereof and a second bent part bending in an opposite sideward direction at a lower portion thereof,
said upper portion of said gate is bent oppositely to said upper portion of said diffusion region.

14. The CMOS basic cell of claim 13, wherein a first N-channel transistor and a first P-channel transistor are formed to extend along a vertical direction, and
a second N-channel transistor is disposed on a side of said first N-channel transistor and a second P-channel transistor is disposed on a side of said first P-channel transistor, and
a gate of each of said first and second N-channel transistors and said first and second P-channel transistors is formed in the hooked shape.

15. The CMOS basic cell of claim 14, wherein the gates of said first and second N-channel transistors are disposed in a manner that said first bent part of one gate overlaps said second bent part of the other gate when viewed along the vertical direction from one position in a horizontal direction, and
the gates of said first and second P-channel transistors are disposed in a manner that said first bent part of one gate overlaps said second part of the other gate when viewed along the vertical direction from one position in the horizontal direction.

16. The CMOS basic cell of claim 14, wherein said first and second N-channel transistors share one diffusion region and said first and second P-channel transistors share one diffusion region,
each of said diffusion regions is divided into a shared diffusion region shared by said first and second N-channel or P-channel transistors and positioned between the gates of said first and second N-channel or P-channel transistors; a first dedicated diffusion region positioned on a side of said gate of said first N-channel or P-channel transistor opposite to said shared diffusion region; and a second dedicated diffusion region positioned on a side of said gate of said second N-channel or P-channel transistor opposite to said shared diffusion region,
said first bent part is formed in said first dedicated diffusion region, and
said second bent part is formed in said second dedicated diffusion region.

17. The CMOS basic cell according to any one of claim 13, comprising, outside of a transistor region where said N-channel transistor are disposed, a fixed interconnect region where a power supply interconnect and a ground interconnect are disposed.

18. The CMOS basic cell according to any one of claim 13, said first bent part of said gate of said P-channel transistor and said first bent part of said diffusion region of said P-channel transistor of another CMOS basic cell is electrically connected with said higher interconnect pattern,
wherein said higher interconnect pattern extends along a horizontal direction to the perpendicular from said N-channel transistor to said P-channel transistor.

19. A method for fabricating a gate array semiconductor integrated circuit including a plurality of basic cells arranged in a horizontal direction, comprising a step of arranging a plurality of CMOS basic cells according to any one of claim 1 in the horizontal direction in a manner that said first bent part of one CMOS basic cell overlaps said second bent part of another adjacent CMOS basic cell when viewed along a vertical direction from one position in a horizontal direction.

20. A semiconductor integrated circuit including a plurality of CMOS basic cells arranged in the same direction,
wherein each CMOS basic cell is composed of first and second N-channel transistors and first and second P-channel transistors, and
a gate of said first and second N-channel transistors and said first and second P-channel transistors of each cell is in a hooked shape having a first bent part bending in one sideward direction at an upper portion thereof and a second bent part bending in the other sideward direction at a lower portion thereof, wherein the gates of said first and second N-channel transistors are disposed in a manner that said first bent part of one gate overlaps said second bent part of the other gate when viewed along an axis orthogonal to the axis extending parallel to the sideward directions in which said first bent part and said second bent part extend, and wherein the gates of said first and second P-channel transistors are disposed in a manner that said first bent part of one gate overlaps said second bent part of the other gate when viewed along an axis orthogonal to an axis extending parallel to the sideward directions in which said first bent part and said second bent part extend.

21. A semiconductor integrated circuit comprising:

a plurality of CMOS basic cells;

each said CMOS basic cell comprising:
  an interconnect layer formed in an uppermost layer of each of said plurality of CMOS basic cells, said interconnect layer comprising at least one interconnect operative for connecting signals to and from the corresponding CMOS basic cell;
  an N-channel transistor and a P-channel transistor on a semiconductor substrate; and
  an interconnect pattern which is capable of being electrically isolated from said N-channel transistor and said P-channel transistor and which is disposed between said N-channel transistor and said P-channel transistor, wherein said interconnect pattern is formed in said uppermost layer of said CMOS basic cell, wherein said interconnect pattern is only capable of being coupled to said N-channel transistor or said P-channel transistor by utilizing an interconnect pattern which is disposed in an interconnect layer located above said uppermost layer of said CMOS basic cell.

22. The semiconductor integrated circuit of claim 21, wherein each said CMOS basic cell has a longitudinal axis, said interconnect pattern extending either perpendicular to said longitudinal axis or parallel to said longitudinal axis.

23. The semiconductor integrated circuit of claim 22, further comprising: a power supply pattern, a master pattern and another interconnect pattern different from said interconnect pattern, wherein said another interconnect pattern exists between said N-channel transistor and said master pattern, said another interconnect pattern extending either perpendicular to or parallel to said longitudinal axis, said another interconnect pattern electrically disconnected from said N-channel transistor and said P-channel transistor and formed in said interconnect layer.

24. The semiconductor integrated circuit of claim 23, wherein said interconnect pattern is mutually connected electrically with an interconnect pattern of another CMOS basic cell, when said CMOS basic cell is adjacent to said another CMOS basic cell.

25. The semiconductor integrated circuit claim 24, wherein two or more said CMOS basic cells are electrically connected by a higher interconnect pattern located in a layer that is higher than said interconnect pattern.

26. The CMOS basic cell of claim 21, wherein said CMOS basic cell has a boundary defining the edges of the CMOS basic cell, and at least one end of said interconnect pattern does not contact any edge of said CMOS basic cell.

27. A CMOS basic cell comprising:
  an N-channel transistor and, a P-channel transistor on a semiconductor substrate;
  an interconnect pattern which is disposed between said N-channel transistor and said P-channel transistor;
  wherein said interconnect pattern is isolated from said N-channel transistor and said P-channel transistor;
  wherein said interconnect pattern is formed in an uppermost interconnect layer of said CMOS basic cell, and
  wherein said CMOS basic cell has a boundary defining the edges of the CMOS basic cell, and at least one end of said interconnect pattern does not contact any edge of said CMOS basic cell.

28. The CMOS basic cell of claim 27, wherein each said CMOS basic cell has a longitudinal axis, said interconnect pattern extending either perpendicular to said longitudinal axis or parallel to said longitudinal axis.

29. The CMOS basic cell of claim 28, wherein said N-channel transistor and said P-channel transistor have a plurality of electrodes, and each electrode coupled to said N-channel transistor and said P-channel transistor is coupled to the uppermost layer of said CMOS basic cell via an interconnect.

30. The CMOS basic cell of claim 27, wherein said interconnect pattern is only capable of being coupled to said N-channel transistor or said P-channel transistor by utilizing an interconnect pattern which is disposed in an interconnect layer located above said uppermost layer of said CMOS basic cell.

31. The CMOS basic cell of claim 27, wherein said N-channel transistor and said P-channel transistor are isolated from each other by an insulating film on a semiconductor substrate.

32. A CMOS basic cell comprising:
  an N-channel transistor and, a P-channel transistor on a semiconductor substrate;
  an interconnect pattern which is disposed between said N-channel transistor and said P-channel transistor,
  wherein said interconnect pattern is isolated from said N-channel transistor and said P-channel transistor,
  wherein said interconnect pattern is formed in an uppermost interconnect layer of said CMOS basic cell, and
  wherein said N-channel transistor and said P-channel transistor have a plurality of electrodes, and each electrode coupled to said N-channel transistor and said P-channel transistor is coupled to the uppermost layer of said CMOS basic cell via an interconnect.

33. The CMOS basic cell of claim 32, wherein said basic cell has a boundary defining the edges of the CMOS basic cell, and at least one end of said interconnect pattern does not contact any edge of said CMOS basic cell.

34. The CMOS basic cell of claim 32, wherein said N-channel transistor and said P-channel transistor are isolated from each other by an insulating film on a semiconductor substrate.

* * * * *

UNITED STATES PATENT AND TRADEMARK OFFICE
CERTIFICATE OF CORRECTION

PATENT NO.    : 6,800,883 B2
DATED         : October 5, 2004
INVENTOR(S)   : Shigeki Furuya et al.

It is certified that error appears in the above-identified patent and that said Letters Patent is hereby corrected as shown below:

<u>Title page</u>,
Item [56], References Cited, FOREIGN PATENT DOCUMENTS, change
"JP 61-202425 9/1986" to -- JP 61-202452 9/1986 --

Signed and Sealed this

First Day of March, 2005

JON W. DUDAS
*Director of the United States Patent and Trademark Office*